United States Patent
Liang et al.

(10) Patent No.: US 12,180,401 B2
(45) Date of Patent: Dec. 31, 2024

(54) WATER-SOLUBLE FLUORESCENT POLYMERIC DYES

(71) Applicant: Becton, Dickinson and Company, Franklin Lakes, NJ (US)

(72) Inventors: Yongchao Liang, Irvine, CA (US); Subodh Devendra Sonar, San Diego, CA (US)

(73) Assignee: BECTON, DICKINSON AND COMPANY, Franklin Lakes, NJ (US)

( * ) Notice: Subject to any disclaimer, the term of this patent is extended or adjusted under 35 U.S.C. 154(b) by 283 days.

(21) Appl. No.: 17/699,845

(22) Filed: Mar. 21, 2022

(65) Prior Publication Data

US 2022/0340813 A1 Oct. 27, 2022

Related U.S. Application Data

(60) Provisional application No. 63/171,722, filed on Apr. 7, 2021.

(51) Int. Cl.
  C09K 11/06 (2006.01)
  C08G 61/12 (2006.01)
  C09B 69/10 (2006.01)

(52) U.S. Cl.
  CPC ............ *C09K 11/06* (2013.01); *C08G 61/122* (2013.01); *C09B 69/10* (2013.01);
  (Continued)

(58) Field of Classification Search
  CPC ......... C08G 75/32; C08G 75/02; H01L 51/30; H01L 51/26; H01L 51/558; H01L 51/36
  (Continued)

(56) References Cited

U.S. PATENT DOCUMENTS

| 4,689,482 A | 8/1987 | Kazuo et al. |
| 6,580,739 B1 | 6/2003 | Coldren et al. |

(Continued)

FOREIGN PATENT DOCUMENTS

| JP | 2005136365 A | 5/2005 |
| JP | 2014120560 A | 6/2014 |

(Continued)

OTHER PUBLICATIONS

Burrows, et al. "Aqueous Solution Behavior of Anionic Fluorene-co-thiophene-Based Conjugated Polyelectrolytes", CS Appl. Mater. Interfaces 2009, 1, 4, 864-874.

(Continued)

*Primary Examiner* — Shane Fang
(74) *Attorney, Agent, or Firm* — Bret E. Field; BOZICEVIC, FIELD & FRANCIS LLP

(57) ABSTRACT

Water-soluble fluorescent polymeric dyes and polymeric tandem dyes are provided. The polymeric dyes include a water solvated light harvesting multi-chromophore having a conjugated segment of aryl and/or heteroaryl co-monomers. The molar ratio of the co-monomers can be adjusted to provide beneficial technical properties, such as increased water solubility and improved absorption and emission spectra. For instance, the conjugated segment can have a first co-monomer substituted with a water-soluble group (WSG) and a second co-monomer, wherein the first co-monomer is in an amount that is equal or greater than the amount of the second co-monomer, multi-chromophore. The polymeric tandem dyes further include a signaling chromophore covalently linked to the multi-chromophore in energy-receiving proximity therewith. Also provided are aggregation-resistant labeled specific binding members that include the subject water-soluble polymeric dyes. Methods of evaluating a sample for the presence of a target analyte (Continued)

and methods of labeling a target molecule in which the subject polymeric dyes find use are also provided. Systems and kits for practicing the subject methods are also provided.

19 Claims, 2 Drawing Sheets

(52) U.S. Cl.
CPC ............... *C08G 2261/124* (2013.01); *C08G 2261/1644* (2013.01); *C08G 2261/3142* (2013.01); *C08G 2261/3241* (2013.01); *C08G 2261/411* (2013.01); *C08G 2261/522* (2013.01); *C09K 2211/1466* (2013.01)

(58) Field of Classification Search
USPC ........ 528/377, 380, 422; 428/220, 408, 457, 428/446; 205/317, 316; 526/238.23
See application file for complete search history.

(56) References Cited

U.S. PATENT DOCUMENTS

| | | | |
|---|---|---|---|
| 6,965,103 | B2 | 11/2005 | Shapiro et al. |
| 7,897,142 | B2 | 3/2011 | Cuthbertson et al. |
| 9,856,509 | B2 | 1/2018 | Zhang et al. |
| 2002/0190221 | A1 | 12/2002 | Hutchinson et al. |
| 2003/0178607 | A1 | 9/2003 | Swager et al. |
| 2004/0175768 | A1 | 9/2004 | Kushon et al. |
| 2007/0127123 | A1 | 6/2007 | Brown et al. |
| 2009/0095343 | A1 | 4/2009 | Pei et al. |
| 2011/0256549 | A1* | 10/2011 | Gaylord ............... C09B 69/00 562/466 |
| 2013/0109029 | A1 | 5/2013 | Liu et al. |
| 2014/0273193 | A1 | 9/2014 | Li |
| 2015/0226746 | A1 | 8/2015 | Bazan et al. |
| 2016/0181764 | A1 | 6/2016 | Kanskar et al. |
| 2016/0264737 | A1* | 9/2016 | Bartholomew ...... G01N 33/542 |
| 2016/0266131 | A1 | 9/2016 | Liang et al. |
| 2018/0009990 | A1 | 1/2018 | Bartholomew et al. |
| 2018/0163054 | A1* | 6/2018 | Bartholomew ....... C09B 69/109 |
| 2020/0002540 | A1 | 1/2020 | Bartholomew et al. |
| 2020/0055896 | A1 | 2/2020 | Bainbridge et al. |
| 2020/0062966 | A1* | 2/2020 | Bartholomew ....... C09B 69/101 |
| 2020/0181677 | A1 | 6/2020 | Sivaramakrishnan et al. |
| 2020/0392346 | A1 | 12/2020 | Bartholomew et al. |

FOREIGN PATENT DOCUMENTS

| | | |
|---|---|---|
| JP | 2015218304 A | 12/2015 |
| WO | WO2004001379 A1 | 6/2004 |
| WO | WO2004077014 A2 | 9/2004 |
| WO | WO2004092324 A2 | 10/2004 |
| WO | WO2005086617 A2 | 9/2005 |
| WO | WO2006074471 A2 | 7/2006 |
| WO | WO2006074482 A2 | 7/2006 |
| WO | WO2006083932 A2 | 8/2006 |
| WO | WO2007011630 A2 | 1/2007 |
| WO | WO2008100344 A3 | 1/2009 |
| WO | WO2011091086 A1 | 7/2011 |
| WO | WO2011226866 A1 | 9/2011 |
| WO | WO2011154405 A1 | 12/2011 |
| WO | WO2013101902 A2 | 7/2013 |
| WO | WO2015027176 A1 | 2/2015 |
| WO | WO2015109136 A2 | 7/2015 |
| WO | WO2016138457 A1 | 9/2016 |
| WO | WO2016138461 A1 | 9/2016 |
| WO | WO2016144652 A1 | 9/2016 |
| WO | WO2016183185 A1 | 11/2016 |
| WO | WO2017173348 A1 | 3/2017 |
| WO | WO2017015928 A1 | 6/2017 |
| WO | WO2017105927 A1 | 6/2017 |
| WO | WO2017173355 A1 | 10/2017 |
| WO | WO2017177065 A2 | 10/2017 |
| WO | WO2018078066 A1 | 10/2017 |
| WO | WO2017196954 A1 | 11/2017 |
| WO | WO2017197144 A1 | 11/2017 |
| WO | WO2017214165 A1 | 12/2017 |
| WO | WO2018013389 A1 | 1/2018 |
| WO | WO2018022925 A1 | 2/2018 |
| WO | WO2019071153 A1 | 10/2018 |
| WO | WO2018231805 A2 | 12/2018 |
| WO | WO2019071208 A1 | 4/2019 |
| WO | WO2019099789 A1 | 5/2019 |
| WO | WO2019118714 A1 | 6/2019 |
| WO | WO2019133399 A1 | 7/2019 |
| WO | WO2019140128 A1 | 7/2019 |
| WO | WO2019140227 A1 | 7/2019 |
| WO | WO2019140301 A1 | 7/2019 |
| WO | WO2019182765 A1 | 9/2019 |
| WO | WO2019182766 A1 | 9/2019 |
| WO | WO2020006285 A1 | 1/2020 |
| WO | WO2020014634 A1 | 1/2020 |

OTHER PUBLICATIONS

Fu, et al. "Parameters influencing the molecular weight of 3,6-carbazole-based D-π-A-type copolymers", Journal of Polymer Science Part A: Polymer Chemistry, 49(Issue20)pp. p.4368To-4378, 2011.

Godana, et al. "Fluorescent conjugated polymer nanoparticles and aggregates based on rapid precipitation and self-assembled π-conjugated systems", Polymer, vol. 174, Jun. 12, 2019, pp. 45-51.

Herrero-Carvajal, et a; "EDOT-Based Copolymers with Pendant Anthraquinone Units: Analysis of Their Optoelectronic Properties within the Double-Cable Context", J. Phys. Chem. C 2014, 118, 19, 9899-9910.

Meng, et al. "Replacing Alkyl with Oligo(ethylene glycol) as Side Chains of Conjugated Polymers for Close π-πStacking", Macromolecules 2015, 48, 13, 4357-4363.

Shimizu, "aaza-BODIPY synthesis towards vis/NIR functional chromophores based on a Schiff base forming reaction protocol using lactams and heteroaromatic amines", Chem Commun (Camb), Jul. 23, 2019;55(60):8722-8743.

Traina, et al. "Design and synthesis of monofunctionalized, water-soluble conjugated polymers for biosensing and maging applications", J Am Chem Soc. . Aug. 17, 2011;133(32):12600-7.

Wang, et al. "Synthesis and Characterization of Water-Soluble Polythiophene Derivatives for Cell Imaging", Polythiophene Derivatives for Cell Imaging. Sci Rep 5, 7617 (2015).

Ziegler, et al. "Synthesis and characterization of alternating fluorene-thiophene copolymers bearing ethylene glycol side-chains", Monatsh Chem. 2011; 142(2): 193-200.

Liu, B. et al., "Polyacetylenes containing BODIPY pendants with different connectivities: synthesis, characterization and opto-electronic properties", Polymer Chemistry, Sep. 11, 2013, vol. 5, No. 2, pp. 372-381. Abstract Only.

* cited by examiner

WATER-SOLUBLE FLUORESCENT POLYMERIC DYES

CROSS-REFERENCE TO RELATED APPLICATIONS

Pursuant to 35 U.S.C. § 119(e), this application claims priority to the filing date of U.S. Provisional Patent Application Ser. No. 63/171,722 filed Apr. 7, 2021; the disclosure of which application is incorporated herein by reference in their entirety.

INTRODUCTION

Fluorescent dyes are compounds which, when irradiated with light of a wavelength which they absorb, emit light of a (usually) different wavelength. Fluorescent dyes find use in a variety of applications in biochemistry, biology and medicine, e.g. in diagnostic kits, in microscopy or in drug screening. Fluorescent dyes are characterized by a number of parameters allowing a user to select a suitable dye depending on the desired purpose. Parameters of interest include the excitation wavelength maximum, the emission wavelength maximum, the Stokes shift, the extinction coefficient, the fluorescence quantum yield and the fluorescence lifetime. Dyes may be selected according to the application of interest in order to, e.g., allow penetration of exciting radiation into biological samples, to minimize background fluorescence and/or to achieve a high signal-to-noise ratio.

Molecular recognition involves the specific binding of two molecules. Molecules which have binding specificity for a target biomolecule find use in a variety of research and diagnostic applications, such as the labeling and separation of analytes, flow cytometry, in situ hybridization, enzyme-linked immunosorbent assays (ELISAs), western blot analysis, magnetic cell separations and chromatography. Target biomolecules may be detected by labeling with a fluorescent dye.

SUMMARY

The inventors have realized that polymeric dyes with equal amounts of a first co-monomer and a second co-monomer can have disadvantageous properties. For example, increased water solubility can be a desirable property of polymeric dyes, but polymeric dyes wherein only the first co-monomer is substituted with water-soluble groups can have low water solubility. Such dyes can experience agglomeration, precipitation, and difficulties in processing due to their low water solubility. In addition, the inventors have found that attaching water-soluble groups to both co-monomers can alter the optical properties of the polymeric dyes in undesirable ways, e.g., by shifting the emission maximum wavelength of the fluorescent polymeric dye. In some cases the shifting results in overlap with the emission spectra of a different polymeric dye, making it more difficult to distinguish the two polymeric dyes spectroscopically.

The inventors investigated polymeric dyes with unequal amounts of the first and second co-monomers. It was found that increasing the relative amount of the first co-monomer substituted with water-soluble groups resulted in increased water solubility while also maintaining, or even improving, the optical properties of the polymeric dyes. For instance, increasing the amount of the first co-monomer reduced or eliminated undesirable side peaks in the absorption spectrum of certain polymeric dyes.

Water-soluble fluorescent polymeric dyes and polymeric tandem dyes are provided. The polymeric dyes include a water solvated light harvesting multi-chromophore having a conjugated segment of aryl and/or heteroaryl co-monomers. The molar ratio of the co-monomers can be adjusted to provide beneficial technical properties, such as increased water solubility and improved absorption and emissions spectra. For instance, the conjugated segment can have a first co-monomer substituted with a water-soluble group (WSG) and a second co-monomer, wherein the first co-monomer is in an amount that is equal or greater than the amount of the second co-monomer. The polymeric tandem dyes further include a signaling chromophore covalently linked to the multi-chromophore in energy-receiving proximity therewith. Also provided are aggregation-resistant labeled specific binding members that include the subject water-soluble polymeric dyes. Methods of evaluating a sample for the presence of a target analyte and methods of labeling a target molecule in which the subject polymeric dyes find use are also provided. Systems and kits for practicing the subject methods are also provided.

BRIEF DESCRIPTION OF THE FIGURES

It is understood that the drawings, described below, are for illustration purposes only. The drawings are not intended to limit the scope of the present teachings in any way.

DEFINITIONS

Figure 1:
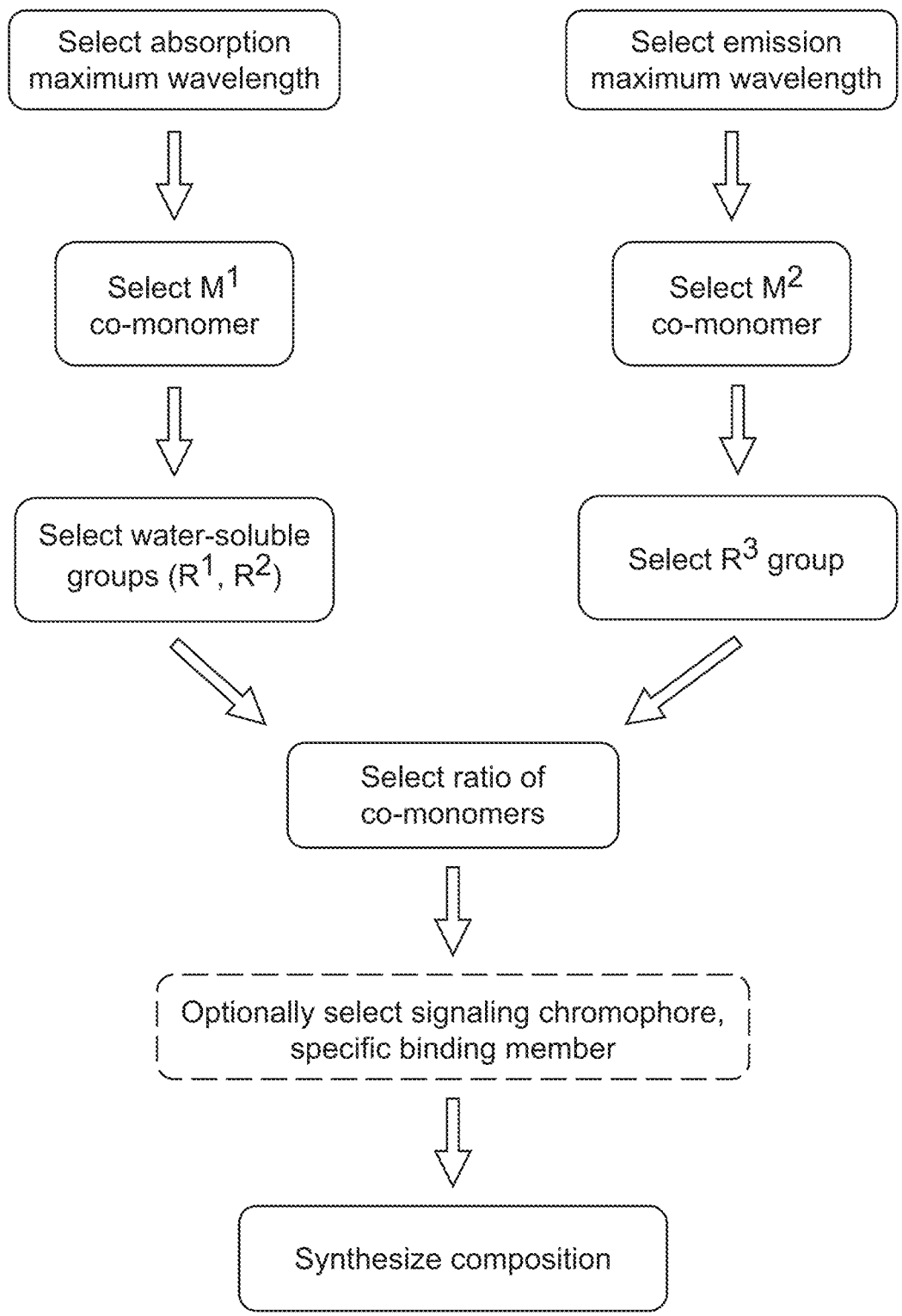
FIG. 1 shows an exemplary method of synthesizing a polymeric dye by selecting co-monomers $M^1$ and $M^2$ based on the desired absorption maximum wavelength and the desired emission maximum wavelength.

Before describing exemplary embodiments in greater detail, the following definitions are set forth to illustrate and define the meaning and scope of the terms used in the description.

Unless defined otherwise, all technical and scientific terms used herein have the same meaning as commonly understood by one of ordinary skill in the art to which this invention belongs. Still, certain terms are defined below for the sake of clarity and ease of reference.

It must be noted that as used herein and in the appended claims, the singular forms "a", "an", and "the" include plural referents unless the context clearly dictates otherwise. For example, the term "a primer" refers to one or more primers, i.e., a single primer and multiple primers. It is further noted that the claims can be drafted to exclude any optional element. As such, this statement is intended to serve as antecedent basis for use of such exclusive terminology as "solely," "only" and the like in connection with the recitation of claim elements, or use of a "negative" limitation.

As used herein, the term "sample" relates to a material or mixture of materials, in some cases in liquid form, containing one or more analytes of interest. In some embodiments, the term as used in its broadest sense, refers to any plant, animal or bacterial material containing cells or producing cellular metabolites, such as, for example, tissue or fluid isolated from an individual (including without limitation plasma, serum, cerebrospinal fluid, lymph, tears, saliva and tissue sections) or from in vitro cell culture constituents, as well as samples from the environment. The term "sample" may also refer to a "biological sample". As used herein, the term "a biological sample" refers to a whole organism or a subset of its tissues, cells or component parts (e.g. body fluids, including, but not limited to, blood, mucus, lymphatic fluid, synovial fluid, cerebrospinal fluid, saliva, amniotic fluid, amniotic cord blood, urine, vaginal fluid and semen). A "biological sample" can also refer to a homogenate, lysate or extract prepared from a whole organism or a subset of its tissues, cells or component parts, or a fraction or portion thereof, including but not limited to, plasma, serum, spinal fluid, lymph fluid, the external sections of the skin, respiratory, intestinal, and genitourinary tracts, tears, saliva, milk, blood cells, tumors and organs. In certain embodiments, the sample has been removed from an animal or plant. Biological samples may include cells. The term "cells" is used in its conventional sense to refer to the basic structural unit of living organisms, both eukaryotic and prokaryotic, having at least a nucleus and a cell membrane. In certain embodiments, cells include prokaryotic cells, such as from bacteria. In other embodiments, cells include eukaryotic cells, such as cells obtained from biological samples from animals, plants or fungi.

As used herein, the terms "support bound" and "linked to a support" are used interchangeably and refer to a moiety (e.g., a specific binding member) that is linked covalently or non-covalently to a support of interest. Covalent linking may involve the chemical reaction of two compatible functional groups (e.g., two chemoselective functional groups, an electrophile and a nucleophile, etc.) to form a covalent bond between the two moieties of interest (e.g. a support and a specific binding member). In some cases, non-covalent linking may involve specific binding between two moieties of interest (e.g., two affinity moieties such as a hapten and an antibody or a biotin moiety and a streptavidin, etc.). In certain cases, non-covalent linking may involve absorption to a substrate.

As used herein, the term "polypeptide" refers to a polymeric form of amino acids of any length, including peptides that range from 2-50 amino acids in length and polypeptides that are greater than 50 amino acids in length. The terms "polypeptide" and "protein" are used interchangeably herein. The term "polypeptide" includes polymers of coded and non-coded amino acids, chemically or biochemically modified or derivatized amino acids, and polypeptides having modified peptide backbones in which the conventional backbone has been replaced with non-naturally occurring or synthetic backbones. A polypeptide may be of any convenient length, e.g., 2 or more amino acids, such as 4 or more amino acids, 10 or more amino acids, 20 or more amino acids, 50 or more amino acids, 100 or more amino acids, 300 or more amino acids, such as up to 500 or 1000 or more amino acids. "Peptides" may be 2 or more amino acids, such as 4 or more amino acids, 10 or more amino acids, 20 or more amino acids, such as up to 50 amino acids. In some embodiments, peptides are between 5 and 30 amino acids in length.

As used herein the term "isolated," refers to an moiety of interest that is at least 60% free, at least 75% free, at least 90% free, at least 95% free, at least 98% free, and even at least 99% free from other components with which the moiety is associated with prior to purification.

A "plurality" contains at least 2 members. In certain cases, a plurality may have 10 or more, such as 100 or more, 1000 or more, 10,000 or more, 100,000 or more, $10^6$ or more, $10^7$ or more, $10^8$ or more or $10^9$ or more members.

Numeric ranges are inclusive of the numbers defining the range.

As used herein, the term "specific binding" refers to the ability of a capture agent (or a first member of a specific binding pair) to preferentially bind to a particular analyte (or a second member of a specific binding pair) that is present, e.g., in a homogeneous mixture of different analytes. In some instances, a specific binding interaction will discriminate between desirable and undesirable analytes in a sample with a specificity of 10-fold or more for a desirable analyte over an undesirable analytes, such as 100-fold or more, or 1000-fold or more. In some cases, the affinity between a capture agent and analyte when they are specifically bound in a capture agent/analyte complex is at least $10^{-8}$ M, at least $10^{-9}$ M, such as up to $10^{-10}$ M.

As used herein, the terms "affinity" and "avidity" have the same meaning and may be used interchangeably herein. "Affinity" refers to the strength of binding, increased binding affinity being correlated with a lower Kd. In an embodiment, affinity is determined by surface plasmon resonance (SPR), e.g. as used by Biacore systems. The affinity of one molecule for another molecule is determined by measuring the binding kinetics of the interaction, e.g. at 25° C.

The methods described herein include multiple steps. Each step may be performed after a predetermined amount of time has elapsed between steps, as desired. As such, the time between performing each step may be 1 second or more, 10 seconds or more, 30 seconds or more, 60 seconds or more, 5 minutes or more, 10 minutes or more, 60 minutes or more and including 5 hours or more. In certain embodiments, each subsequent step is performed immediately after completion of the previous step. In other embodiments, a step may be performed after an incubation or waiting time after completion of the previous step, e.g., a few minutes to an overnight waiting time.

As used herein, the terms "evaluating", "determining," "measuring," and "assessing," and "assaying" are used interchangeably and include both quantitative and qualitative determinations.

The term "separating", as used herein, refers to physical separation of two elements (e.g., by size or affinity, etc.) as well as degradation of one element, leaving the other intact.

As used herein, the term "linker" or "linkage" refers to a linking moiety that connects two groups and has a backbone of 100 atoms or less in length. A linker or linkage may be a covalent bond that connects two groups or a chain of between 1 and 100 atoms in length, for example a chain of 1, 2, 3, 4, 5, 6, 8, 10, 12, 14, 16, 18, 20 or more carbon atoms in length, where the linker may be linear, branched, cyclic or a single atom. In some cases, the linker is a branching linker that refers to a linking moiety that connects three or more groups. In certain cases, one, two, three, four or five or more carbon atoms of a linker backbone may be optionally substituted with a sulfur, nitrogen or oxygen heteroatom. In some cases, the linker backbone includes a linking functional group, such as an ether, thioether, amino, amide, sulfonamide, carbamate, thiocarbamate, urea, thiourea, ester, thioester or imine. The bonds between backbone atoms may be saturated or unsaturated, and in some cases not more than one, two, or three unsaturated bonds are present in a linker backbone. The linker may include one or more substituent groups, for example with an alkyl, aryl or alkenyl group. A linker may include, without limitations, polyethylene glycol; ethers, thioethers, tertiary amines, alkyls, which may be straight or branched, e.g., methyl, ethyl, n-propyl, 1-methylethyl (iso-propyl), n-butyl, n-pentyl, 1,1-dimethylethyl (t-butyl), and the like. The linker backbone may include a cyclic group, for example, an aryl, a heterocycle or a cycloalkyl group, where 2 or more atoms, e.g., 2, 3 or 4 atoms, of the cyclic group are included in the backbone. A linker may be cleavable or non-cleavable.

As used herein, the terms "polyethylene oxide", "PEO", "polyethylene glycol" and "PEG" are used interchangeably and refer to a polymeric group including a chain described by the formula —($CH_2$—$CH_2$—O—)$_n$— or a derivative thereof. In some embodiments, "n" is 5000 or less, such as 1000 or less, 500 or less, 200 or less, 100 or less, 50 or less, 40 or less, 30 or less, 20 or less, 15 or less, such as 3 to 15, or 10 to 15. It is understood that the PEG polymeric group may be of any convenient length and may include a variety of terminal groups and/or further substituent groups, including but not limited to, alkyl, aryl, hydroxyl, amino, acyl, acyloxy, and amido terminal and/or substituent groups. PEG groups that may be adapted for use in the subject multichromophores include those PEGs described by S. Zalipsky in "Functionalized poly(ethylene glycol) for preparation of biologically relevant conjugates", Bioconjugate Chemistry 1995, 6 (2), 150-165; and by Zhu et al in "Water-Soluble Conjugated Polymers for Imaging, Diagnosis, and Therapy", Chem. Rev., 2012, 112 (8), pp 4687-4735.

As used herein, the term "alkyl" by itself or as part of another substituent refers to a saturated branched or straight-chain monovalent hydrocarbon radical derived by the removal of one hydrogen atom from a single carbon atom of a parent alkane. Alkyl groups of interest include, but are not limited to, methyl; ethyl, propyls such as propan-1-yl or propan-2-yl; and butyls such as butan-1-yl, butan-2-yl, 2-methyl-propan-1-yl or 2-methyl-propan-2-yl. In some embodiments, an alkyl group includes from 1 to 20 carbon atoms. In some embodiments, an alkyl group includes from 1 to 10 carbon atoms. In certain embodiments, an alkyl group includes from 1 to 6 carbon atoms, such as from 1 to 4 carbon atoms. This term includes, by way of example, linear and branched hydrocarbyl groups such as methyl ($CH_3$—), ethyl ($CH_3CH_2$—), n-propyl ($CH_3CH_2CH_2$—), isopropyl (($CH_3$)$_2$CH—), n-butyl ($CH_3CH_2CH_2CH_2$—), isobutyl (($CH_3$)$_2$CHCH$_2$—), sec-butyl (($CH_3$)($CH_3CH_2$)CH—), t-butyl (($CH_3$)$_3$C—), n-pentyl ($CH_3CH_2CH_2CH_2CH_2$—), and neopentyl (($CH_3$)$_3$CCH$_2$—).

The term "substituted alkyl" refers to an alkyl group as defined herein wherein one or more carbon atoms in the alkyl chain have been optionally replaced with a heteroatom such as —O—, —N—, —S—, —S(O)$_n$— (where n is 0 to 2), —NR— (where R is hydrogen or alkyl) and having from 1 to 5 substituents selected from the group consisting of alkoxy, substituted alkoxy, cycloalkyl, substituted cycloalkyl, cycloalkenyl, substituted cycloalkenyl, acyl, acylamino, acyloxy, amino, aminoacyl, aminoacyloxy, oxyaminoacyl, azido, cyano, halogen, hydroxyl, oxo, thioketo, carboxyl, carboxylalkyl, thioaryloxy, thioheteroaryloxy, thioheterocyclooxy, thiol, thioalkoxy, substituted thioalkoxy, aryl, aryloxy, heteroaryl, heteroaryloxy, heterocyclyl, heterocyclooxy, hydroxyamino, alkoxyamino, nitro, —SO-alkyl, —SO-aryl, —SO-heteroaryl, —SO$_2$-alkyl, —SO$_2$-aryl, —SO$_2$-heteroaryl, and —NR$^a$R$^b$, wherein R' and R" may be the same or different and are chosen from hydrogen, optionally substituted alkyl, cycloalkyl, alkenyl, cycloalkenyl, alkynyl, aryl, heteroaryl and heterocyclic.

"Alkoxy" refers to the group —O-alkyl, wherein alkyl is as defined herein. Alkoxy includes, by way of example, methoxy, ethoxy, n-propoxy, isopropoxy, n-butoxy, t-butoxy, sec-butoxy, n-pentoxy, and the like. The term "alkoxy" also refers to the groups alkenyl-O—, cycloalkyl-O—, cycloalkenyl-O—, and alkynyl-O—, where alkenyl, cycloalkyl, cycloalkenyl, and alkynyl are as defined herein.

The term "substituted alkoxy" refers to the groups substituted alkyl-O—, substituted alkenyl-O—, substituted cycloalkyl-O—, substituted cycloalkenyl-O—, and substituted alkynyl-O— where substituted alkyl, substituted alkenyl, substituted cycloalkyl, substituted cycloalkenyl and substituted alkynyl are as defined herein.

"Amino" refers to the group —NH$_2$.

The term "substituted amino" refers to the group —NRR where each R is independently selected from the group consisting of hydrogen, alkyl, substituted alkyl, cycloalkyl, substituted cycloalkyl, alkenyl, substituted alkenyl, cycloalkenyl, substituted cycloalkenyl, alkynyl, substituted alkynyl, aryl, heteroaryl, and heterocyclyl provided that at least one R is not hydrogen.

"Aryl" by itself or as part of another substituent refers to a monovalent aromatic hydrocarbon radical derived by the removal of one hydrogen atom from a single carbon atom of an aromatic ring system. Aryl groups of interest include, but are not limited to, groups derived from aceanthrylene, acenaphthylene, acephenanthrylene, anthracene, azulene, benzene, chrysene, coronene, fluoranthene, fluorene, hexacene, hexaphene, hexalene, as-indacene, s-indacene, indane, indene, naphthalene, octacene, octaphene, octalene, ovalene, penta-2,4-diene, pentacene, pentalene, pentaphene, perylene, phenalene, phenanthrene, picene, pleiadene, pyrene, pyranthrene, rubicene, triphenylene, trinaphthalene and the like. In certain embodiments, an aryl group includes from 6 to 20 carbon atoms. In certain embodiments, an aryl group includes from 6 to 12 carbon atoms. Examples of an aryl group are phenyl and naphthyl.

"Heteroaryl" by itself or as part of another substituent, refers to a monovalent heteroaromatic radical derived by the removal of one hydrogen atom from a single atom of a heteroaromatic ring system. Heteroaryl groups of interest include, but are not limited to, groups derived from acridine, arsindole, carbazole, β-carboline, chromane, chromene, cinnoline, furan, imidazole, indazole, indole, indoline, indolizine, isobenzofuran, isochromene, isoindole, isoindoline, isoquinoline, isothiazole, isoxazole, naphthyridine, oxadiazole, oxazole, perimidine, phenanthridine, phenanthroline, phenazine, phthalazine, pteridine, purine, pyran, pyrazine, pyrazole, pyridazine, pyridine, pyrimidine, pyrrole, pyrrolizine, quinazoline, quinoline, quinolizine, quinoxaline, tetrazole, thiadiazole, thiazole, triazole, benzotriazole, thiophene, triazole, xanthene, benzodioxole and the like. In certain embodiments, the heteroaryl group is from 5-20 membered heteroaryl. In certain embodiments, the heteroaryl group is from 5-10 membered heteroaryl. In certain embodiments, heteroaryl groups are those derived from thiophene, pyrrole, benzothiophene, benzofuran, indole, pyridine, quinoline, imidazole, oxazole and pyrazine.

"Heterocycle," "heterocyclic," "heterocycloalkyl," and "heterocyclyl" refer to a saturated or unsaturated group having a single ring or multiple condensed rings, including fused bridged and spiro ring systems, and having from 3 to 20 ring atoms, including 1 to 10 hetero atoms. These ring atoms are selected from the group consisting of nitrogen, sulfur, or oxygen, wherein, in fused ring systems, one or more of the rings can be cycloalkyl, aryl, or heteroaryl, provided that the point of attachment is through the non-aromatic ring. In certain embodiments, the nitrogen and/or sulfur atom(s) of the heterocyclic group are optionally oxidized to provide for the N-oxide, —S(O)—, or —SO$_2$— moieties.

Examples of heterocycles and heteroaryls include, but are not limited to, azetidine, pyrrole, imidazole, pyrazole, pyridine, pyrazine, pyrimidine, pyridazine, indolizine, isoindole, indole, dihydroindole, indazole, purine, quinolizine, isoquinoline, quinoline, phthalazine, naphthylpyridine, quinoxaline, quinazoline, cinnoline, pteridine, carbazole, carboline, phenanthridine, acridine, phenanthroline, isothiazole, phenazine, isoxazole, phenoxazine, phenothiazine, imidazolidine, imidazoline, piperidine, piperazine, indoline, phthalimide, 1,2,3,4-tetrahydroisoquinoline, 4,5,6,7-tetrahydrobenzo[b]thiophene, thiazole, thiazolidine, thiophene, benzo[b]thiophene, morpholinyl, thiomorpholinyl (also referred to as thiamorpholinyl), 1,1-dioxothiomorpholinyl, piperidinyl, pyrrolidine, tetrahydrofuranyl, and the like.

Unless otherwise constrained by the definition for the heterocyclic substituent, such heterocyclic groups can be optionally substituted with 1 to 5, or from 1 to 3 substituents, selected from alkoxy, substituted alkoxy, cycloalkyl, substituted cycloalkyl, cycloalkenyl, substituted cycloalkenyl, acyl, acylamino, acyloxy, amino, substituted amino, aminoacyl, aminoacyloxy, oxyaminoacyl, azido, cyano, halogen, hydroxyl, oxo, thioketo, carboxyl, carboxylalkyl, thioaryloxy, thioheteroaryloxy, thioheterocyclooxy, thiol, thioalkoxy, substituted thioalkoxy, aryl, aryloxy, heteroaryl, heteroaryloxy, heterocyclyl, heterocyclooxy, hydroxyamino, alkoxyamino, nitro, —SO-alkyl, —SO-substituted alkyl, —SO-aryl, —SO-heteroaryl, —SO$_2$-alkyl, —SO$_2$-substituted alkyl, —SO$_2$-aryl, —SO$_2$-heteroaryl, and fused heterocycle.

The term "alkaryl" or "aralkyl" refers to the groups -alkylene-aryl and substituted alkylene-aryl where alkylene, substituted alkylene and aryl are defined herein.

"Alkylene" refers to divalent aliphatic hydrocarbyl groups preferably having from 1 to 6 and more preferably 1 to 3 carbon atoms that are either straight-chained or branched, and which are optionally interrupted with one or more groups selected from —O—, —NR$^{10}$—, —NR$^{10}$C(O)—, —C(O)NR$^{10}$— and the like. This term includes, by way of example, methylene (—CH$_2$—), ethylene (—CH$_2$CH$_2$—), n-propylene (—CH$_2$CH$_2$CH$_2$—), iso-propylene (—CH$_2$CH(CH$_3$)—), (—C(CH$_3$)$_2$CH$_2$CH$_2$—), (—C(CH$_3$)$_2$CH$_2$C(O)—), (—C(CH$_3$)$_2$CH$_2$C(O)NH—), (—CH(CH$_3$)CH$_2$—), and the like. "Substituted alkylene" refers to an alkylene group having from 1 to 3 hydrogens replaced with substituents as described for carbons in the definition of "substituted" below.

"Substituted" refers to a group in which one or more hydrogen atoms are independently replaced with the same or different substituent(s). Substituents of interest include, but are not limited to, alkylenedioxy (such as methylenedioxy), -M, —R$^{60}$, —O$^-$, =O, —OR$^{60}$, —SR$^{60}$, —S$^-$, =S, —NR$^{60}$R$^{61}$, =NR$^{60}$, —CF$_3$, —CN, —OCN, —SCN, —NO, —NO$_2$, =N$_2$, —N$_3$, —S(O)$_2$O$^-$, —S(O)$_2$OH, —S(O)$_2$R$^{60}$, —OS(O)$_2$O$^-$, —OS(O)$_2$R$^{60}$, —P(O)(O$^-$)$_2$, —P(O)(OR$^{60}$)(O$^-$), —OP(O)(OR$^{60}$)(OR$^{61}$), —C(O)R$^{60}$, —C(S)R$^{60}$, —C(O)OR$^{60}$, —C(O)NR$^{60}$R$^{61}$, —C(O)O$^-$, —C(S)OR$^{60}$, —NR$^{62}$C(O)NR$^{60}$R$^{61}$, —NR$^{62}$C(S)NR$^{60}$R$^{61}$, —NR$^{62}$C(NR$^{63}$)NR$^{60}$R$^{61}$ and —C(NR$^{62}$)NR$^{60}$R$^{61}$ where M is halogen; R$^{60}$, R$^{61}$, R$^{62}$ and R$^{63}$ are independently hydrogen, alkyl, substituted alkyl, alkoxy, substituted alkoxy, cycloalkyl, substituted cycloalkyl, cycloheteroalkyl, substituted cycloheteroalkyl, aryl, substituted aryl, heteroaryl or substituted heteroaryl, or optionally R$^{60}$ and R$^{61}$ together with the nitrogen atom to which they are bonded form a cycloheteroalkyl or substituted cycloheteroalkyl ring; and R$^{64}$ and R$^{65}$ are independently hydrogen, alkyl, substituted alkyl, aryl, cycloalkyl, substituted cycloalkyl, cycloheteroalkyl, substituted cycloheteroalkyl, aryl, substituted aryl, heteroaryl or substituted heteroaryl, or optionally R$^{64}$ and R$^{65}$ together with the nitrogen atom to which they are bonded form a cycloheteroalkyl or substituted cycloheteroalkyl ring. In certain embodiments, substituents include -M, —R$^{60}$, =O, —OR$^{60}$, —SR$^{60}$, —S$^-$, =S, —NR$^{60}$R$^{61}$, =NR$^{60}$, —CF$_3$, —CN, —OCN, —SCN, —NO, —NO$_2$, =N$_2$, —N$_3$, —S(O)$_2$R$^{60}$, —OS(O)$_2$O$^-$, —OS(O)$_2$R$^{60}$, —P(O)(O$^-$)$_2$, —P(O)(OR$^{60}$)(O$^-$), —OP(O)(OR$^{60}$)(OR$^{61}$), —C(O)R$^{60}$, —C(S)R$^{60}$, —C(O)OR$^{60}$, —C(O)NR$^{60}$R$^{61}$, —C(O)O$^-$, —NR$^{62}$C(O)NR$^{60}$R$^{61}$. In certain embodiments, substituents include -M, —R$^{60}$, =O, —OR$^{60}$, —SR$^{60}$, —NR$^{60}$R$^{61}$, —CF$_3$, —CN, —NO$_2$, —S(O)$_2$R$^{60}$, —P(O)(OR$^{60}$)(O$^-$), —OP(O)(OR$^{60}$)(OR$^{61}$), —C(O)R$^{60}$, —C(O)OR$^{60}$, —C(O)NR$^{60}$R$^{61}$, —C(O)O$^-$. In certain embodiments, substituents include -M, —R$^{60}$, =O, —OR$^{60}$, —SR$^{60}$, —NR$^{60}$R$^{61}$, —CF$_3$, —CN, —NO$_2$, —S(O)$_2$R$^{60}$, —OP(O)(OR$^{60}$)(OR$^{61}$), —C(O)OR$^{60}$, —C(O)OR$^{60}$, —C(O)O$^-$, where R$^{60}$, R$^{61}$ and R$^{62}$ are as defined above. For example, a substituted group may bear a methylenedioxy substituent or one, two, or three substituents selected from a halogen atom, a (1-4C)alkyl group and a (1-4C)alkoxy group. When the group being substituted is an aryl or heteroaryl group, the substituent(s) (e.g., as described herein) may be referred to as "aryl substituent(s)".

Other definitions of terms may appear throughout the specification.

DETAILED DESCRIPTION

Water-soluble fluorescent polymeric dyes and polymeric tandem dyes are provided. The polymeric dyes include a water solvated light harvesting multi-chromophore having a conjugated segment of aryl and/or heteroaryl co-monomers. The molar ratio of the co-monomers can be adjusted to provide beneficial technical properties, such as increased water solubility and improved absorption and emissions spectra. For instance, the conjugated segment can have a first co-monomer substituted with a water-soluble group (WSG) and a second co-monomer, wherein the first co-monomer is in an amount that is equal or greater than the amount of the second co-monomer, multi-chromophore. The polymeric tandem dyes further include a signaling chromophore covalently linked to the multi-chromophore in energy-receiving proximity therewith. Also provided are aggregation-resistant labeled specific binding members that include the subject water-soluble polymeric dyes. Methods of evaluating a sample for the presence of a target analyte and methods of labeling a target molecule in which the subject polymeric dyes find use are also provided. Systems and kits for practicing the subject methods are also provided.

Before the present invention is described in greater detail, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

Certain ranges are presented herein with numerical values being preceded by the term "about." The term "about" is used herein to provide literal support for the exact number that it precedes, as well as a number that is near to or approximately the number that the term precedes. In determining whether a number is near to or approximately a specifically recited number, the near or approximating unrecited number may be a number which, in the context in which it is presented, provides the substantial equivalent of the specifically recited number.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, representative illustrative methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

While the apparatus and method has or will be described for the sake of grammatical fluidity with functional explanations, it is to be expressly understood that the claims, unless expressly formulated under 35 U.S.C. § 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 U.S.C. § 112 are to be accorded full statutory equivalents under 35 U.S.C. § 112.

Polymeric Dyes

As summarized above, the present disclosure provides water-soluble polymeric dyes. The subject water-soluble polymeric dyes include a light harvesting multi-chromophore having a conjugated segment of aryl and/or heteroaryl co-monomers. The molar ratio of the co-monomers can be adjusted to provide beneficial technical properties, such as increased water solubility and improved absorption and emissions spectra. For instance, the conjugated segment can have a first co-monomer substituted with a water-soluble group (WSG) and a second co-monomer, wherein the first co-monomer is in an amount that is equal or greater than the amount of the second co-monomer.

For instance, the water-soluble light harvesting multi-chromophore can comprise a conjugated segment of formula (I):

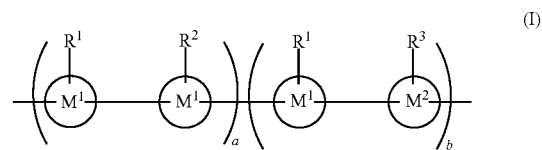

wherein:

$M^1$ and $M^2$ are each independently an aryl or heteroaryl co-monomer;

$R^1$ and $R^2$ are each independently a water-soluble group;

$R^3$ is selected from the group consisting of hydrogen, alkyl, substituted alkyl, alkoxy, substituted alkoxy, aryl, substituted aryl, heteroaryl, substituted heteroaryl, halo, cyano, and hydroxyl; and a and b define the mol % of each unit within the conjugated segment, wherein a is greater than or equal to b.

The ratio between a and b in formula (I) also describes the molar ratio between co-monomer $M^1$ and co-monomer $M^2$. For example, a can range from 0.50 to 0.80 and b can range from 0.50 to 0.20, and in such cases the molar ratio of $M^1$ to $M^2$ ranges from 3:1 to 9:1. In some cases, a ranges from 0.01 to 0.99 and b ranges from 0.99 to 0.01, e.g., a ranges from 0.20 to 0.99 and b ranges from 0.80 to 0.01, a ranges from 0.35 to 0.99 and b ranges from 0.65 to 0.01, a ranges from 0.50 to 0.99 and b ranges from 0.50 to 0.01, a ranges from 0.50 to 0.80 and b ranges from 0.50 to 0.20, and a ranges from 0.60 to 0.70 and b ranges from 0.30 to 0.40. In some cases the molar ratio of $M^1$ to $M^2$ ranges from 1.5:1 to 20:1, such as from 2:1 to 15:1, 3:1 to 9:1, and 4:1 to 8:1. In some cases, e.g., in some of the ranges recited above, a is greater than 0.50.

The $M^1R^1$ group indicates that $M^1$ is substituted with one or more $R^1$ groups, such as one $R^1$ group, two $R^1$ groups, three $R^1$ groups, or four or more $R^1$ groups. Similarly, the $M^1R^2$ and the $M^2R^3$ groups indicate that $M^1$ and $M^2$ are each independently substituted by one or more $R^2$ or $R^3$ groups, respectively, such as one R group, two R groups, three R groups, or four or more R groups. $M^1$ and $M^2$ can be the same group or different groups.

As described above, $M^1$ and $M^2$ are each independently an aryl co-monomer or a heteroaryl co-monomer. In some embodiments one or both of $M^1$ and $M^2$ can be a 5-membered aromatic group, a 6-membered aromatic group, a fused bicyclic aromatic group, a fused tricyclic aromatic group, or a combination thereof. For instance, one or both of $M^1$ and $M^2$ can be a phenyl group, pyridyl group, napthyl group, binapthyl group, or a fused tricyclic aromatic group. In cases wherein the co-monomer is a fused tricyclic aromatic group, the co-monomer can in some embodiments be described by the following structure:

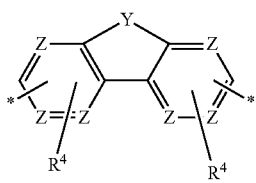

wherein:

each $R^4$ is independently H or one or more alkyl, substituted alkyl, aryl or heteroaryl substituents and wherein any two convenient $R^4$ groups are optionally cyclically linked;

Y is $C(R^5)_2$, $-C(R^5)_2C(R^5)_2-$, $-C(R^5)_2Si(R^5)_2-$, $NR^5$, $Si(R^5)_2$ or Se;

each $R^5$ is independently selected from H, alkyl, substituted alkyl, aryl, substituted aryl, heteroaryl, substituted heteroaryl, acyl, substituted acyl, alkoxy, substituted alkoxy, amido, substituted amido, an aralkyl, a substituted aralkyl, a PEG moiety, $-L^1-Z^1$, where $L^1$ is a linker and $Z^1$ is a chemoselective tag and a WSG; and each Z is independently CH, $CR^4$ or N, wherein at least two of Z in each ring is CH or $CR^4$;

each * indicates a location for attachment to an $M^2$ group or another $M^1$ group; and at least one $R^4$ or $R^5$ is a water-soluble group.

For instance, Y can be $C(R^5)_2$ or $-C(R^5)_2C(R^5)_2-$ in some embodiments. In some cases, each Z is CH or $CR^4$, e.g., each Z is CH. As described above, at least one $R^4$ or $R^5$ is a water-soluble group, e.g., $R^4$ or $R^5$ can be the $R^1$ or $R^2$ of formula (I). Stated in another manner, the $R^1$ and $R^2$ groups of formula (I) can be linked to an aryl ring of the fluorene of $M^1$. In some cases, the two asterisks (*) denoting the location for attachment to an $M^2$ group or another $M^1$ group are located at the 2 and 7 positions of the fluorene.

In some embodiments one or both of $M^1$ and $M^2$ is a fused tricyclic group described by one of the following structures:

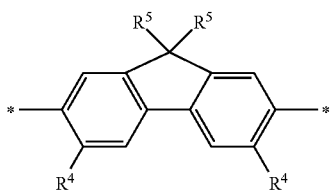

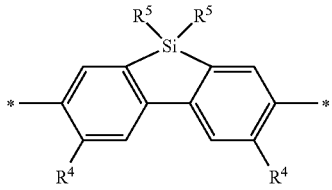

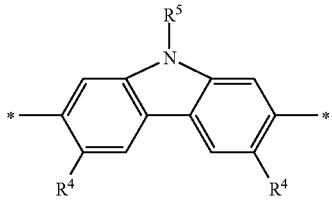

-continued

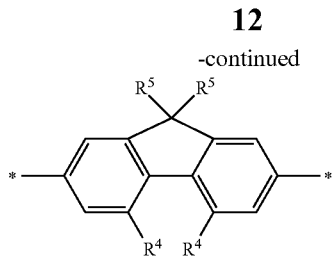

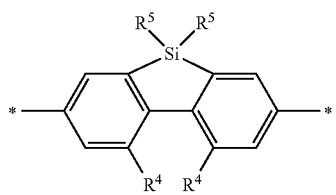

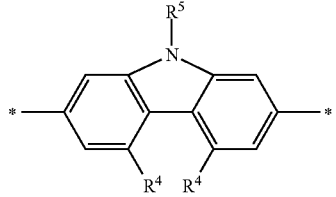

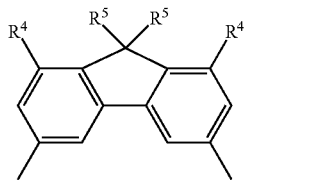

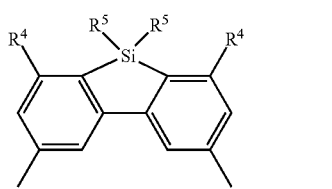

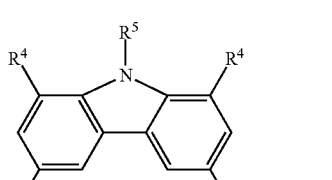

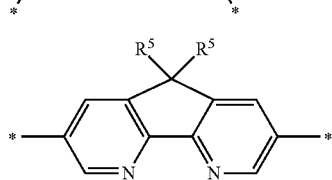

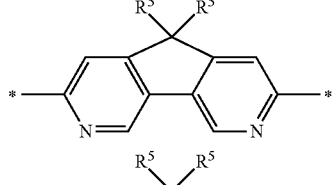

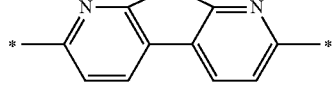

-continued

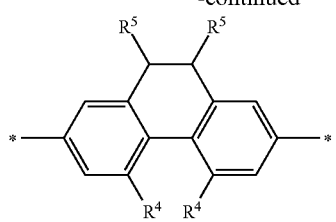

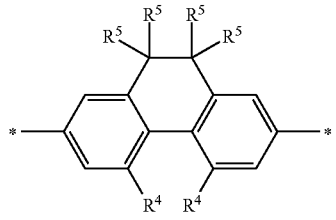

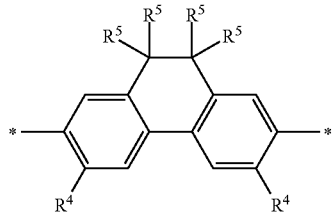

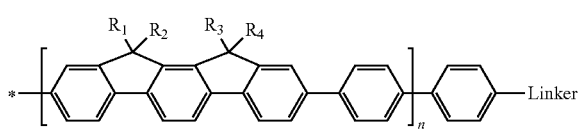

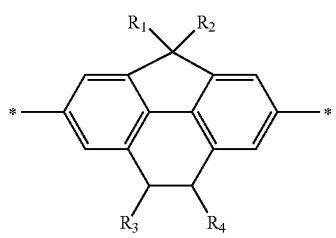

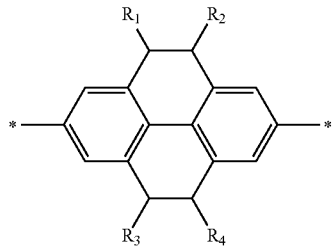

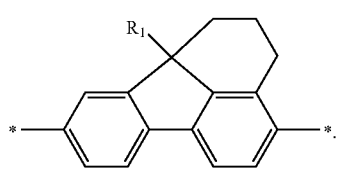

In some embodiments, one or both of $M^1$ and $M^2$ is a phenyl, napthyl, or binapthyl group, e.g. a group described by one of the following structures:

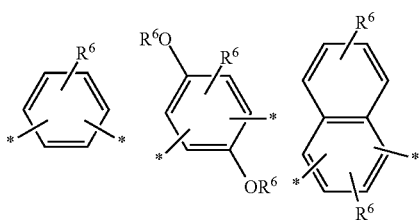

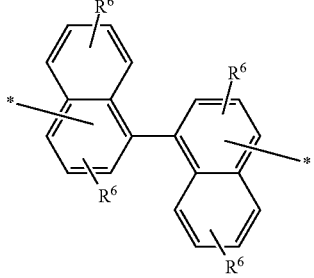

wherein:
each * indicates a location for attachment to another co-monomer; and
each $R^6$ is independently H or one or more alkyl, substituted alkyl, aryl or heteroaryl substituents and wherein any two convenient $R^6$ groups are optionally cyclically linked, wherein the structure has at least one $R^6$ that is a water-soluble group, wherein each ring can be substituted by one or more $R^6$ groups.

In some embodiments $M^1$ is a fused tricyclic co-monomer and $M^2$ is fused bicyclic or fused tricyclic co-monomer. For example, $M^1$ can be a 6-5-6 fused tricyclic co-monomer, e.g., fluorene, and $M^2$ can be a 6-5 fused bicyclic or 6-6-5 fused tricyclic co-monomer, e.g., with a structure shown above.

For instance, in some embodiments $M^1$ has a structure selected from the group consisting of:

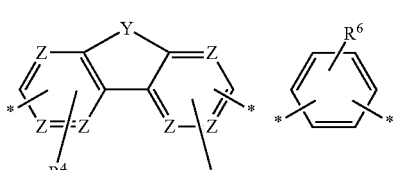

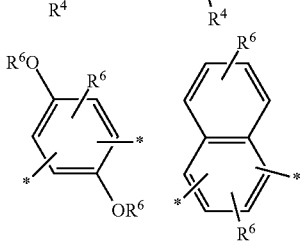

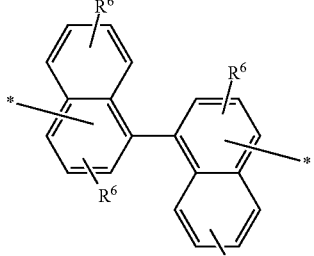

and M² has a structure selected from the group consisting of:

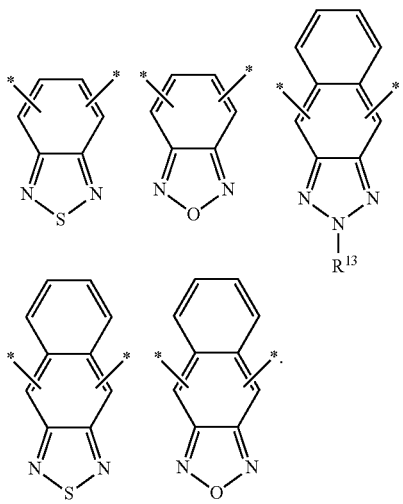

As described above, M¹ and M² are independently aryl or heteroaryl co-monomers that include π bonds. In some cases the multi-chromophore is π conjugated, e.g., π bonds in M¹ are conjugated to π bonds in M².

As described above, R¹ and R² are each independently a water-soluble group. R¹ and R² can be the same group or R¹ and R² can be different groups. As used herein, the terms "water solubilizing group", "water-soluble group" and WSG are used interchangeably and refer to a group or substituent that is well solvated in aqueous environments e.g., under physiological conditions, and that imparts improved water solubility upon the molecules to which it is attached. In some embodiments, a WSG increases the solubility of the multi-chromophore in a predominantly aqueous solution, as compared to a control multi-chromophore which lacks the WSG. The water solubilizing groups may be any convenient hydrophilic group that is well solvated in aqueous environments. A water-soluble group can be attached to a co-monomer at any convenient location to provide a sidechain group that projects away from the backbone of the conjugated polymer to provide high solvation in an aqueous environment. In some cases the water-soluble group be a non-ionic water-soluble group.

A water-soluble polymeric dye of the present disclosure has solubility under aqueous conditions that makes it especially suitable for application to a variety of biological assays. The subject water-soluble polymers, and conjugates thereof, can be resistant to undesirable aggregation which provides advantageous fluorescence and spectroscopic properties in various biological assays. Aggregation of dyes is undesirable because it can lead to reduced fluorescent signals, e.g., via aggregation-caused quenching of dye fluorescence. The subject water-soluble conjugated polymer dyes can be used as fluorescent reporters for a variety of biosensors and provide signals of exceptional brightness with a range of options for excitation and emission wavelength for applications such as Flow Cytometry, and imaging.

In certain instances, a water-soluble polymeric dye has a solubility in water or buffer of 0.1 mg/ml or more, such as 1 mg/mL or more, 3 mg/mL or more, 10 mg/mL or more, 20 mg/mL or more, 30 mg/mL or more, 40 mg/mL or more, 50 mg/mL or more, 60 mg/mL or more, 70 mg/mL or more, 80 mg/mL or more, 90 mg/mL or more, 100 mg/mL or more, or even more. In some cases the water-soluble polymeric dye has a solubility in water of 0.1 mg/ml to 100 mg/ml. It is understood that water-soluble polymeric dyes may, under certain conditions, form discrete water solvated nanoparticles in aqueous systems. In certain cases, the water solvated nanoparticles are resistant to aggregation and find use in a variety of biological assays.

The water-soluble group can include a water-soluble polymers, e.g., polyalkylene oxide based polymers, such as polyethylene glycol "PEG" (See. e.g., "Poly(ethylene glycol) Chemistry: Biotechnical and Biomedical Applications", J. M. Harris, Ed., Plenum Press, New York, N.Y. (1992); and "Poly(ethylene glycol) Chemistry and Biological Applications", J. M. Harris and S. Zalipsky, Eds., ACS (1997); and International Patent Applications: WO 90/13540, WO 92/00748, WO 92/16555, WO 94/04193, WO 94/14758, WO 94/17039, WO 94/18247, WO 94/28937, WO 95/11924, WO 96/00080, WO 96/23794, WO 98/07713, WO 98/41562, WO 98/48837, WO 99/30727, WO 99/32134, WO 99/33483, WO 99/53951, WO 01/26692, WO 95/13312, WO 96/21469, WO 97/03106, WO 99/45964, and U.S. Pat. Nos. 4,179,337; 5,075,046; 5,089, 261; 5,100,992; 5,134,192; 5,166,309; 5,171,264; 5,213, 891; 5,219,564; 5,275,838; 5,281,698; 5,298,643; 5,312, 808; 5,321,095; 5,324,844; 5,349,001; 5,352,756; 5,405, 877; 5,455,027; 5,446,090; 5,470,829; 5,478,805; 5,567, 422; 5,605,976; 5,612,460; 5,614,549; 5,618,528; 5,672, 662; 5,637,749; 5,643,575; 5,650,388; 5,681,567; 5,686, 110; 5,730,990; 5,739,208; 5,756,593; 5,808,096; 5,824, 778; 5,824,784; 5,840,900; 5,874,500; 5,880,131; 5,900, 461; 5,902,588; 5,919,442; 5,919,455; 5,932,462; 5,965, 119; 5,965,566; 5,985,263; 5,990,237; 6,011,042; 6,013, 283; 6,077,939; 6,113,906; 6,127,355; 6,177,087; 6,180, 095; 6,194,580; 6,214,966).

Examples of water-soluble polymer groups of interest include, but are not limited to, those containing a polyalkylene oxide, polyamide alkylene oxide, or derivatives thereof, including polyalkylene oxide and polyamide alkylene oxide comprising an ethylene oxide repeat unit of the formula —(CH₂—CH₂—O)—. Further examples of water-soluble polymer groups of interest include a polyamide having a molecular weight greater than 1,000 Daltons of the formula —[C(O)—X—C(O)—NH—Y—NH]ₙ— or —[NH—Y—NH—C(O)—X—C(O)]ₙ—, where X and Y are divalent radicals that may be the same or different and may be branched or linear, and n is a discrete integer from 2-100, such as from 2 to 50, and where either or both of X and Y comprises a biocompatible, substantially non-antigenic water-soluble repeat unit that may be linear or branched. Further examples of water-soluble repeat units comprise an ethylene oxide of the formula —(CH₂—CH₂—O)— or —(O—CH₂—CH₂)—. The number of such water-soluble repeat units can vary significantly, with the number of such units being from 2 to 500, 2 to 400, 2 to 300, 2 to 200, 2 to 100, 6-100, for example from 2 to 50 or 6 to 50. An example of an embodiment is one in which one or both of X and Y is selected from: —((CH₂)ₙ₁—(CH₂—CH₂—O)ₙ₂—(CH₂)— or —((CH₂)ₙ₁—(O—CH₂—CH₂)ₙ₂—(CH₂)ₙ₋₁—), where n1 is 1 to 6, 1 to 5, 1 to 4, or 1 to 3, and where n2 is 2 to 50, 2 to 25, 2 to 15, 2 to 10, 2 to 8, or 2 to 5. A further example of an embodiment is one in which X is —(CH₂—CH₂)—, and where Y is —(CH₂—(CH₂—CH₂—O)₃—CH₂—CH₂—CH₂)— or —(CH₂—CH₂—CH₂—(O—CH₂—CH₂)₃—CH₂)—.

Water solubilizing groups of interest include, but are not limited to, carboxylate, phosphonate, phosphate, sulfonate, sulfate, sulfinate, sulfonium, ester, polyethylene glycols (PEG) and modified PEGs, hydroxyl, amine, amino acid, ammonium, guanidinium, pyridinium, polyamine and sulfonium, polyalcohols, straight chain or cyclic saccharides, primary, secondary, tertiary, or quaternary amines and polyamines, phosphonate groups, phosphinate groups, ascorbate groups, glycols, including, polyethers, —COOM', —SO$_3$M', —PO$_3$M', —NR$_3^+$, Y', (CH$_2$CH$_2$O)$_p$R and mixtures thereof, where Y' can be any halogen, sulfate, sulfonate, or oxygen containing anion, p can be 1 to 500, each R can be independently H or an alkyl (such as methyl) and M$^1$ can be a cationic counterion or hydrogen, —(CH$_2$CH$_2$O)$_{yy}$CH$_2$CH$_2$XR$^{yy}$, —(CH$_2$CH$_2$O)$_{yy}$CH$_2$CH$_2$X—, —X(CH$_2$CH$_2$O)$_{yy}$CH$_2$CH$_2$—, glycol, and polyethylene glycol, wherein yy is selected from 1 to 1000, X is selected from O, S, and NR$^{zz}$, and R$^{zz}$ and R$^{yy}$ are independently selected from H and C$_{1-3}$ alkyl. In some cases, a WSG is (CH$_2$)$_x$(OCH$_2$CH$_2$)$_y$OCH$_3$ where each x is independently an integer from 0-20, each y is independently an integer from 0 to 50. In some cases, the water solubilizing group includes a non-ionic polymer (e.g., a PEG polymer) substituted at the terminal with an ionic group (e.g., a sulfonate).

As used herein a modified polymer, such as a modified PEG, refers to water-soluble polymers that have been modified or derivatized at either or both terminals, e.g., to include a terminal substituent (e.g., a terminal alkyl, substituted alkyl, alkoxy or substituted alkoxy, etc.) and/or a terminal linking functional group (e.g., an amino or carboxylic acid group suitable for attachment via amide bond formation) suitable for attached of the polymer to the multi-chromophore (e.g., via a branching group). The subject water-soluble polymers can be adapted to include any convenient linking groups.

It is understood that in some cases, the water-soluble polymer can include some dispersity with respect to polymer length, depending on the method of preparation and/or purification of the polymeric starting materials. In some instances, the subject water-soluble polymers are monodisperse. In some instances, the subject water-soluble polymers are substantially monodisperse, e.g., include 20 wt % or less of non-target species, such as 15 wt % or less, 10 wt % or less, 5 wt % or less, 2 wt % or less or 1 wt % or less.

The water-soluble polymer can include one or more spacers or linkers. Examples of spacers or linkers include linear or branched moieties comprising one or more repeat units employed in a water-soluble polymer, diamino and or diacid units, natural or unnatural amino acids or derivatives thereof, as well as aliphatic moieties, including alkyl, aryl, heteroalkyl, heteroaryl, alkoxy, and the like, which can contain, for example, up to 18 carbon atoms or even an additional polymer chain.

The water-soluble group, or one or more of the spacers or linkers of the polymer moiety when present, may include polymer chains or units that are biostable or biodegradable. For example, polymers with repeat linkages have varying degrees of stability under physiological conditions depending on bond lability. Polymers with such bonds can be categorized by their relative rates of hydrolysis under physiological conditions based on known hydrolysis rates of low molecular weight analogs, e.g., from less stable to more stable, e.g., polyurethanes (—NH—C(O)—O—)>polyorthoesters (—O—C((OR)(R'))—O—)>polyamides (—C(O)—NH—). Similarly, the linkage systems attaching a water-soluble polymer to a target molecule may be biostable or biodegradable, e.g., from less stable to more stable: carbonate (—O—C(O)—O—)>ester (—C(O)—O—)>urethane (—NH—C(O)—O—)>orthoester (—O—C((OR)(R'))—O—)>amide (—C(O)—NH—). In general, it may be desirable to avoid use of a sulfated polysaccharide, depending on the lability of the sulfate group. In addition, it may be less desirable to use polycarbonates and polyesters. These bonds are provided by way of example, and are not intended to limit the types of bonds employable in the polymer chains or linkage systems of the water-soluble polymers useful in the modified aldehyde tagged polypeptides disclosed herein.

The water-soluble group can comprise a poly(alkylene oxide) group, e.g., a poly(ethylene glycol) group. In some embodiments the poly(ethylene glycol) group can comprise from 2 to 60 ethylene glycol groups, such as 2 to 40 or 6 to 60. In some embodiments the water-soluble group can be linear, e.g., a water-soluble group with the structure:

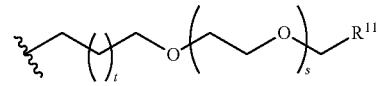

wherein:
s is 2-60 (e.g., 2 to 40 or 6 to 60);
t is 0-10 (e.g., 0-6 such as 0, 1, 2, or 3);
R$^{11}$ is H, alkyl (e.g., methyl), or substituted alkyl.

In some cases the water-soluble group comprises (CH$_2$)$_x$(OCH$_2$CH$_2$)$_y$OCH$_3$ where each x is independently an integer from 0-20, each y is independently an integer from 0 to 50; and a benzyl optionally substituted with one or more halogen, hydroxyl, C$_1$-C$_{12}$ alkoxy, or (OCH$_2$CH$_2$)$_z$OCH$_3$ where each z is independently an integer from 0 to 50. In some instances, the substituent is (CH$_2$)$_3$(OCH$_2$CH$_2$)$_{11}$OCH$_3$. In some embodiments, one or more of the substituents is a benzyl substituted with at least one WSG groups (e.g., one or two WSG groups) selected from (CH$_2$)$_x$(OCH$_2$CH$_2$)$_y$OCH$_3$ where each x is independently an integer from 0-20 and each y is independently an integer from 0 to 50.

The water-soluble group can be a branched non-ionic water-soluble group (WSG) comprises a branching group that is linked to the co-monomer to which it is attached and provides further linkages to two, three or more non-ionic water-soluble polymers. In some instances, the two or more water-soluble polymers that are utilized in the WSG are polyethylene glycol (PEG) groups or modified PEG groups. Any convenient branching groups can be utilized that provide for 3 or more points of attachment (e.g., 4 or more), such as one point of attachment to the co-monomer of the conjugated polymer backbone and two or more attachments (e.g., 2, 3, 4 or more) to non-ionic water-soluble polymers. The branching group can be attached to the co-monomer and the non-ionic water-soluble polymers via optional linkers utilizing any convenient linking functional groups and linking chemistries. In certain instances, the branching group is non-aromatic. In certain instances, the branching group is cyclic. In some cases, the branching group is a substituted aryl or heteroaryl ring, e.g., a trisubstituted or tetrasubstituted aryl ring, such as a trisubstituted or tetrasubstituted phenyl ring, or a trisubstituted or tetrasubstituted heteroaryl ring, such as a trisubstituted or tetrasubstituted pyridyl ring. In certain instances, the branching group is acyclic. In some instances, the branching group is an atom, e.g., C, Si, N. In certain instances, the branching group is a linking functional group such as an amido or a sulfonamide group. In certain instances, the branching group is an amino acid residue or a branched linker, such as a glycerol or an amino-glycerol.

Exemplary branched water-soluble groups are described in U.S. Pat. No. 10,533,092, which is incorporated herein by reference.

In some instances, the branched non-ionic WSG is independently selected from: —Y$^1$—(CH$_2$CH$_2$O)$_r$—R'; —Y$^1$—O—CH[(CH$_2$)$_q$—O—(CH$_2$CH$_2$O)$_r$—R']$_2$; and —Y$^1$—CH$_2$-Ph(Y$^1$—(CH$_2$CH$_2$O)$_r$—R')$_s$; wherein Y$^1$ is selected from a covalent bond, —O—, —CONH—, —NHCO—, NHSO$_2$—, —SO$_2$—NH—, —CONR—, —NRCO—, NRSO$_2$—, —SO$_2$—NR— (e.g., where R is alkyl or substituted alkyl), —(CH$_2$)$_q$—SO$_2$—NH—, —(CH$_2$)$_q$—CONH— and —(CH$_2$)$_q$—O—, q and r are each independently an integer from 1 to 50, s is 1, 2 or 3 and each R' is independently H, alkyl (e.g., methyl) or substituted alkyl.

In some instances, the branched non-ionic WSG has one of the following formulae:

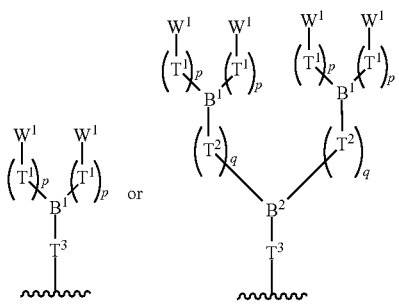

wherein:
each B$^1$ and B$^2$ are independently a branching group;
each W$^1$ is independently a non-ionic water-soluble polymer, e.g., comprising 6 or more monomeric units;
T$^3$ is an optional linker to the fused 6-5-6 tricyclic co-monomer; and
each p and q are independently 0 or 1, wherein if present, each T$^1$ and each T$^2$ are independently a linker. In certain instances, each W$^1$ is independently a PEG or modified PEG polymer. In certain instances, each W$^1$ is independently selected from a substituted alkyl, a PEG or modified PEG group and a WSG. In certain instances, each W$^1$ is independently a PEG or modified PEG polymer of 6-30 monomeric units, such as 6-24 or 10-30, 10-24 or 10-20, 12-24, 12-20, 12-16 or 16-20 monomeric units.

In some instances, the branched non-ionic WSG has the following formula:

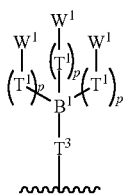

wherein:
each B$^1$ is a branching group;
each W$^1$ is independently a non-ionic water-soluble polymer, e.g., comprising 6 or more monomeric units;
T$^3$ is an optional linker to the fused 6-5-6 tricyclic co-monomer; and
each p is independently 0 or 1, wherein if present, each T$^1$ is independently a linker. In certain instances, each W$^1$ is independently a PEG or modified PEG polymer. In certain instances, each W$^1$ is independently selected from a substituted alkyl, a PEG or modified PEG group and a WSG. In certain instances, each W$^1$ is independently a PEG or modified PEG polymer of 6-30 monomeric units, such as 6-24 or 10-30, 10-24 or 10-20, 12-24, 12-20, 12-16 or 16-20 monomeric units. In some embodiments of the branched non-ionic WSG, B$^1$ is a tetra-substituted aryl group (e.g., a 1,3,4,5-phenyl).

In some embodiments of the branched non-ionic WSG (e.g., as depicted in the formulae above), B$^1$ is selected from CH, N, C(=O)N, SO$_2$N, a tri-substituted aryl group (e.g., a 1,3,5-phenyl), a tetra-substituted aryl group, and a tri-substituted heteroaryl group. In some embodiments of the branched non-ionic WSG, each p is 0. In some embodiments of the branched non-ionic WSG, p is 1, and each T$^1$ is selected from —(CH$_2$)$_n$—O—, —O—(CH$_2$)$_n$—, —(CH$_2$)$_n$— and —O—, wherein n is from 1 to 12, e.g., 1 to 6. In some embodiments of the branched non-ionic WSG, each T$^2$ and/or T$^3$ is independently a C1-C12-alkyl linker, e.g., a C1-C6-alkyl linker, wherein one or more backbone atoms are optionally substituted with a heteroatom.

In some embodiments, the branched non-ionic WSG is selected from one of the following structures:

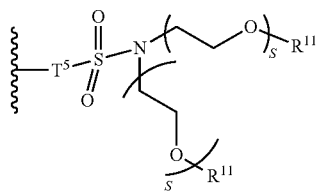

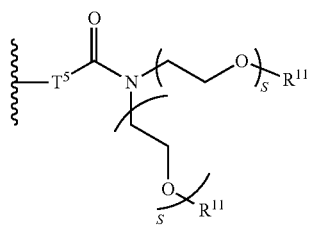

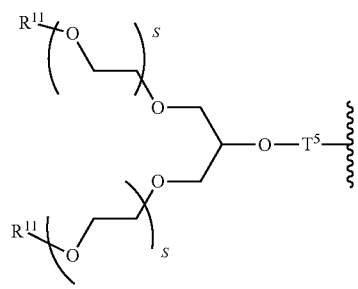

-continued

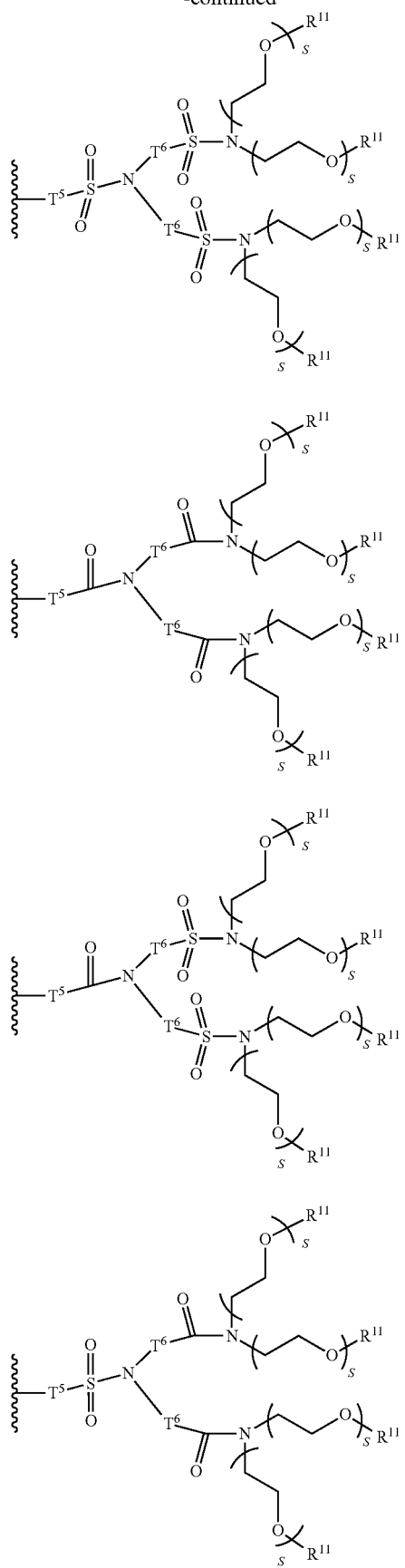

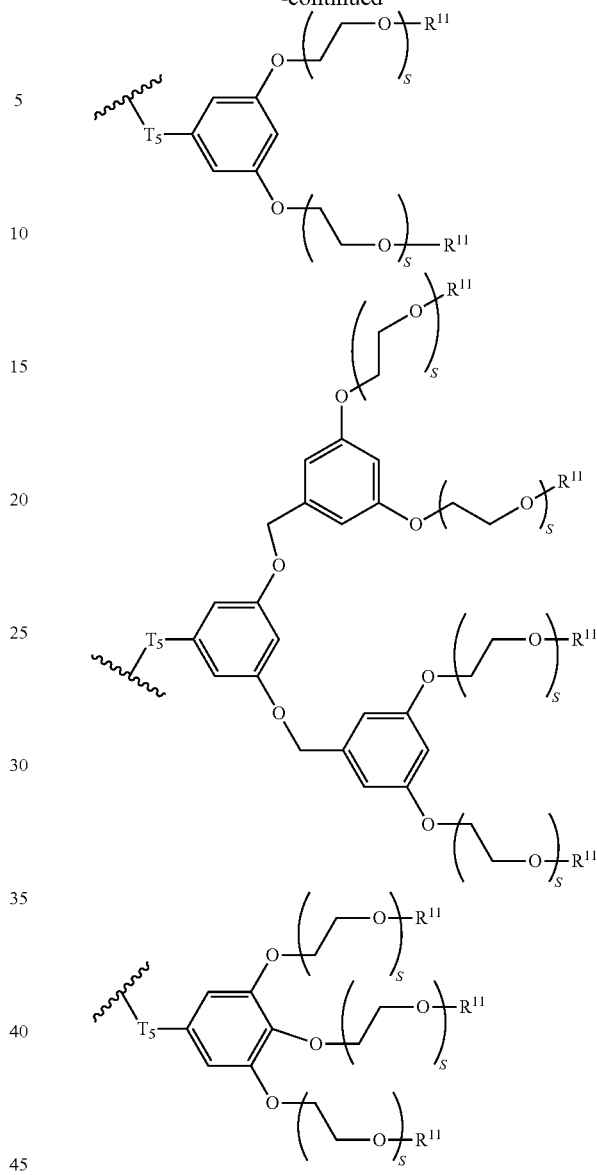

wherein:
T⁵ is an optional linker to the co-monomer (e.g., the fused 6-5-6 tricyclic co-monomer);
T⁶ is a linker;
each s is independently an integer from 6 to 100 (e.g., 6 to 50); and
each R¹¹ is independently hydrogen, an alkyl or a substituted alkyl.

In certain instances, each s is independently 6 to 30, such as 6 to 24, 6 to 20, 11 to 20, 12 to 20, 12 to 18 or 12 to 16. In certain instances, each s is independently 6 to 30, such as 6 to 24, 8 to 24, 10 to 24, 12 to 24, 13 to 24, 14 to 24, 15 to 22 or 16 to 20. In some cases, each s is independently 11, 12, 13, 14, 15, 16, 17, 18, 19, 20, 21, 22, 23 or 24. In some embodiments, each s is independently 7 or more, such as 8, 9 or more, 10 or more, 11 or more, 12 or more, 13 or more, 14 or more, 15 or more, or even more, and in some cases, have up to 50 monomeric units, such as up to 40, up to 30 or up to 24 monomeric units. In some instances, each s is independently 6-30 monomeric units, such as 6-24 or 10-30, 10-24 or 10-20, 12-24, 12-20, 12-16 or 16-20 monomeric units. In some cases, each s is the same. In some embodiments of the branched non-ionic WSG, $T^5$ and/or $T^6$ is a C1-C12-alkyl linker, e.g., a C1-C6-alkyl linker, wherein one or more backbone atoms are optionally substituted with a heteroatom (e.g., an —O—). In some embodiments of the branched non-ionic WSG, each $R^{11}$ is H. In some embodiments of the branched non-ionic WSG, each $R^{11}$ is methyl.

As described above, $R^3$ is selected from the group consisting of hydrogen, alkyl, substituted alkyl, alkoxy, substituted alkoxy, aryl, substituted aryl, heteroaryl, substituted heteroaryl, halo, cyano, and hydroxyl. In some instances $R^3$ does not comprise a poly(alkylene oxide) group, e.g., a poly(ethylene glycol) group. In some instances $R^3$ is not a water-soluble group, i.e., $R^3$ does not impart improved water solubility upon the molecules to which it is attached. In some cases $R^3$ is a non-ionic group, e.g., a hydrogen atom.

In embodiments wherein $R^3$ is a hydrogen atom, $M^2R^3$ is an aryl or heteroaryl group that is not substituted, e.g., $M^2R^3$ can have a structure selected from the group consisting of:

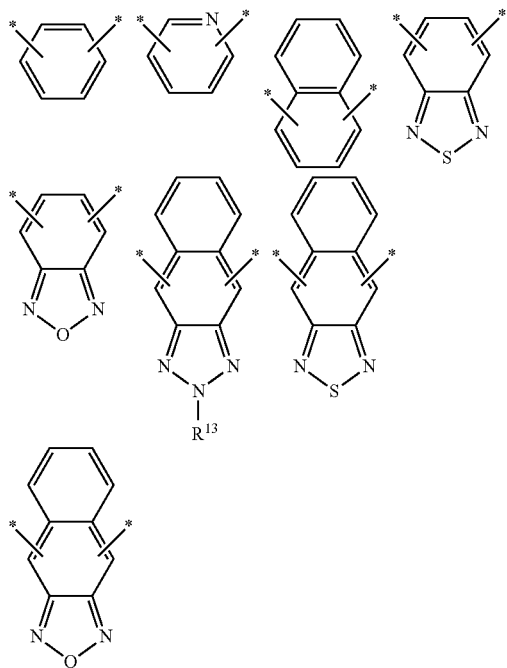

wherein:
each * indicates a location for attachment to an $M^1$ group; and
$R^{13}$ is hydrogen, alkyl, or substituted alkyl.

In some cases, $M^2R^3$ has a structure selected from the group consisting of:

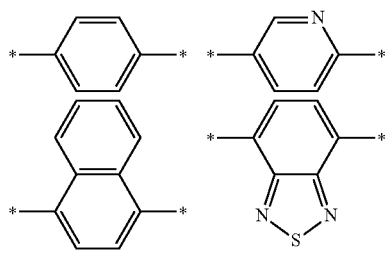

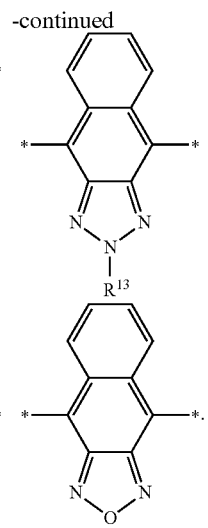

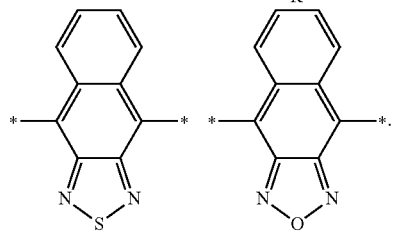

In some cases the water-soluble light harvesting multi-chromophore comprises a conjugated segment of formula (II):

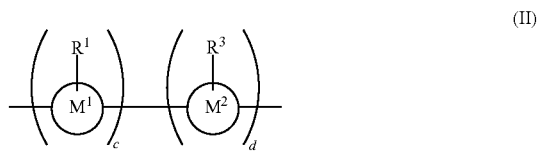

wherein:
$M^1$ and $M^2$ are each independently an aryl or heteroaryl co-monomer;
$R^1$ is a water-soluble group;
$R^3$ is selected from the group consisting of hydrogen, alkyl, substituted alkyl, alkoxy, substituted alkoxy, aryl, substituted aryl, heteroaryl, substituted heteroaryl, halo, cyano, and hydroxyl; and
c and d define the mol % of each unit within the conjugated segment, wherein c is greater than or equal to d.

The ratio between c and d in formula (II) also describe the molar ratio between co-monomer $M^1$ and co-monomer $M^2$. For example, c can range from 0.51 to 0.99 and d can range from 0.49 to 0.01, e.g., c can range from 0.60 to 0.95 and d can range from 0.40 to 0.05, and c can range from 0.75 to 0.90 and d can range from 0.25 to 0.10. For instance, in cases wherein c is 0.75 and d is 0.25 the molar ratio between $M^1$ and $M^2$ is 3:1.

In some embodiments, the multi-chromophore includes a plurality of first optically active units forming a conjugated system, having an absorption wavelength (e.g., as described herein) at which the first optically active units absorb light to form an excited state. In certain instances, the multi-chromophore includes a conjugated polymer segment or an oligomeric structure including bandgap-lowering n-conjugated repeating units.

The subject multi-chromophore may have one or more desirable spectroscopic properties, such as a particular absorption maximum wavelength, a particular emission maximum wavelength, extinction coefficient, quantum yield, and the like. The subject polymeric dyes and polymeric tandem dyes provide for a variety of absorption and emission profiles which depend on a variety of factors such as the selected co-monomers, linking groups, substituents and optional linked signaling chromophores of which the polymers are composed. In some cases, the polymeric dye absorption maximum wavelength in the range of 300 to 600 nm, such as 350 nm to 560 nm or 400 nm to 560 nm. In certain embodiments, the multi-chromophore has an absorption maximum wavelength of 600 nm or less, such as 575 nm or less, 550 nm or less, 525 nm or less, 500 nm or less, 475 nm or less, 450 nm or less, 440 nm or less, 430 nm or less, 420 nm or less, 410 nm or less, 400 nm or less, or even less. In certain embodiments, the multi-chromophore absorbs only UV light. In some cases the multi-chromophore has an absorption maximum wavelength ranging from 250 nm to 500 nm, such as from 300 nm to 475 nm or from 350 nm to 450 nm. In certain instances, the multi-chromophore has an absorption maximum wavelength in the range of 300 nm to 400 nm. In certain instances, the multi-chromophore has an absorption maximum wavelength in the range of 300 nm to 350 nm. In certain instances, the multi-chromophore has an absorption maximum wavelength in the range of 350 nm to 400 nm. In certain instances, the multi-chromophore has an absorption maximum wavelength in the range of 400 nm to 600 nm, such as 400 nm to 560 nm. In certain instances, the multi-chromophore has an absorption maximum wavelength in the range of 400 nm to 450 nm. In certain instances, the multi-chromophore has an absorption maximum wavelength in the range of 450 nm to 500 nm.

In some cases, the multi-chromophore has an absorption maximum wavelength ranging from 360 nm to 440 nm, such as from 375 nm to 430 nm, from 390 nm to 420 nm, or from 400 nm to 410 nm. In some embodiments the multi-chromophore has an absorption maximum wavelength ranging from 390 nm to 450 nm, such as from 405 nm to 435 nm, or from 415 nm to 425 nm. In some cases the multi-chromophore has an emission maximum wavelength ranging from 390 nm to 450 nm, such as from 400 nm to 440 nm or from 415 nm to 425 nm. In some cases the multi-chromophore has an emission maximum wavelength ranging from 475 nm to 545 nm, such as from 490 nm to 530 nm, from 500 nm to 520 nm, or from 505 nm to 515 nm. In some embodiments, such as wherein the composition is a polymeric tandem dye having an acceptor chromophore, the emission maximum wavelength ranges from 620 nm to 680 nm, such as from 630 nm to 670 nm or from 640 nm to 660 nm. In some embodiments, such as wherein the composition is a polymeric tandem dye having an acceptor chromophore, the emission maximum wavelength ranges from 680 nm to 740 nm, such as from 690 nm to 730 nm or from 705 nm to 715 nm. In some embodiments, such as wherein the composition is a polymeric tandem dye having an acceptor chromophore, the emission maximum wavelength ranges from 750 nm to 820 nm, such as from 765 nm to 805 nm, or from 775 nm to 795 nm, or from 780 nm to 790 nm. In some cases these maximum wavelengths pertain to compositions dissolved in water and measured at 20° C.

In some embodiments, the multi-chromophore has an emission maximum wavelength in the range of 300 to 900 nm, such as 350 to 850 nm, 350 to 600 nm, 360 to 500 nm, 370 to 500 nm, 380 to 500 nm, 390 to 500 nm or 400 to 500 nm, where specific examples of emission maxima of interest include, but are not limited to: 395 nm±5 nm, 460 nm±5 nm, 490 nm±5 nm, 550 nm±5 nm, 560 nm±5 nm, 605 nm±5 nm, 650 nm±5 nm, 680 nm±5 nm, 700 nm±5 nm, 805 nm±5 nm. In certain instances, the multi-chromophore has an emission maximum wavelength selected from the group consisting of 395 nm, 460 nm, 490 nm, 550 nm, 560 nm, 605 nm, 650 nm, 680 nm, 700 nm and 805 nm. In certain instances, the multi-chromophore has an emission maximum wavelength of 395 nm±5 nm. In some instances, the multi-chromophore itself has an emission maximum wavelength in the range of 375 to 900 nm (such as in the range of 380 nm to 900 nm, 390 nm to 900 nm, or 400 nm to 900 nm). In certain instances, the multi-chromophore has an emission maximum wavelength in the range of 500 nm to 550 nm. In certain instances, the multi-chromophore has an absorption maximum wavelength in the range of 550 nm to 600 nm. In some cases the multi-chromophore has an emission maximum wavelength ranging from 400 nm to 600 nm, such as from 425 nm to 575 nm or from 450 nm to 550 nm.

In some instances, the multi-chromophore has an extinction coefficient of $5 \times 10^5$ $cm^{-1}M^{-1}$ or more, such as $6 \times 10^5$ $cm^{-1}M^{-1}$ or more, $7 \times 10^5$ $cm^{-1}M^{-1}$ or more, $8 \times 10^5$ $cm^{-1}M^{-1}$ or more, $9 \times 10^5$ $cm^{-1}M^{-1}$ or more, such as $1 \times 10^6$ $cm^{-1}M^{-1}$ or more, $1.5 \times 10^6$ $cm^{-1}M^{-1}$ or more, $2 \times 10^6$ $cm^{-1}M^{-1}$ or more, $2.5 \times 10^6$ $cm^{-1}M^{-1}$ or more, $3 \times 10^6$ $cm^{-1}M^{-1}$ or more, $4 \times 10^6$ $cm^{-1}M^{-1}$ or more, $5 \times 10^6$ $cm^{-1}M^{-1}$ or more, $6 \times 10^6$ $cm^{-1}M^{-1}$ or more, $7 \times 10^6$ $cm^{-1}M^{-1}$ or more, or $8 \times 10^6$ $cm^{-1}M^{-1}$ or more. In such cases, the multi-chromophore may have 5 or more repeating units, such as 6 or more, 7 or more, 8 or more, 9 or more, 10 or more, or even more repeating units. In some embodiments, the multi-chromophore has a molar extinction coefficient of $5 \times 10^5$ $M^{-1}cm^{-1}$ or more. In certain embodiments, the multi-chromophore has a molar extinction coefficient of $1 \times 10^6$ $M^{-1}cm^{-1}$ or more.

In some instances, the multi-chromophore has an extinction coefficient of 40,000 $cm^{-1}M^{-1}$ per repeating unit or more, such as 45,000 $cm^{-1}M^{-1}$ per repeating unit or more, 50,000 $cm^{-1}M^{-1}$ per repeating unit or more, 55,000 $cm^{-1}M^{-1}$ per repeating unit or more, 60,000 $cm^{-1}M^{-1}$ per repeating unit or more, 70,000 $cm^{-1}M^{-1}$ per repeating unit or more, 80,000 $cm^{-1}M^{-1}$ per repeating unit or more, 90,000 $cm^{-1}M^{-1}$ per repeating unit or more, 100,000 $cm^{-1}M^{-1}$ per repeating unit or more, or even more. In some instances, the 40,000 $cm^{-1}M^{-1}$ per repeating unit or more described herein is an average extinction coefficient. In certain instances, the repeat unit of the multi-chromophore may include a single monomer, two co-monomers, or three or more co-monomers. In some instances, the multi-chromophore has an extinction coefficient of 40,000 $cm^{-1}M^{-1}$ per co-monomer or more, such as 45,000 $cm^{-1}M^{-1}$ per co-monomer or more, 50,000 $cm^{-1}M^{-1}$ per co-monomer or more, 55,000 $cm^{-1}M^{-1}$ per co-monomer or more, 60,000 $cm^{-1}M^{-1}$ per co-monomer or more, 70,000 $cm^{-1}M^{-1}$ per co-monomer or more, 80,000 $cm^{-1}M^{-1}$ per co-monomer or more, 90,000 $cm^{-1}M^{-1}$ per co-monomer or more, 100,000 $cm^{-1}M^{-1}$ per co-monomer or more, or even more. In some instances, the 40,000 $cm^{-1}M^{-1}$ per co-monomer or more is an average extinction coefficient.

In some cases the conjugated segment of formula (I) or (II) has an absorption spectra that is similar to the absorption spectra of a conjugated segment of $M^1$ groups, e.g., $M^1$-$M^1$-$M^1$-$M^1$ and $M^1$-$M^1$-$M^1$-$M^1$-$M^1$-$M^1$. For example, the difference in absorption maximum wavelengths of the conjugated segment of formula (I) or (II) and the conjugated segment of $M^1$ groups is 50 nm or less, such as 25 nm or less, 20 nm or less, 15 nm or less, 10 nm or less, or 5 nm or less. Contacting the multi-chromophore with light can lead to absorption of such light by one or more $M^1$ groups.

Excitation of a multi-chromophore described herein leads to emission of light from the multi-chromophore. For instance, the multi-chromophore can be excited by absorbing light. For instance, the absorption maximum wavelength of poly(fluorene) is about 400 nm, and including fluorene as the co-monomer $M^1$ can provide a multi-chromophore with an absorbance maximum around 400 nm. Excitation of the multi-chromophore leads to emission of light from $M^2$. In other words, the identity of the $M^2$ group affects the emission spectra of the conjugated segment, e.g., the emission maximum wavelength. In some embodiments, the emission spectra of a conjugated segment of a multi-chromophore of formula (I) or (II) can be similar to the emission spectra of a conjugated segment of $M^1$-$M^2$ units, e.g., a conjugated segment of formula $M^1$-$M^2$-$M^1$-$M^2$ or $M^1$-$M^2$-$M^1$-$M^2$-$M^1$-$M^2$. For example, the difference in emission maximum wavelengths of the conjugated segment of formula (I) or (II) and the conjugated segment of $M^1$-$M^2$ units is 50 nm or less, such as 25 nm or less, 20 nm or less, 15 nm or less, 10 nm or less, or 5 nm or less. In some cases the $M^2$ co-monomer is quinoxaline and the emission maximum is about 510 nm.

As used herein, the terms "light harvesting multi-chromophore", "multi-chromophore", "polymeric dye" and "conjugated polymer" are used interchangeably and refer to a conjugated polymer which has a structure capable of harvesting light with a particular absorption maximum wavelength and converting it to emitted light at a longer emission maximum wavelength. In some cases, the light harvesting multi-chromophore is itself fluorescent. Conjugated polymers (CPs) are characterized by a delocalized electronic structure and may have an effective conjugation length that is substantially shorter than the length of the polymer chain, because the backbone may contain a large number of conjugated segments in close proximity. In some cases, conjugated polymers are efficient for light harvesting and provide for optical amplification via Forster energy transfer to an acceptor.

As used herein the term "unit" refers to a structural subunit of a polymer. The term unit is meant to include monomers, co-monomers, co-blocks, conjugated segments, repeating units, and the like. A "repeating unit" is a subunit of a polymer that is defined by the minimum number of distinct structural features that are required for the unit to be considered monomeric, such that when the unit is repeated n times, the resulting structure describes the polymer or a block thereof. In some cases, the polymer may include two or more different repeating units, e.g., when the polymer is a multiblock polymer or a random arrangement of units, each block may define a distinct repeating unit, e.g., an n-block and a m-block. It is understood that a variety of arrangements of n and/or m repeating units or blocks are possible and that in the depicted formula of the subject multi-chromophores described herein any convenient linear arrangements of n and m co-blocks of various lengths are included within the structure of the overall polymer. It is understood that the polymer may also be represented by a formula in terms of mol % values of each unit in the polymer and that such formula may represent a variety of arrangements of repeat unit, such as random or multiblock polymer. In some cases, a repeating unit of the polymer includes a single monomer group. In certain instances, a repeating unit of the polymer includes two or more monomer groups, i.e., co-monomer groups, such as two, three, four or more co-monomer groups. As used herein, the term "co-monomer" or "co-monomer group" refers to a structural unit of a polymer that may itself be part of a repeating unit of the polymer. In some embodiments, the conjugated polymer includes a block copolymer that is composed of blocks of polymerized monomers. In such cases, the block copolymer may be described as having distinct repeating units each corresponding to a distinct co-block of the polymer. In some cases, the polymer is a diblock copolymer that contains two different co-blocks. In such cases, the polymer may be described as including co-blocks, where each co-block may be composed of co-monomers, such as one, two, three or more co-monomers The multi-chromophore may have any convenient length. In some cases, the particular number of monomeric repeating units or segments of the multi-chromophore may fall within the range of 2 to 500,000, such as 2 to 100,000, 2 to 30,000, 2 to 10,000, 2 to 3,000 or 2 to 1,000 units or segments, or such as 5 to 100,000, 10 to 100,000, 100 to 100,000, 200 to 100,000, or 500 to 50,000 units or segments. In some instances, the particular number of monomeric repeating units or segments of the multi-chromophore may fall within the range of 2 to 1,000, such as 2 to 500, 2 to 100, 3 to 100, 4 to 100, 5 to 100, 6 to 100, 7 to 100, 8 to 100, 9 to 100 or 10 to 100 units or segments. The multi-chromophore can comprise 3 or more $M^1$ groups, 10 or more, 50 or more, 100 or more, 1,000 or more, 10,000 or more, or 100,000 or more. The multi-chromophore can comprise 3 to 100,000 $M^1$ groups, such as from 10 to 100,000, from 100 to 100,000, or from 1,000 to 100,000.

The multi-chromophore may be of any convenient molecular weight (MW). In some cases, the MW of the multi-chromophore may be expressed as an average molecular weight. In some instances, the polymeric dye has an average molecular weight in the range of 500 to 500,000, such as from 1,000 to 100,000, from 2,000 to 100,000, from 10,000 to 100,000 or even an average molecular weight in the range of 50,000 to 100,000.

In some embodiments, the multi-chromophore includes a particular aryl or heteroaryl co-monomer that constitutes 5% or more by molarity (e.g., 5 mol %) of the multi-chromophore, such as 10% or more, 15% or more, 20% or more, 25% or more, 30% or more, 40% or more, 45% or more, 50% or more, 60% or more, 70% or more, or even more by molarity of the multi-chromophore. In such cases, the multi-chromophore may include 5 or more repeating units, such as 10 or more, 20 or more, 30 or more, 40 or more, 50 or more, 60 or more, 70 or more, 80 or more, 90 or more, 100 or more, 200 or more, 500 or more, 1000 or more, 10,000 or more, or even more repeating units. In such cases, the multi-chromophore may include 5 or more co-monomer units, such as 10 or more, 20 or more, 30 or more, 40 or more, 50 or more, 60 or more, 70 or more, 80 or more, 90 or more, 100 or more, 200 or more, 500 or more, 1000 or more, 10,000 or more, or even more co-monomer units. In certain embodiments, the aryl or heteroaryl co-monomer of interest constitutes 25% or more by molarity of the multi-chromophore, such as 30% or more, 40% or more, 45% or more, 50% or more, or even more by molarity of the multi-chromophore, which includes 5 or more repeating units, such as 10 or more, 20 or more, 30 or more, 40 or more, 50 or more, 60 or more, 70 or more, 80 or more, 90 or more, 100 or more repeating units.

It is understood that in some cases the subject multi-chromophores may include co-blocks (e.g., n and m co-blocks) or a random arrangement of n and m repeating units. The subject multi-chromophores may include any convenient linear arrangements of n and m co-blocks of various lengths within the structure of the overall polymer. In some cases, the linear arrangements of co-monomers depicted in the structures herein are random. In addition, the multi-chromophores may include any convenient arrangements of co-monomers within such n and/or m co-blocks. Unless indicated to the contrary, all possible arrangements of co-monomers are meant to be included in the polymeric dyes described herein. A variety of polymer synthesis methods may be utilized to prepare co-monomers and co-blocks of interest in the preparation of the subject multi-chromophores. It is understood that in some cases, the polymerization methods may produce a composition including a population of conjugated polymers that includes some variation with respect to the particular length and/or terminal groups (i.e., end groups) present in each conjugated polymer of the population. The formulae depicted herein may refer to a single compound or to a population or sub-population of polymeric compounds. As used herein, * denotes a site for covalent attachment to the unsaturated backbone of a conjugated polymer. It is understood that the formulae depicted herein of the subject polymers is one representation of the structure and that other representations, such as a representation indicating mol % ratios of particular co-monomers in the conjugated polymer segment may also be used.

Polymeric Tandem Dyes

Also provided are polymeric tandem dyes that include a multi-chromophore, e.g., a multi-chromophore comprising a conjugated segment of formula (I) or (II), and an acceptor signaling chromophore covalently linked to the multi-chromophore. The donor multi-chromophores are capable of transferring energy to the acceptor signaling chromophore which is in energy-receiving proximity to the multi-chromophore. As such, excitation of the multi-chromophore donor leads to energy transfer to and emission from the covalently attached acceptor signaling chromophore. The number of signaling chromophore acceptor units that are linked to the donor water solvated light harvesting multi-chromophore may vary, where in some instances the number ranges from 1 mol % to 50 mol %, such as from 5 mol % to 25 mol % or from 10 mol % to 25 mol %.

Mechanisms for energy transfer from the fluorescent water solvated light harvesting multi-chromophore donor to the linked acceptor signaling chromophore include, for example, resonant energy transfer (e.g., Förster (or fluorescence) resonance energy transfer, FRET), quantum charge exchange (Dexter energy transfer) and the like. In some instances, these energy transfer mechanisms are relatively short range; that is, close proximity of the light harvesting multi-chromophore system to the acceptor provides for efficient energy transfer. In some instances, under conditions for efficient energy transfer, amplification of the emission from the acceptor occurs where the emission from the luminescent signaling chromophore is more intense when the incident light (the "pump light") is at a wavelength which is absorbed by the light harvesting multi-chromophore than when the luminescent signaling chromophore is directly excited by the pump light.

An additional mechanism for energy transfer from the multi-chromophore to the acceptor signaling chromophore is emission of light from the multi-chromophore. Stated in another manner, excitation of the multi-chromophore can lead to emission of light from the multi-chromophore, followed by absorption of such light by the acceptor signaling chromophore.

The number of signaling chromophore acceptor units that are linked to the donor water solvated light harvesting multi-chromophore may vary, where in some instances the number ranges from 1 mol % to 50 mol %, such as from 5 mol % to 25 mol % or from 10 mol % to 25 mol %.

By "efficient" energy transfer is meant 10% or more, such as 20% or more or 30% or more, of the energy harvested by the donor is transferred to the acceptor. By "amplification" is meant that the signal from the signaling chromophore is 1.5× or greater when excited by energy transfer from the donor light harvesting multi-chromophore as compared to direct excitation with incident light of an equivalent intensity. The signal may be measured using any convenient method. In some cases, the 1.5× or greater signal refers to an intensity of emitted light. In certain cases, the 1.5× or greater signal refers to an increased signal to noise ratio. In certain embodiments, embodiments of the polymeric tandem dye, the signaling chromophore emission is 1.5 fold greater or more when excited by the multi-chromophore as compared to direct excitation of the signaling chromophore with incident light, such as 2-fold or greater, 3-fold or greater, 4-fold or greater, 5-fold or greater, 6-fold or greater, 8-fold or greater, 10-fold or greater, 20-fold or greater, 50-fold or greater, 100-fold or greater, or even greater as compared to direct excitation of the signaling chromophore with incident light.

The linked luminescent signaling chromophore emission of the polymeric tandem dye can have a quantum yield of 0.03 or more, such as a quantum yield of 0.04 or more, 0.05 or more, 0.06 or more, 0.07 or more, 0.08 or more, 0.09 or more, 0.1 or more, 0.15 or more, 0.2 or more, 0.3 or more or even more. In some instances, the polymeric tandem dye has an extinction coefficient of $5 \times 10^5$ $cm^{-1}M^{-1}$ or more, such as $6 \times 10^5$ $cm^{-1}M^{-1}$ or more, $7 \times 10^5$ $cm^{-1}M^{-1}$ or more, $8 \times 10^5$ $cm^{-1}M^{-1}$ or more, $9 \times 10^5$ $cm^{-1}M^{-1}$ or more, such as $1 \times 10^6$ $cm^{-1}M^{-1}$ or more, $1.5 \times 10^6$ $cm^{-1}M^{-1}$ or more, $2 \times 10^6$ $cm^{-1}M^{-1}$ or more, $2.5 \times 10^6$ $cm^{-1}M^{-1}$ or more, $3 \times 10^6$ $cm^{-1}M^{-1}$ or more, $4 \times 10^6$ $cm^{-1}M^{-1}$ or more, $5 \times 10^6$ $cm^{-1}M^{-1}$ or more, $6 \times 10^6$ $cm^{-1}M^{-1}$ or more, $7 \times 10^6$ $cm^{-1}M^{-1}$ or more, or $8 \times 10^6$ $cm^{-1}M^{-1}$ or more. In some embodiments, the polymeric tandem dye has a molar extinction coefficient of $5 \times 10^5$ $M^{-1}cm^{-1}$ or more. In certain embodiments, the polymeric tandem dye has a molar extinction coefficient of $1 \times 10^6$ $M^{-1}cm^{-1}$ or more.

The subject polymeric tandem dyes provide for fluorescence emissions from luminescent signaling chromophore dyes that are brighter than the emissions which are possible from such luminescent dyes in isolation. The linked luminescent signaling chromophore emission of the polymeric tandem dye can have a brightness of 50 $mM^{-1}cm^{-1}$ or more, such as 60 $mM^{-1}cm^{-1}$ or more, 70 $mM^{-1}cm^{-1}$ or more, 80 $mM^{-1}cm^{-1}$ or more, 90 $mM^{-1}cm^{-1}$ or more, 100 $mM^{-1}cm^{-1}$ or more, 150 $mM^{-1}cm^{-1}$ or more, 200 $mM^{-1}cm^{-1}$ or more, 250 $mM^{-1}cm^{-1}$ or more, 300 $mM^{-1}cm^{-1}$ or more, or even more. In certain instances, the linked signaling chromophore emission of the polymeric tandem dye has a brightness that is at least 5-fold greater than the brightness of a directly excited luminescent dye, such as at least 10-fold greater, at least 20-fold greater, at least 30-fold greater, at least 50-fold greater, at least 100-fold greater, at least 300-fold greater, or even greater than the brightness of a directly excited luminescent dye.

In some cases, the signaling chromophore is a fluorophore. In certain cases, the signaling chromophore is a quencher. Any convenient fluorescent dyes may be utilized in the polymeric tandem dyes as an acceptor chromophore. The terms "fluorescent dye" and "fluorophore" are used interchangeably herein. The signaling chromophore ($Z^1$) can be a dye molecule selected from a rhodamine, a coumarin, a xanthene, a cyanine, a polymethine, a pyrene, a dipyrromethene borondifluoride, a napthalimide, a phycobiliprotein, a peridinum chlorophyll protein, conjugates thereof, and combinations thereof. In certain embodiments, the signaling chromophore ($Z^1$) is a cyanine dye, a xanthene dye, a coumarin dye, a thiazine dye and an acridine dye. In some instances, the signaling chromophore ($Z^1$) is selected from DY 431, DY 485XL, DY 500XL, DY 610, DY 640, DY 654, DY 682, DY 700, DY 701, DY 704, DY 730, DY 731, DY 732, DY 734, DY 752, DY 778, DY 782, DY 800, DY 831, Biotium CF 555, Cy 3.5 and diethylamino coumarin. In some embodiments, the acceptor chromophore is a cyanine dye, a xanthene dye, a coumarin dye, a thiazine dye or an acridine dye. Fluorescent dyes of interest include, but are not limited to, fluorescein, 6-FAM, rhodamine, Texas Red, tetramethylrhodamine, carboxyrhodamine, carboxyrhodamine 6G, carboxyrhodol, carboxyrhodamine 110, Cascade Blue, Cascade Yellow, coumarin, Cy2, Cy3, Cy3.5, Cy5, Cy5.5, Cy-Chrome, phycoerythrin, PerCP (peridinin chlorophyll-a Protein), PerCP-Cy5.5, JOE (6-carboxy-4',5'-dichloro-2',7'-dimethoxyfluorescein), NED, ROX (5-(and-6)-carboxy-X-rhodamine), HEX, Lucifer Yellow, Marina Blue, Oregon Green 488, Oregon Green 500, Oregon Green 514, Alexa Fluor 350, Alexa Fluor 430, Alexa Fluor 488, Alexa Fluor 532, Alexa Fluor 546, Alexa Fluor 568, Alexa Fluor 594, Alexa Fluor 633, Alexa Fluor 647, Alexa Fluor 660, Alexa Fluor 680, Alexa Fluor 700, 7-amino-4-methylcoumarin-3-acetic acid, BODIPY FL, BODIPY FL-Br.sub.2, BODIPY 530/550, BODIPY 558/568, BODIPY 564/570, BODIPY 576/589, BODIPY 581/591, BODIPY 630/650, BODIPY 650/665, BODIPY R6G, BODIPY TMR, BODIPY TR, conjugates thereof, and combinations thereof. Lanthanide chelates of interest include, but are not limited to, europium chelates, terbium chelates and samarium chelates. In some embodiments, the polymeric tandem dye includes a polymeric dye linked to an acceptor fluorophore selected from Cy3, Cy3.5, Cy5, Cy5.5, Cy7, Alexa488, Alexa 647 and Alexa700. In certain embodiments, the polymeric tandem dye includes a polymeric dye linked to an acceptor fluorophore selected from Dyomics dyes (such as DY 431, DY 485XL, DY 500XL, DY 530, DY 610, DY 633, DY 640, DY 651, DY 654, DY 682, DY 700, DY 701, DY 704, DY 730, DY 731, DY 732, DY 734, DY 752, DY 754, DY 778, DY 782, DY 800 or DY 831), Biotium CF 555, Cy 3.5, and diethylamino coumarin.

In some embodiments, the signaling chromophore that is selected has an emission maximum wavelength in the range of 300 to 900 nm, such as 350 to 850 nm, 350 to 600 nm, 360 to 500 nm, 370 to 500 nm, 380 to 500 nm, 390 to 500 nm or 400 to 500 nm, where specific examples of emission maxima of signaling chromophore of interest include, but are not limited to: 395 nm±5 nm, 420 nm±5 nm, 430 nm±5 nm, 440 nm±5 nm, 450 nm±5 nm, 460 nm±5 nm, 470 nm±5 nm, 480 nm±5 nm, 490 nm±5 nm, 500 nm±5 nm, 510 nm±5 nm, 520 nm±5 nm, 530 nm±5 nm, 540 nm±5 nm, 550 nm±5 nm, 560 nm±5 nm, 570 nm±5 nm, 580 nm±5 nm, 590 nm±5 nm, 605 nm±5 nm, 650 nm±5 nm, 680 nm±5 nm, 700 nm±5 nm, 805 nm±5 nm.

Any convenient end groups may be utilized at the terminals of the subject multi-chromophores. As used herein, the terms "end group" and "terminal group" are used interchangeably to refer to the groups located at the terminals of the polymeric structure of the multi-chromophore, e.g., as described herein. The end groups are also referred to herein as $G^1$ and $G^2$ groups. $G^1$ and $G^2$ groups of interest include, but are not limited to a terminal capping group, a t conjugated segment, a linker and a linked specific binding member. In some embodiments, a terminal capping groups is a monovalent group which is conjugated to the backbone of the multi-chromophore after polymerization. In certain instances, the terminal capping group is an aryl, a substituted aryl, a heteroaryl, a substituted heteroaryl, an alkyl or a substituted alkyl. In some cases, the terminal co-monomer is directed linked to a chemoselective tag or linker. In certain cases, the terminal capping group is derived from a monomer used in the method of polymerization, e.g., a terminal group such as a halogen (e.g., Br), a boronic acid or a boronic ester, which is capable of undergoing further conjugation. In some instances, $G^1$ and/or $G^2$ is a t conjugated segment. As used herein, a t conjugated segment refers to any convenient segment of a conjugated polymer to which the multi-chromophore may be conjugated, i.e., allowing delocalization of pi electron across adjacent units. In certain embodiments, $G^1$ and/or $G^2$ is a linker, such as a linker including a functional group suitable for conjugation to a specific binding moiety. It is understood that linkers located at the $G^1$ and/or $G^2$ positions of the multi-chromophore may be selected so as to be orthogonal to any other linkers including chemoselective tags (e.g., as described herein) that may be present at a sidechain of the multi-chromophore. In certain embodiments, an amino functional group or derivative thereof is included at $G^1$ and/or $G^2$ and a carboxylic acid functional group or derivative thereof. In certain embodiments, a carboxylic acid functional group or derivative thereof is included at $G^1$ and/or $G^2$ and an amino functional group or derivative thereof.

In some embodiments of the formulae described herein, at least one of $G^1$ and $G^2$ is -$L^3$-$Z^4$ where $L^3$ is a linker (e.g., as described herein) and $Z^4$ is a specific binding member (e.g., as described herein). In some embodiments of formulae described herein, at least one of $G^1$ and $G^2$ is -$L^3$-$Z^3$ where $L^3$ is a linker (e.g., as described herein) and $Z^3$ is a chemoselective tag (e.g., as described herein). Any convenient chemoselective tag and conjugation chemistries can be adapted for use in the subject multi-chromophores. Chemoselective tags of interest include, but are not limited to, amine, active ester, maleimide, thiol, sulfur(VI) fluoride exchange chemistry (SuFEX), sulfonyl fluoride, Diers Alder cycloaddition click reagents and click chemistry, tetrazine, transcyclooctene, aldehyde, alkoxylamine, alkynes, cyclooctynes, azide, and the like. In some instances, $Z^3$ is selected from the group consisting of carboxylic acid, active ester (e.g., N-hydroxy succinimidyl ester (NHS) or sulfo-NHS), amino, maleimide, iodoacetyl and thiol. In certain embodiments of formulae described herein, at least one of $G^1$ and $G^2$ is described by the following structure:

where Ar is a π-conjugated aryl group, L is a linker and Z is a chemoselective tag or a specific binding member. In some cases, the L-Z group can be connected directed to a terminal co-monomer. In certain embodiments of formulae described herein, at least one of $G^1$ and $G^2$ is described by the following structure:

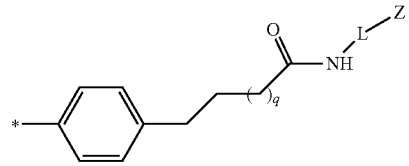

wherein:

q is 0 or an integer from 1-12;

L is an optional linker; and

Z is a chemoselective tag or a specific binding member.

In certain embodiments, Z is a biomolecule. Biomolecules of interest include, but are not limited to, polypeptides, polynucleotides, carbohydrates, fatty acids, steroids, purines, pyrimidines, derivatives, structural analogs thereof and combinations thereof. In certain instances, Z is an antibody. In some instances, Z is an antibody fragment or binding derivative thereof. In some cases, the antibody fragment or binding derivative thereof is selected from the group consisting of a Fab fragment, a F(ab')$_2$ fragment, a scFv, a diabody and a triabody.

It is understood that for any of the structures and formula depicted herein that in some cases of the subject multi-chromophore the end groups depicted may be located at the opposite ends to those shown, e.g., the end groups $G^1$ and -Ph-L-Z may be switched. In some embodiments of the multi-chromophores described herein (e.g., formulae (II) to (VI)), at least one of $G^1$ and $G^2$ is selected from one of the following structures 1-33:

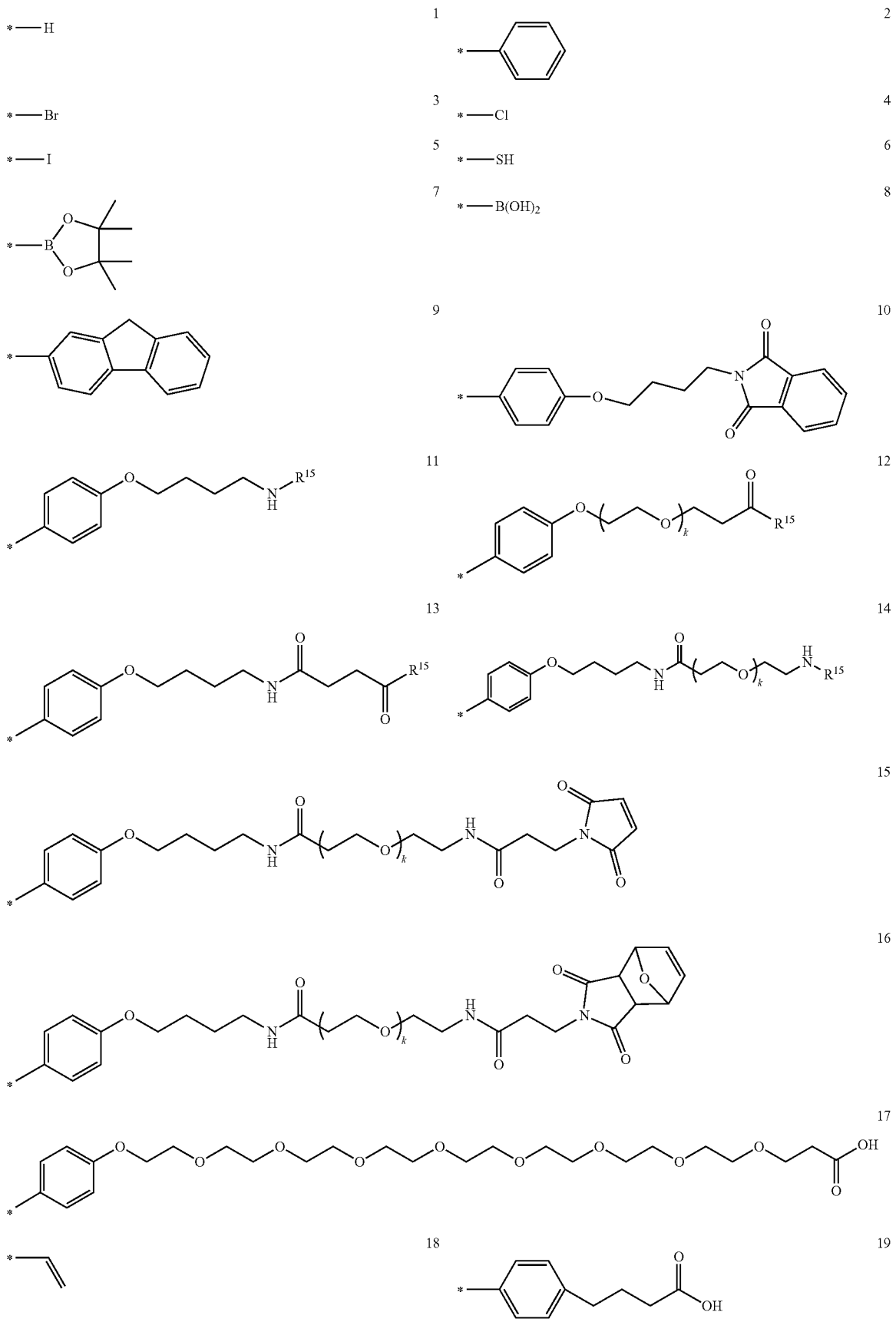

-continued
20
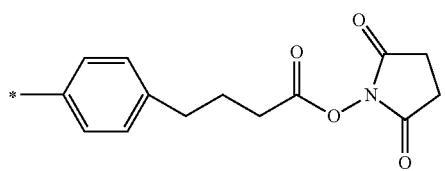
21
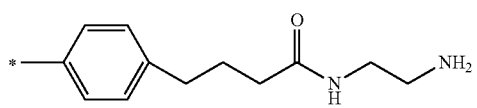
22
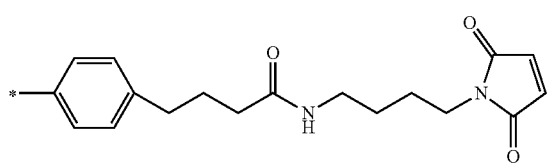
23
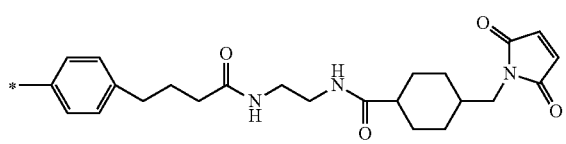
24
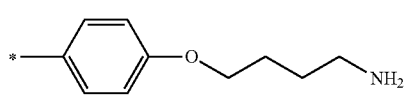
25
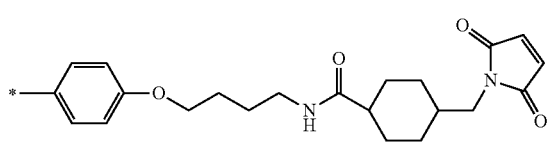
26
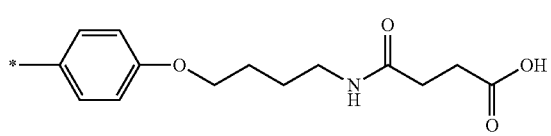
27
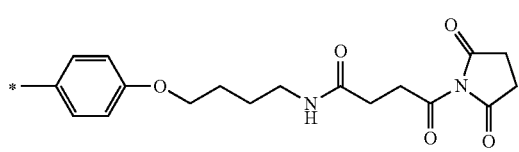
28
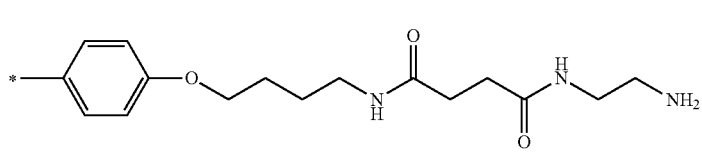
29
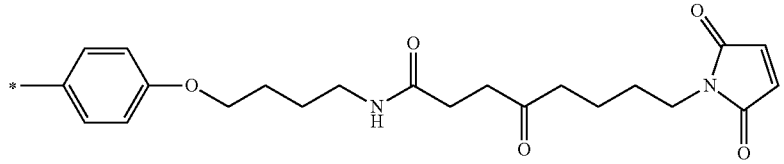
30
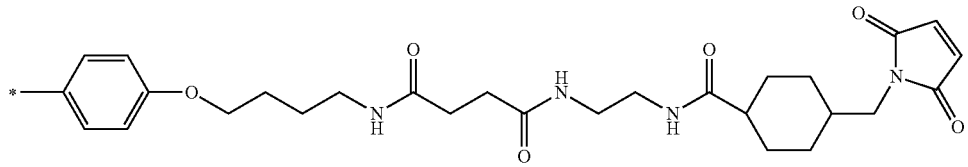
31
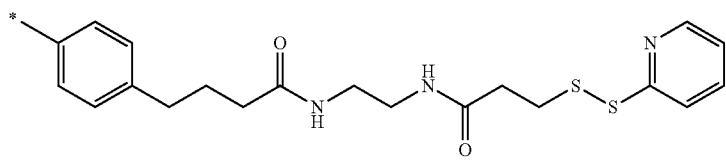
32
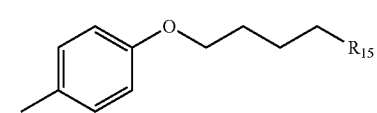
33
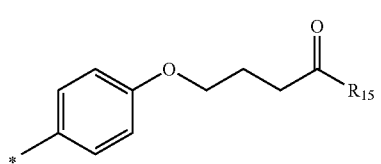

=site for covalent attachment to unsaturated backbone;
wherein R' is independently H, halogen, $C_1$-$C_{12}$ alkyl, ($C_1$-$C_{12}$ alkyl)$NH_2$, $C_2$-$C_{12}$ alkene, $C_2$-$C_{12}$ alkyne, $C_3$-$C_{12}$cycloalkyl, $C_1$-$C_{12}$ haloalkyl, $C_2$-$C_{18}$(hetero)aryl, $C_2$-$C_{18}$(hetero)arylamino, —[$CH_2$—$CH_2$]$_{r'}$—$Z^1$, or ($C_1$-$C_{12}$)alkoxy-$X^1$; and wherein $Z^1$ is —OH or —COOH; $X^1$ is —$NH_2$, —NHCOOH, —NHCOOC($CH_3$)$_3$, —NHCO(C3-C12)cycloalkyl(C1-C4)alkyl-N-maleimide; or —NHCO[$CH_2$—$CH_2$—O]$_{s'}$($CH_2$)$_{s'}$$NH_2$; r' is an integer from 1 to 20; and each s' is independently an integer from 1 to 20, ($CH_2$)$_3$($OCH_2CH_2$)$_{x''}$$CH_3$ where x'' is independently an integer from 0 to 50, or a benzyl optionally substituted with one or more halogen, hydroxyl, $C_1$-$C_{12}$ alkoxy, or ($OCH_2CH_2$)$_{x''}$$CH_3$ where each y'' is independently an integer from 0 to 50 and R' is different from R;

wherein k is 2, 4, 8, 12 or 24;

wherein $R^{15}$ is selected from the group consisting of l-u having the structure:

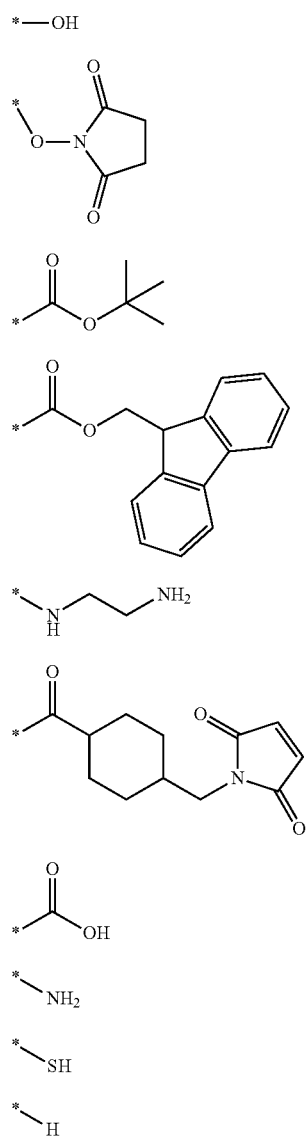

l m n o p q r s t u

In some embodiments of the multi-chromophores described herein (e.g., formulae (V)-(XVI), at least one end group (e.g., $T^2$-$Z^2$, $G^1$, $G^2$, -L-Z, -$L^3$-$Z^3$), or sidechain group, is selected from one of the following structures:

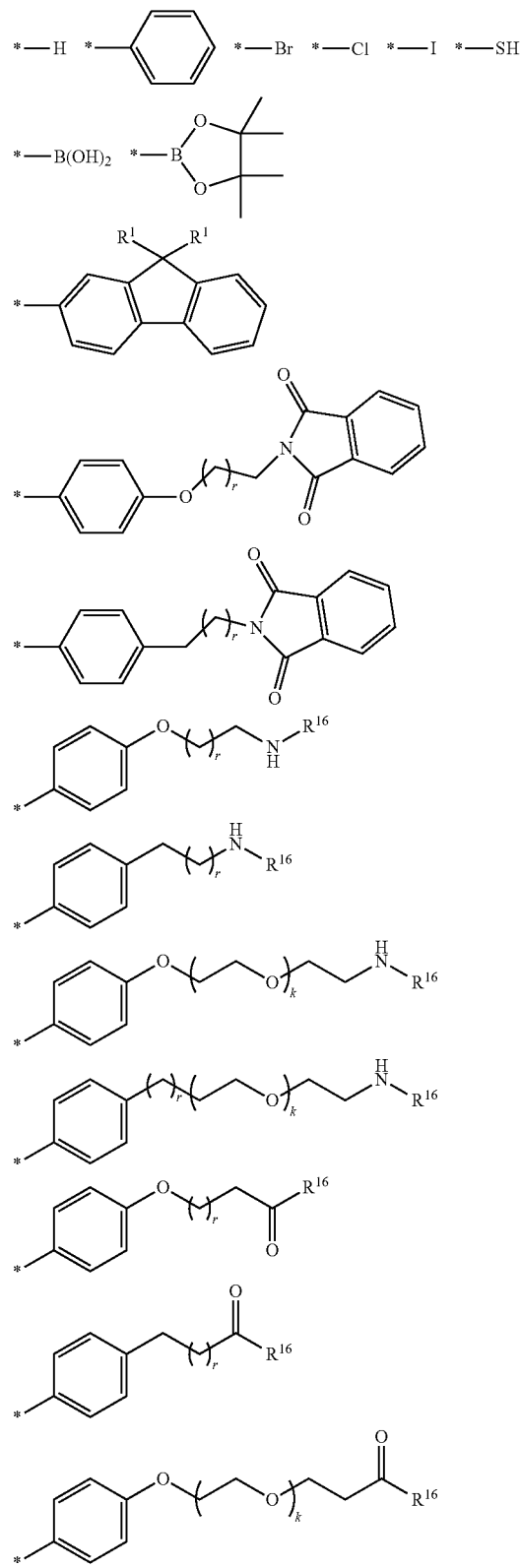

=site for covalent attachment to backbone.

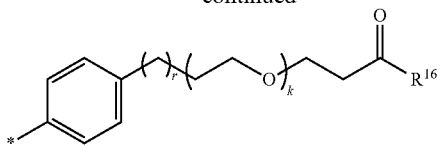

wherein r is 0 or an integer from 1-50; k is 0 or an integer from 1-50 (e.g., 1-20); $R^1$ is as defined for any of the fluorene co-monomers described herein; and $R^{16}$ is selected from H, OH, $NH_2$, $-NH(CH_2)r-NH_2$, and $-NH(CH_2)_r COOH$. In certain instances, r is 1 to 20, such as 3 to 20, 3 to 15, 3 to 12, or 6 to 12. In certain cases, r is 1, 2, 3, 4, 5, 6, 7, 8, 9, 10, 11 or 12. In some cases, r is 3. In some cases, r is 4. In some cases, r is 5. In some cases, r is 6. In some cases, r is 7. In some cases, r is 8. In some cases, r is 9. In some cases, r is 10. In some cases, r is 11.

In some embodiments, the multi-chromophore includes one or more of the following groups, e.g., as an end group or sidechain group for conjugation to a compatible functional group on another molecule:

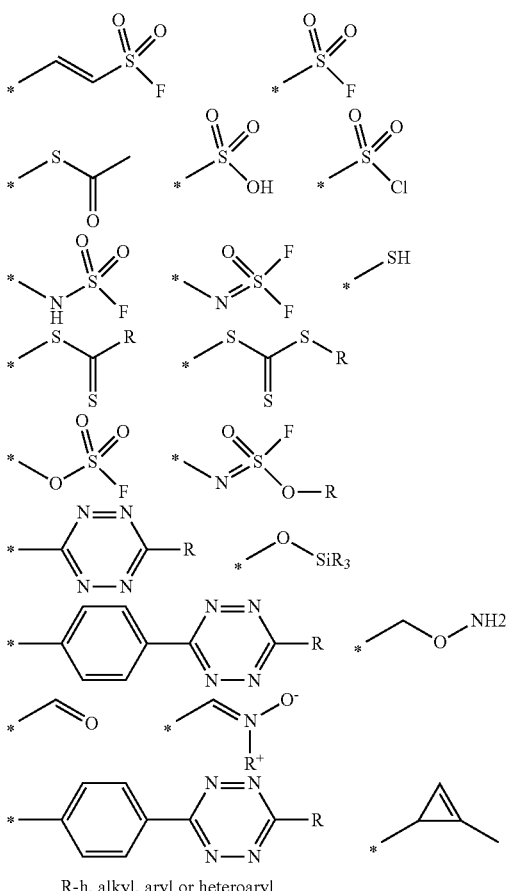

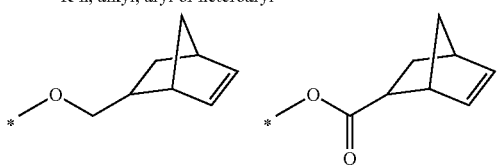

R-h, alkyl, aryl or heteroaryl

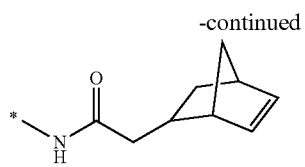

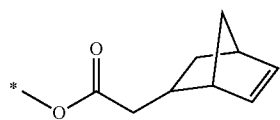

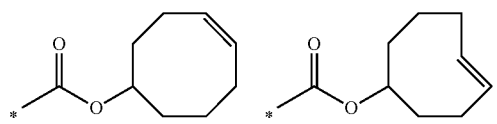

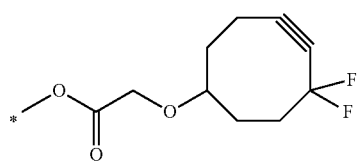

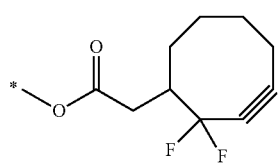

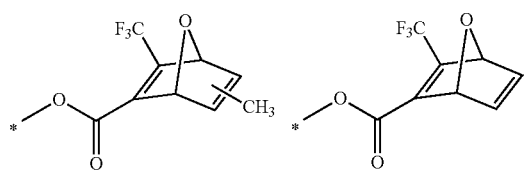

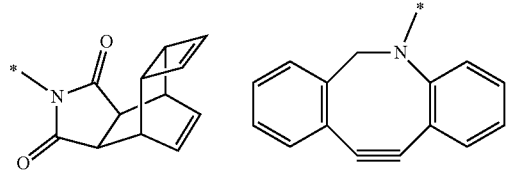

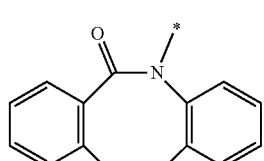

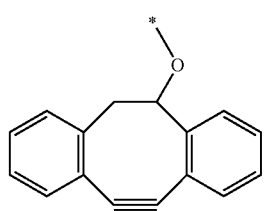

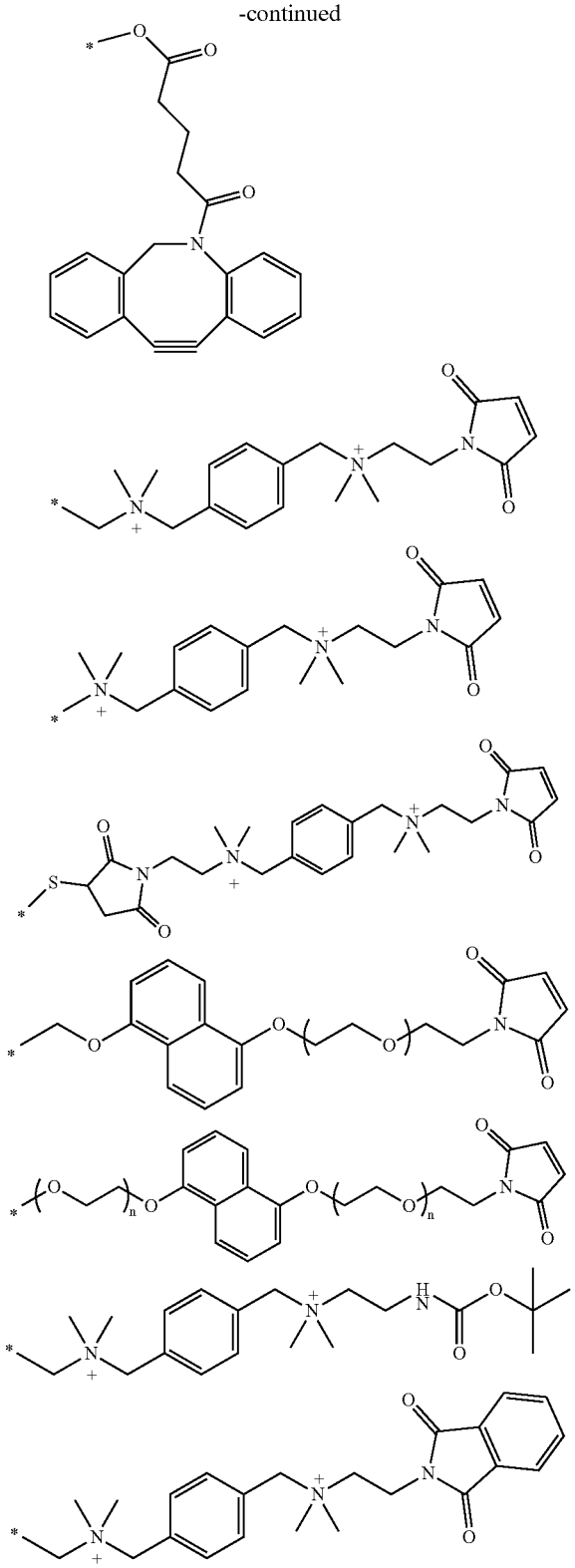

Labelled Specific Binding Members

Aspects of the present disclosure include labeled specific binding members. A labeled specific binding member is a conjugate of a subject polymeric dye (e.g., as described herein) and a specific binding member. Any of the polymeric dyes or polymeric tandem dyes described herein may be conjugated to a specific binding member. The specific binding member and the polymeric dye can be conjugated (e.g., covalently linked) to each other at any convenient locations of the two molecules, via an optional linker.

In some embodiments, the labeled specific binding member is aggregation resistant. As used herein, by "aggregation-resistant" is meant a labeled specific binding member capable of forming a homogenous aqueous composition without aggregated precipitate at a concentration of 1 mg/ml or more in an aqueous buffer of interest, such as 2 mg/ml or more, 3 mg/ml or more, 4 mg/ml or more, 5 mg/ml or more, 6 mg/ml or more, 7 mg/ml or more, 8 mg/ml or more, 9 mg/ml or more, 10 mg/mL or more or even more of the labeled specific binding member.

In some cases the aggregation-resistant labeled specific binding member comprises a multi-chromophore comprising a conjugated segment having the structure of formula (I) or (II) and a specific binding member covalently linked to the multi-chromophore. For instance, the aggregation-resistant labeled specific biding member can comprise:

a water-soluble light harvesting multi-chromophore comprising a conjugated segment having the structure of formula (I):

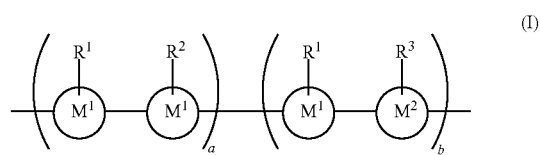

wherein:
  $M^1$ and $M^2$ are each independently an aryl or heteroaryl co-monomer;
  $R^1$ and $R^2$ are each independently a water-soluble group;
  $R^3$ is selected from the group consisting of hydrogen, alkyl, substituted alkyl, alkoxy, substituted alkoxy, aryl, substituted aryl, heteroaryl, substituted heteroaryl, halo, cyano, and hydroxyl;
  a and b define the mol % of each unit within the conjugated segment, wherein a is greater than or equal to b; and
  excitation of the multi-chromophore leads to emission of light from $M^2$; and
a specific binding member covalently linked to the multi-chromophore.

The branched non-ionic water-soluble group (WSG) can be capable of imparting solubility in water in excess of 1 mg/mL to the labeled specific binding member, such as in excess of 2 mg/mL, in excess of 3 mg/mL, in excess of 4 mg/mL, in excess of 5 mg/mL, in excess of 6 mg/mL, in excess of 7 mg/mL, in excess of 8 mg/mL, in excess of 9 mg/mL or in excess of 10 mg/mL. In certain cases, the branched non-ionic water-soluble group (WSG) is capable of imparting solubility in water (e.g., an aqueous buffer) of 10 mg/mL or more to the polymeric dye, such as 20 mg/mL or more, 30 mg/mL or more, 40 mg/mL or more, 50 mg/mL or more, 60 mg/mL or more, 70 mg/mL or more, 80 mg/mL or more, 90 mg/mL or more, 100 mg/mL or more, or even more to the polymeric dye.

As used herein, the term "specific binding member" refers to one member of a pair of molecules which have binding specificity for one another. One member of the pair of molecules may have an area on its surface, or a cavity, which specifically binds to an area on the surface of, or a cavity in, the other member of the pair of molecules. Thus the members of the pair have the property of binding specifically to each other to produce a binding complex. In some embodiments, the affinity between specific binding members in a binding complex is characterized by a $K_d$ (dissociation constant) of $10^{-6}$ M or less, such as $10^{-7}$ M or less, including $10^{-8}$ M or less, e.g., $10^{-9}$ M or less, $10^{-10}$ M or less, $10^{-11}$ M or less, $10^{-12}$ M or less, $10^{-13}$ M or less, $10^{-14}$ M or less, including $10^{-15}$ M or less. In some embodiments, the specific binding members specifically bind with high avidity. By high avidity is meant that the binding member specifically binds with an apparent affinity characterized by an apparent $K_d$ of $10 \times 10^{-9}$ M or less, such as $1 \times 10^{-9}$ M or less, $3 \times 10^{-10}$ M or less, $1 \times 10^{-10}$ M or less, $3 \times 10^{-11}$ M or less, $1 \times 10^{-11}$ M or less, $3 \times 10^{-12}$ M or less or $1 \times 10^{-12}$ M or less.

The specific binding member can be proteinaceous. As used herein, the term "proteinaceous" refers to a moiety that is composed of amino acid residues. A proteinaceous moiety can be a polypeptide. In certain cases, the proteinaceous specific binding member is an antibody. In certain embodiments, the proteinaceous specific binding member is an antibody fragment, e.g., a binding fragment of an antibody that specific binds to a polymeric dye. As used herein, the terms "antibody" and "antibody molecule" are used interchangeably and refer to a protein consisting of one or more polypeptides substantially encoded by all or part of the recognized immunoglobulin genes. The recognized immunoglobulin genes, for example in humans, include the kappa (k), lambda (l), and heavy chain genetic loci, which together comprise the myriad variable region genes, and the constant region genes mu (u), delta (d), gamma (g), sigma (e), and alpha (a) which encode the IgM, IgD, IgG, IgE, and IgA isotypes respectively. An immunoglobulin light or heavy chain variable region consists of a "framework" region (FR) interrupted by three hypervariable regions, also called "complementarity determining regions" or "CDRs". The extent of the framework region and CDRs have been precisely defined (see, "Sequences of Proteins of Immunological Interest," E. Kabat et al., U.S. Department of Health and Human Services, (1991)). The numbering of all antibody amino acid sequences discussed herein conforms to the Kabat system. The sequences of the framework regions of different light or heavy chains are relatively conserved within a species. The framework region of an antibody, that is the combined framework regions of the constituent light and heavy chains, serves to position and align the CDRs. The CDRs are primarily responsible for binding to an epitope of an antigen. The term antibody is meant to include full length antibodies and may refer to a natural antibody from any organism, an engineered antibody, or an antibody generated recombinantly for experimental, therapeutic, or other purposes as further defined below.

Antibody fragments of interest include, but are not limited to, Fab, Fab', F(ab')2, Fv, scFv, or other antigen-binding subsequences of antibodies, either produced by the modification of whole antibodies or those synthesized de novo using recombinant DNA technologies. Antibodies may be monoclonal or polyclonal and may have other specific activities on cells (e.g., antagonists, agonists, neutralizing, inhibitory, or stimulatory antibodies). It is understood that the antibodies may have additional conservative amino acid substitutions which have substantially no effect on antigen binding or other antibody functions.

In certain embodiments, the specific binding member is a Fab fragment, a $F(ab')_2$ fragment, a scFv, a diabody or a triabody. In certain embodiments, the specific binding member is an antibody. In some cases, the specific binding member is a murine antibody or binding fragment thereof. In certain instances, the specific binding member is a recombinant antibody or binding fragment thereof.

In some embodiments, the labeled specific binding member includes: a water solvated light harvesting multi-chromophore (e.g., as described herein); and a signaling chromophore covalently linked to the multi-chromophore in energy-receiving proximity therewith (e.g., as described herein); and a specific binding member covalently linked to the multi-chromophore. In some instances of the labeled specific binding member, the multi-chromophore of any of the formula described herein (e.g., formulae (V) and (VII)-(VIII)), wherein: $G^1$ and $G^2$ are each independently selected from the group consisting of a terminal group (e.g., end group), a t conjugated segment, a linker and a linked specific binding member, wherein at least one of $G^1$ and $G^2$ is a linked specific binding member.

Methods

As summarized above, aspects of the invention include methods of evaluating a sample for the presence of a target analyte. Aspects of the method include contacting the sample with a polymeric dye conjugate that specifically binds the target analyte to produce a labeling composition contacted sample. As used herein, the terms "polymeric dye conjugate" and "labeled specific binding member" are used interchangeably. As such, the polymeric dye conjugate can include: (i) a water solvated polymeric dye (e.g., as described herein); and (ii) a specific binding member (e.g., as described herein). In some instances, the polymeric dye conjugate further comprises a signaling chromophore covalently linked to a multi-chromophore of the polymeric dye in energy-receiving proximity therewith.

Provided are methods of evaluating a sample for the presence of a target analyte. For instance, in some cases the method of evaluating a sample for the presence of a target analyte comprises:

(a) contacting the sample with an aggregation-resistant polymeric dye conjugate that specifically binds the target analyte to produce a labeling composition contacted sample, wherein the polymeric dye conjugate comprises:
  (i) a water-soluble light harvesting multi-chromophore comprising a conjugated segment having the structure of formula (I) or (II), and
  (ii) a specific binding member; and
(b) assaying the labeling composition contacted sample for the presence of a polymeric dye conjugate-target analyte binding complex to evaluate whether the target analyte is present in the sample.

Any convenient method may be used to contact the sample with a polymeric dye conjugate that specifically binds to the target analyte to produce the labeling composition contacted sample. In some instances, the sample is contacted with the polymeric dye conjugate under conditions in which the specific binding member specifically binds to the target analyte, if present. For specific binding of the specific binding member of the conjugate with the target analyte, an appropriate solution may be used that maintains the biological activity of the components of the sample and the specific binding member. The solution may be a balanced salt solution, e.g., normal saline, PBS, Hank's balanced salt solution, etc., conveniently supplemented with fetal calf serum, human platelet lysate or other factors, in conjunction with an acceptable buffer at low concentration, such as from 5-25 mM. Convenient buffers include HEPES, phosphate buffers, lactate buffers, etc. Various media are commercially available and may be used according to the nature of the target analyte, including dMEM, HBSS, dPBS, RPMI, Iscove's medium, etc., in some cases supplemented with fetal calf serum or human platelet lysate. The final components of the solution may be selected depending on the components of the sample which are included.

The temperature at which specific binding of the specific binding member of the conjugate to the target analyte takes place may vary, and in some instances may range from 5° C. to 50° C., such as from 10° C. to 40° C., 15° C. to 40° C., 20° C. to 40° C., e.g., 20° C., 25° C., 30° C., 35° C. or 37° C. (e.g., as described above). In some instances, the temperature at which specific binding takes place is selected to be compatible with the biological activity of the specific binding member and/or the target analyte. In certain instances, the temperature is 25° C., 30° C., 35° C. or 37° C. In certain cases, the specific binding member is an antibody or fragment thereof and the temperature at which specific binding takes place is room temperature (e.g., 25° C.), 30° C., 35° C. or 37° C. Any convenient incubation time for specific binding may be selected to allow for the formation of a desirable amount of binding complex, and in some instances, may be 1 minute (min) or more, such as 2 min or more, 10 min or more, 30 min or more, 1 hour or more, 2 hours or more, or even 6 hours or more.

Any convenient specific binding members may be utilized in the conjugate. Specific binding members of interest include, but are not limited to, those agents that specifically bind cell surface proteins of a variety of cell types, including but not limited to, stem cells, e.g., pluripotent stem cells, hematopoietic stem cells, T cells, T regulator cells, dendritic cells, B Cells, e.g., memory B cells, antigen specific B cells, granulocytes, leukemia cells, lymphoma cells, virus cells (e.g., HIV cells) NK cells, macrophages, monocytes, fibroblasts, epithelial cells, endothelial cells, and erythroid cells. Target cells of interest include cells that have a convenient cell surface marker or antigen that may be captured by a convenient specific binding member conjugate. In some embodiments, the target cell is selected from HIV containing cell, a Treg cell, an antigen-specific T-cell populations, tumor cells or hematopoetic progenitor cells (CD34+) from whole blood, bone marrow or cord blood. Any convenient cell surface proteins or cell markers may be targeted for specific binding to polymeric dye conjugates in the subject methods. In some embodiments, the target cell includes a cell surface marker selected from a cell receptor and a cell surface antigen. In some cases, the target cell may include a cell surface antigen such as CD11b, CD123, CD14, CD15, CD16, CD19, CD193, CD2, CD25, CD27, CD3, CD335, CD36, CD4, CD43, CD45RO, CD56, CD61, CD7, CD8, CD34, CD1c, CD23, CD304, CD235a, T cell receptor alpha/beta, T cell receptor gamma/delta, CD253, CD95, CD20, CD105, CD117, CD120b, Notch4, Lgr5 (N-Terminal), SSEA-3, TRA-1-60 Antigen, Disialoganglioside GD2 and CD71.

Any convenient targets may be selected for evaluation utilizing the subject methods. Targets of interest include, but are not limited to, a nucleic acid, such as an RNA, DNA, PNA, CNA, HNA, LNA or ANA molecule, a protein, such as a fusion protein, a modified protein, such as a phosphorylated, glycosylated, ubiquitinated, SUMOylated, or acetylated protein, or an antibody, a peptide, an aggregated biomolecule, a cell, a small molecule, a vitamin and a drug molecule. As used herein, the term "a target protein" refers to all members of the target family, and fragments thereof. The target protein may be any protein of interest, such as a therapeutic or diagnostic target, including but not limited to: hormones, growth factors, receptors, enzymes, cytokines, osteoinductive factors, colony stimulating factors and immunoglobulins. The term "target protein" is intended to include recombinant and synthetic molecules, which can be prepared using any convenient recombinant expression methods or using any convenient synthetic methods, or purchased commercially. In some embodiments, the polymeric dye conjugates include an antibody or antibody fragment. Any convenient target analyte that specifically binds an antibody or antibody fragment of interest may be targeted in the subject methods.

In some embodiments, the target analyte is associated with a cell. In certain instances, the target analyte is a cell surface marker of the cell. In certain cases, the cell surface marker is selected from the group consisting of a cell receptor and a cell surface antigen. In some instances, the target analyte is an intracellular target, and the method further includes lysing the cell.

In some embodiments, the sample may include a heterogeneous cell population from which target cells are isolated. In some instances, the sample includes peripheral whole blood, peripheral whole blood in which erythrocytes have been lysed prior to cell isolation, cord blood, bone marrow, density gradient-purified peripheral blood mononuclear cells or homogenized tissue. In some cases, the sample includes hematopoetic progenitor cells (e.g., CD34+ cells) in whole blood, bone marrow or cord blood. In certain embodiments, the sample includes tumor cells in peripheral blood. In certain instances, the sample is a sample including (or suspected of including) viral cells (e.g., HIV).

The labeled specific binding members find use in the subject methods, e.g., for labeling a target cell, particle, target or analyte with a polymeric dye or polymeric tandem dye. For example, labeled specific binding members find use in labeling cells to be processed (e.g., detected, analyzed, and/or sorted) in a flow cytometer. The labeled specific binding members may include antibodies that specifically bind to, e.g., cell surface proteins of a variety of cell types (e.g., as described herein). The labeled specific binding members may be used to investigate a variety of biological (e.g., cellular) properties or processes such as cell cycle, cell proliferation, cell differentiation, DNA repair, T cell signaling, apoptosis, cell surface protein expression and/or presentation, and so forth. Labelled specific binding members may be used in any application that includes (or may include) antibody-mediated labeling of a cell, particle or analyte.

In some instances of the method, the labeled specific binding member includes a multi-chromophore as described herein. In certain cases, $G^1$ and $G^2$ are each independently selected from the group consisting of a terminal group, a t conjugated segment, a linker and a linked specific binding member, wherein at least one of $G^1$ and $G^2$ is a linked specific binding member.

Aspects of the method include assaying the labeling composition contacted sample for the presence of a polymeric dye conjugate-target analyte binding complex to evaluate whether the target analyte is present in the sample. Once the sample has been contacted with the polymeric dye conjugate, any convenient methods may be utilized in assaying the labeling composition contacted sample that is produced for the presence of a polymeric dye conjugate-target analyte binding complex. The polymeric dye conjugate-target analyte binding complex is the binding complex that is produced upon specific binding of the specific binding member of the conjugate to the target analyte, if present. Assaying the labeling composition contacted sample can include detecting a fluorescent signal from the binding complex, if present. In some cases, the assaying includes a separating step where the target analyte, if present, is separated from the sample. A variety of methods can be utilized to separate a target analyte from a sample, e.g., via immobilization on a support. Assay methods of interest include, but are not limited to, any convenient methods and assay formats where pairs of specific binding members such as avidin-biotin or hapten-anti-hapten antibodies find use, are of interest. Methods and assay formats of interest that may be adapted for use with the subject compositions include, but are not limited to, flow cytometry methods, in-situ hybridization methods, enzyme-linked immunosorbent assays (ELISAs), western blot analysis, magnetic cell separation assays and fluorochrome purification chromatography.

In certain embodiments, the method further includes contacting the sample with a second specific binding member that specifically binds the target analyte. In certain instances, the second specific binding member is support bound. Any convenient supports may be utilized to immobilize a component of the subject methods (e.g., a second specific binding member). In certain instances, the support is a particle, such as a magnetic particle. In some instances, the second specific binding member and the polymeric dye conjugate produce a sandwich complex that may be isolated and detected, if present, using any convenient methods. In some embodiments, the method further includes flow cytometrically analyzing the polymeric dye conjugate-target analyte binding complex, i.e., a fluorescently labeled target analyte. Assaying for the presence of a polymeric dye conjugate-target analyte binding complex may provide assay results (e.g., qualitative or quantitative assay data) which can be used to evaluate whether the target analyte is present in the sample.

Any convenient supports may be utilized in the subject methods to immobilize any convenient component of the methods, e.g., labeled specific binding member, target, secondary specific binding member, etc. Supports of interest include, but are not limited to: solid substrates, where the substrate can have a variety of configurations, e.g., a sheet, bead, or other structure, such as a plate with wells; beads, polymers, particle, a fibrous mesh, hydrogels, porous matrix, a pin, a microarray surface, a chromatography support, and the like. In some instances, the support is selected from the group consisting of a particle, a planar solid substrate, a fibrous mesh, a hydrogel, a porous matrix, a pin, a microarray surface and a chromatography support. The support may be incorporated into a system that it provides for cell isolation assisted by any convenient methods, such as a manually-operated syringe, a centrifuge or an automated liquid handling system. In some cases, the support finds use in an automated liquid handling system for the high throughput isolation of cells, such as a flow cytometer.

In some embodiments of the method, the separating step includes applying an external magnetic field to immobilize a magnetic particle. Any convenient magnet may be used as a source of the external magnetic field (e.g., magnetic field gradient). In some cases, the external magnetic field is generated by a magnetic source, e.g. by a permanent magnet or electromagnet. In some cases, immobilizing the magnetic particles means the magnetic particles accumulate near the surface closest to the magnetic field gradient source, i.e. the magnet.

The separating may further include one or more optional washing steps to remove unbound material of the sample from the support. Any convenient washing methods may be used, e.g., washing the immobilized support with a biocompatible buffer which preserves the specific binding interaction of the polymeric dye and the specific binding member. Separation and optional washing of unbound material of the sample from the support provides for an enriched population of target cells where undesired cells and material may be removed.

In certain embodiments, the method further includes detecting the labeled target. Detecting the labeled target may include exciting the multi-chromophore with one or more lasers and subsequently detecting fluorescence emission from the polymeric tandem dye using one or more optical detectors. Detection of the labeled target can be performed using any convenient instruments and methods, including but not limited to, flow cytometry, FACS systems, fluorescence microscopy; fluorescence, luminescence, ultraviolet, and/or visible light detection using a plate reader; high performance liquid chromatography (HPLC); and mass spectrometry. When using fluorescently labeled components in the methods and compositions of the present disclosure, it is recognized that different types of fluorescence detection systems can be used to practice the subject methods. In some cases, high throughput screening can be performed, e.g., systems that use 96 well or greater microtiter plates. A variety of methods of performing assays on fluorescent materials can be utilized, such as those methods described in, e.g., Lakowicz, J. R., Principles of Fluorescence Spectroscopy, New York: Plenum Press (1983); Herman, B., Resonance energy transfer microscopy, in: Fluorescence Microscopy of Living Cells in Culture, Part B, Methods in Cell Biology, vol. 30, ed. Taylor, D. L. & Wang, Y.-L., San Diego: Academic Press (1989), pp. 219-243; Turro, N. J., Modern Molecular Photochemistry, Menlo Park: Benjamin/Cummings Publishing Col, Inc. (1978), pp. 296-361.

Fluorescence in a sample can be measured using a fluorimeter. In some cases, excitation radiation, from an excitation source having a first wavelength, passes through excitation optics. The excitation optics cause the excitation radiation to excite the sample. In response, fluorescently labeled targets in the sample emit radiation which has a wavelength that is different from the excitation wavelength. Collection optics then collect the emission from the sample. The device can include a temperature controller to maintain the sample at a specific temperature while it is being scanned. In certain instances, a multi-axis translation stage moves a microtiter plate holding a plurality of samples in order to position different wells to be exposed. The multi-axis translation stage, temperature controller, auto-focusing feature, and electronics associated with imaging and data collection can be managed by an appropriately programmed digital computer. The computer also can transform the data collected during the assay into another format for presentation.

In some embodiments, the method of evaluating a sample for the presence of a target analyte further includes detecting fluorescence in a flow cytometer. In some embodiments, the method of evaluating a sample for the presence of a target analyte further includes imaging the labeling composition contacted sample using fluorescence microscopy. Fluorescence microscopy imaging can be used to identify a polymeric dye conjugate-target analyte binding complex in the contacted sample to evaluate whether the target analyte is present. Microscopy methods of interest that find use in the subject methods include laser scanning confocal microscopy.

Also provided are methods of labeling a target molecule. The subject polymeric dyes, find use in a variety of methods of labeling, separation, detection and/or analysis. In some embodiments, the method includes: contacting the target molecule with a polymeric dye (e.g., as described herein) to produce a labeled target molecule, wherein the polymeric dye includes a conjugation tag that covalently links to the target molecule. In some cases, the polymeric dye further includes a signaling chromophore covalently linked to the multi-chromophore of the polymeric dye in energy-receiving proximity therewith. In some instances of the method, the polymeric dye member includes a multi-chromophore according to any one of formulae (I)-(IV) (e.g., as described herein), where one of $G^1$ and $G^2$ is a terminal group and the other of $G^1$ and $G^2$ is the conjugation tag.

For example, the method of labeling a target molecule can comprise: contacting the target molecule with a polymeric dye to produce a labeled target molecule, wherein the polymer dye comprises: a water-soluble light harvesting multi-chromophore comprising a conjugated segment having the structure of formula (I) or (II), and a conjugation tag.

As used herein the term "conjugation tag" refers to a group that includes a chemoselective functional group (e.g., as described herein) that can covalently link with a compatible functional group of a target molecule, after optional activation and/or deprotection. Any convenient conjugation tags may be utilized in the subject polymeric dyes in order to conjugate the dye to a target molecule of interest. In some embodiments, the conjugation tag includes a terminal functional group selected from an amino, a carboxylic acid or a derivative thereof, a thiol, a hydroxyl, a hydrazine, a hydrazide, a azide, an alkyne and a protein reactive group (e.g. amino-reactive, thiol-reactive, hydroxyl-reactive, imidazolyl-reactive or guanidinyl-reactive).

Any convenient methods and reagent may be adapted for use in the subject labeling methods in order to covalently link the conjugation tag to the target molecule. Methods of interest for labeling a target, include but are not limited to, those methods and reagents described by Hermanson, Bioconjugate Techniques, Third edition, Academic Press, 2013. The contacting step may be performed in an aqueous solution. In some instances, the conjugation tag includes an amino functional group and the target molecule includes an activated ester functional group, such as a NHS ester or sulfo-NHS ester, or vice versa. In certain instances, the conjugation tag includes a maleimide functional group and the target molecule includes a thiol functional group, or vice versa. In certain instances, the conjugation tag includes an alkyne (e.g., a cyclooctyne group) functional group and the target molecule includes an azide functional group, or vice versa, which can be conjugated via Click chemistry.

Any convenient target molecules may be selected for labeling utilizing the subject methods. Target molecules of interest include, but are not limited to, a nucleic acid, such as an RNA, DNA, PNA, CNA, HNA, LNA or ANA molecule, a protein, such as a fusion protein, a modified protein, such as a phosphorylated, glycosylated, ubiquitinated, SUMOylated, or acetylated protein, or an antibody, a peptide, an aggregated biomolecule, a cell, a small molecule, a vitamin and a drug molecule. As used herein, the term "a target protein" refers to all members of the target family, and fragments thereof. The target protein may be any protein of interest, such as a therapeutic or diagnostic target, including but not limited to: hormones, growth factors, receptors, enzymes, cytokines, osteoinductive factors, colony stimulating factors and immunoglobulins. The term "target protein" is intended to include recombinant and synthetic molecules, which can be prepared using any convenient recombinant expression methods or using any convenient synthetic methods, or purchased commercially. In some embodiments, the target molecule is a specific binding member (e.g., as described herein). In certain instances, the specific binding member is an antibody. In some instances, the specific binding member is an antibody fragment or binding derivative thereof. In some case, the antibody fragment or binding derivative thereof is selected from the group consisting of a Fab fragment, a $F(ab')_2$ fragment, a scFv, a diabody and a triabody.

In some cases, the method includes a separating step where the labeled target molecule is separated from the reaction mixture, e.g., excess reagents or unlabeled target. A variety of methods may be utilized to separate a target from a sample, e.g., via immobilization on a support, precipitation, chromatography, and the like.

In some instances, the method further includes detecting and/or analyzing the labeled target molecule. In some instances, the method further includes fluorescently detecting the labeled target molecule. Any convenient methods may be utilized to detect and/or analyze the labeled target molecule in conjunction with the subject methods and compositions. Methods of analyzing a target of interest that find use in the subject methods, include but are not limited to, flow cytometry, fluorescence microscopy, in-situ hybridization, enzyme-linked immunosorbent assays (ELISAs), western blot analysis, magnetic cell separation assays and fluorochrome purification chromatography. Detection methods of interest include but are not limited to fluorescence spectroscopy, fluorescence microscopy, nucleic acid sequencing, fluorescence in-situ hybridization (FISH), protein mass spectroscopy, flow cytometry, and the like.

Detection may be achieved directly via the polymeric dye or polymeric tandem dye, or indirectly by a secondary detection system. The latter may be based on any one or a combination of several different principles including, but not limited to, antibody labeled anti-species antibody and other forms of immunological or non-immunological bridging and signal amplification systems (e.g., biotin-streptavidin technology, protein-A and protein-G mediated technology, or nucleic acid probe/anti-nucleic acid probes, and the like). Suitable reporter molecules may be those known in the field of immunocytochemistry, molecular biology, light, fluorescence, and electron microscopy, cell immunophenotyping, cell sorting, flow cytometry, cell visualization, detection, enumeration, and/or signal output quantification. More than one antibody of specific and/or non-specific nature might be labeled and used simultaneously or sequentially to enhance target detection, identification, and/or analysis.

Also provided are methods of making a multi-chromophore as described herein. For example, the method can comprise contacting monomers A, B, and C with one another,

wherein monomers A and B are configured to be covalently linked and monomers A and C are configured to be covalently linked, thereby generating a multi-chromophore comprising a conjugated segment having the structure of formula (I):

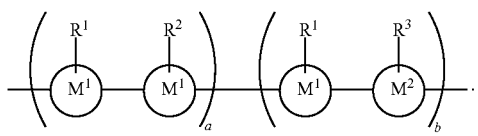

(I)

For example, the monomers can be covalently linked by a Suzuki coupling, a Stille coupling, or a C—H bond arylation coupling. In an exemplary Suzuki coupling monomers A can each comprise two boronic ester groups, monomers B can each comprise two bromide groups, and monomers C can each comprise two bromide groups. Reacting such monomers, e.g., in the presence of a palladium catalyst, can result in covalent linking of monomers A to monomers B and covalently linking monomers A to monomers C. In a C—H bond arylation reaction one monomer can comprise a bromide groups and a second monomer can have C(aryl)-H bonds, e.g., wherein the reaction involves a palladium catalyst, e.g., Pd(OAc)$_2$. In a Stille coupling reaction one monomer can comprise a —SnBu$_3$ group and the second monomer can comprise a bromide group, e.g., wherein the reaction includes a Pd(0) catalyst.

Varying the ratios of monomers can be used to create conjugated segments of formula (I) with different ratios between the two units, i.e., different values for "a" and "b", which are shown as subscripts in formula (I). Conjugated segments with different ratios between the two units can have different optical properties, e.g., different absorption maximum wavelength, different emission maximum wavelength. In some cases different ratios of a and b provide for spectra that have fewer side peaks, less intense side peaks, or a combination thereof. In some cases the number of monomers A is equal to the sum of the number of monomers B and C. Also provided are methods of making a multi-chromophore that comprise contacting monomers A and B with one another,

(A)

(B)

wherein monomers A and B are configured to be covalently linked, thereby generating a multi-chromophore comprising a conjugated segment having the structure of formula (II):

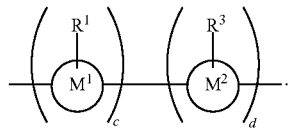

(II)

The methods of making the multi-chromophore can include designing the multi-chromophore to have particular absorption and emission spectra. For instance, if a sample containing the multi-chromophore is contacted with light corresponding to its absorption spectrum, the multi-chromophore can absorb the light and become excited, and thereafter emit fluorescent light corresponding to its emission spectrum. Measuring the emission spectra based on a particular excitation light source, e.g., a laser, can be used to identify a multi-chromophore in the sample.

In some cases the sample contains two or more fluorescent compounds, e.g., two or more multi-chromophores. As such, it can be useful to design the absorption spectra, emission spectra, or both of the multi-chromophore to reduce or avoid overlap with absorption and emission spectra of other compounds. For instance, if two multi-chromophores have significantly different absorption spectra, e.g., different absorption maximum wavelengths, then a first multi-chromophore can be excited without significantly exciting the second multi-chromophore. The reduced excitation of the second multi-chromophore will result in a less intensity emission from the second multi-chromophore, thereby aiding in detection of the first multi-chromophore. A light source with a relatively narrow wavelength distribution, e.g., a laser, can also be used to excite the first multi-chromophore without significantly exciting the second multi-chromophore. In some cases the first multi-chromophore has an absorption maximum wavelength that differs from the absorption maximum wavelength of the second multi-chromophore by 10 nm or more, such as 25 nm or more, 50 nm or more, or 75 nm or more.

In addition, the emission spectrum of the multi-chromophore can be designed to avoid or reduce overlap with the emission spectrum of a second multi-chromophore. As such, even if both multi-chromophores are significantly excited and fluorescently emit with significant intensity, measurements of the emitted fluorescent light can distinguish between the two multi-chromophores. For instance, in some embodiments the first multi-chromophore has an emission maximum wavelength that differs from the emission maximum wavelength of the second multi-chromophore by 10 nm or more, such as 25 nm or more, 50 nm or more, or 75 nm or more.

FIG. 1 shows an exemplary method for designing and making a multi-chromophore, polymeric tandem dye, or aggregation-resistant labeled specific binding member. The method includes selecting a desired absorption spectrum, e.g., a desired absorption maximum wavelength. For instance, the absorption maximum wavelength can be near the maximum emission wavelength of a laser, e.g., within 20 nm or less, such as 10 nm or less or 5 nm or less. Exemplary lasers are 405 nm GaN lasers, 458 and 488 argon-ion lasers, and 532 nm Nd:YVO$_4$ and KTP lasers. Additional lasers are described in Lakowicz, J. R., Principles of Fluorescence Spectroscopy, New York: Plenum Press (1983); Herman, B., Resonance energy transfer microscopy, in: Fluorescence Microscopy of Living Cells in Culture, Part B, Methods in Cell Biology, vol. 30, ed. Taylor, D. L. & Wang, Y.-L., San Diego: Academic Press (1989), pp. 219-243; Turro, N. J., Modern Molecular Photochemistry, Menlo Park: Benjamin/Cummings Publishing Col, Inc. (1978), pp. 296-361. The absorption maximum wavelength can be selected to be different from the absorption maximum wavelength used to excite a different multi-chromophore. Based on the selected absorption spectra, a co-monomer $M^1$ can be chosen. For example, the fluorene co-monomer can give an absorption maximum wavelength of about 400 nm, which can be used with a 405 nm laser excitation source. In addition, the water-soluble groups $R^1$ and $R^2$ can be selected to increase the solubility of the multi-chromophore in aqueous medium.

Also shown in FIG. 1 is the step of selecting a desired emission spectrum, e.g., a desired emission maximum wavelength. The emission spectrum can be chosen to have minimal overlap with the emission spectrum of a second multi-chromophore. For instance, choosing quinoxaline as $M^2$ can give an emission maximum wavelength of about 500 nm. Reduced overlap between the emission spectra of two multi-chromophores can improve the ability to separately detect and distinguish the multi-chromophores in a sample. The method also includes the step of selecting $R^3$, which is linked to $M^2$. In some cases $R^3$ is selected have minimal influence on the emission spectrum of $M^2$, e.g., $R^3$ does not have any $\pi$ electrons that are conjugated to $M^2$. In other cases $R^3$ is selected to modify the emission spectra of $M^2$, e.g., $R^3$ does have any 1T electrons that are conjugated to $M^2$.

The method of FIG. 1 also includes selecting the ratio of the co-monomers. For instance, if a multi-chromophore having a segment of formula (I) is desired then the relative amounts of $M^1R^1$, $M^1R^2$, and $M^2R^3$ are selected to give the desired values for a and b. If a multi-chromophore having a segment of formula (II) is desired then the relative amounts of $M^1R^1$ and $M^2R^3$ are selected to give the desired values for c and d. In addition, a signaling chromophore, a specific binding member, or a combination thereof can optionally be selected. Afterwards, the desired composition can be synthesized by contacting the appropriate compounds in the appropriate ratios with one another.

The method of FIG. 1 can be considered to include the steps of selecting co-monomer $M^1$ based on a desired absorption spectrum, selecting water-soluble groups $R^1$ and $R^2$, selecting co-monomer $M^2$ based on a desired emission spectrum, selecting $R^3$, selecting the ratios of the co-monomers, optionally selecting a signaling chromophore and a specific binding member, and synthesizing the composition.

The method can also include tuning the properties of the multi-chromophore by measuring one or more properties of the multi-chromophore and then repeating the method with one or more different selections based on the measuring. For instance, a different $M^1$ co-monomer can be selected to tune the absorption spectrum, or a different $M^2$ co-monomer can be selected to tune the emission spectrum. As another example, the ratio between the co-monomers can be tuned in order to increase water solubility while maintaining desirable optical properties. For instance, since $R^1$ and $R^2$ are water-soluble groups, increasing the ratio of $M^1$ to $M^2$ will increase the proportion of water-soluble groups, thereby increasing water solubility. The optical properties can be monitored to determine if the increased $M^1$ to $M^2$ ratio adversely affects the optical properties, e.g., the emission spectrum, of the multi-chromophore.

In some cases the tuning of co-monomer ratios can also lead to an improvement in optical properties of the multi-chromophore. For instance, varying the $M^1$ to $M^2$ ratio can reduce or eliminate undesirable side peaks in the absorption and emission spectra. Varying the $M^1$ to $M^2$ ratio can also increase the sharpness of the peaks, e.g., the full width at half maximum (FWHM) of the peaks can decrease after tuning the co-monomer ratios. As used herein regarding absorption and emission spectra, full width at half maximum means the difference (e.g., in nm) between the two wavelength values at which the absorption or emission intensity is equal to half its maximum value.

Systems

Aspects of the invention further include systems for use in practicing the subject methods and compositions. A sample analysis system can include sample field of view or a flow channel loaded with a sample and a labeled specific binding member. In some embodiments, the system is a flow cytometric system including: a flow cytometer including a flow path; a composition in the flow path, wherein the composition includes: a sample; and a labeled specific binding member (e.g., as described herein). For instance, the labeled specific binding member can comprise a water-soluble light harvesting multi-chromophore comprising a conjugated segment having the structure of formula (I) or (II) and a specific binding member that specifically binds to a target analyte and is covalently linked to the multi-chromophore. In some embodiments, the system for analyzing a sample is a fluorescence microscopy system, including: a fluorescence microscope comprising a sample field of view; and a composition disposed in the sample field of view, wherein the composition comprises a sample; and a labeled specific binding member (e.g., as described herein).

In some instances of the systems, the labeled specific binding member includes: a water solvated light harvesting multi-chromophore (e.g., as described herein) and a specific binding member that specifically binds a target analyte covalently linked to the multi-chromophore. In some cases, the labeled specific binding member further comprises a signaling chromophore covalently linked to the multi-chromophore of the polymeric dye in energy-receiving proximity therewith. In some instances of the subject systems, the labeled specific binding member, the multi-chromophore is described by any one of formulae (I) or (II), e.g., wherein: $G^1$ and $G^2$ are each independently selected from the group consisting of a terminal group, a $\pi$ conjugated segment, a linker and a linked specific binding member, wherein at least one of $G^1$ and $G^2$ is a linked specific binding member.

In certain embodiments of the systems, the composition further includes a second specific binding member that is support bound and specifically binds the target analyte. In some cases, the support includes a magnetic particle. As such, in certain instances, the system may also include a controllable external paramagnetic field configured for application to an assay region of the flow channel.

The sample may include a cell. In some instances, the sample is a cell-containing biological sample. In some instances, the sample includes a labeled specific binding member specifically bound to a target cell. In certain instances, the target analyte that is specifically bound by the specific binding member is a cell surface marker of the cell. In certain cases, the cell surface marker is selected from the group consisting of a cell receptor and a cell surface antigen.

In certain aspects, the system may also include a light source configured to direct light to an assay region of the flow channel or sample field of view. The system may include a detector configured to receive a signal from an assay region of the flow channel or a sample field of view, wherein the signal is provided by the fluorescent composition. Optionally further, the sample analysis system may include one or more additional detectors and/or light sources for the detection of one or more additional signals.

In certain aspects, the system may further include computer-based systems configured to detect the presence of the fluorescent signal. A "computer-based system" refers to the hardware means, software means, and data storage means used to analyze the information of the present invention. The minimum hardware of the computer-based systems of the present invention includes a central processing unit (CPU), input means, output means, and data storage means. A skilled artisan can readily appreciate that any one of the currently available computer-based system are suitable for use in the subject systems. The data storage means may include any manufacture including a recording of the present information as described above, or a memory access means that can access such a manufacture.

To "record" data, programming or other information on a computer readable medium refers to a process for storing information, using any such methods as known in the art. Any convenient data storage structure may be chosen, based on the means used to access the stored information. A variety of data processor programs and formats can be used for storage, e.g., word processing text file, database format, etc.

A "processor" references any hardware and/or software combination that will perform the functions required of it. For example, any processor herein may be a programmable digital microprocessor such as available in the form of an electronic controller, mainframe, server or personal computer (desktop or portable). Where the processor is programmable, suitable programming can be communicated from a remote location to the processor, or previously saved in a computer program product (such as a portable or fixed computer readable storage medium, whether magnetic, optical or solid state device based). For example, a magnetic medium or optical disk may carry the programming, and can be read by a suitable reader communicating with each processor at its corresponding station.

In addition to the sensor device and signal processing module, e.g., as described above, systems of the invention may include a number of additional components, such as data output devices, e.g., monitors and/or speakers, data input devices, e.g., interface ports, keyboards, etc., fluid handling components, power sources, etc.

In certain aspects, the system includes a flow cytometer. Flow cytometers of interest include, but are not limited to, those devices described in U.S. Pat. Nos. 4,704,891; 4,727,029; 4,745,285; 4,867,908; 5,342,790; 5,620,842; 5,627,037; 5,701,012; 5,895,922; and 6,287,791; the disclosures of which are herein incorporated by reference.

Other systems may find use in practicing the subject methods. In certain aspects, the system may be a fluorimeter or microscope loaded with a sample having a fluorescent composition of any of the embodiments discussed herein. The fluorimeter or microscope may include a light source configured to direct light to the assay region of the flow channel or sample field of view. The fluorimeter or microscope may also include a detector configured to receive a signal from an assay region of the flow channel or field of view, wherein the signal is provided by the fluorescent composition.

Kits

Aspects of the invention further include kits for use in practicing the subject methods and compositions. The compositions of the invention can be included as reagents in kits either as starting materials or provided for use in, for example, the methodologies described above.

A kit can include a polymeric dye including a water solvated light harvesting multi-chromophore (e.g., as described herein) and a container. Any convenient containers can be utilized, such as tubes, bottles, or wells in a multi-well strip or plate, a box, a bag, an insulated container, and the like. The subject kits can further include one or more components selected from a polymeric tandem dye, a fluorophore, a specific binding member, a specific binding member conjugate, a support bound specific binding member, a cell, a support, a biocompatible aqueous elution buffer, and instructions for use. In some embodiments of the kit, the multi-chromophore is covalently linked to a specific binding member. In some instances, the specific binding member is an antibody. In certain instances, the specific binding member is an antibody fragment or binding derivative thereof. In certain cases, the antibody fragment or binding derivative thereof is selected from the group consisting of a Fab fragment, a F(ab')2 fragment, a scFv, a diabody and a triabody.

In certain embodiments, the kit finds use in evaluating a sample for the presence of a target analyte, such as an intracellular target. As such, in some instances, the kit includes one or more additional components suitable for lysing cells. The one or more additional components of the kit may be provided in separate containers (e.g., separate tubes, bottles, or wells in a multi-well strip or plate).

In certain aspects, the kit further includes reagents for performing a flow cytometric assay. Reagents of interest include, but are not limited to, buffers for reconstitution and dilution, buffers for contacting a cell sample the multi-chromophore, wash buffers, control cells, control beads, fluorescent beads for flow cytometer calibration and combinations thereof. The kit may also include one or more cell fixing reagents such as paraformaldehyde, glutaraldehyde, methanol, acetone, formalin, or any combinations or buffers thereof. Further, the kit may include a cell permeabilizing reagent, such as methanol, acetone or a detergent (e.g., triton, NP-40, saponin, tween 20, digitonin, leucoperm, or any combinations or buffers thereof. Other protein transport inhibitors, cell fixing reagents and cell permeabilizing reagents familiar to the skilled artisan are within the scope of the subject kits.

The compositions of the kit may be provided in a liquid composition, such as any suitable buffer. Alternatively, the compositions of the kit may be provided in a dry composition (e.g., may be lyophilized), and the kit may optionally include one or more buffers for reconstituting the dry composition. In certain aspects, the kit may include aliquots of the compositions provided in separate containers (e.g., separate tubes, bottles, or wells in a multi-well strip or plate).

In addition, one or more components may be combined into a single container, e.g., a glass or plastic vial, tube or bottle. In certain instances, the kit may further include a container (e.g., such as a box, a bag, an insulated container, a bottle, tube, etc.) in which all of the components (and their separate containers) are present. The kit may further include packaging that is separate from or attached to the kit container and upon which is printed information about the kit, the components of the and/or instructions for use of the kit.

In addition to the above components, the subject kits may further include instructions for practicing the subject methods. These instructions may be present in the subject kits in a variety of forms, one or more of which may be present in the kit. One form in which these instructions may be present is as printed information on a suitable medium or substrate, e.g., a piece or pieces of paper on which the information is printed, in the packaging of the kit, in a package insert, etc. Yet another means would be a computer readable medium, e.g., diskette, CD, DVD, portable flash drive, etc., on which the information has been recorded. Yet another means that may be present is a website address which may be used via the Internet to access the information at a removed site. Any convenient means may be present in the kits.

Utility

The polymeric dyes, compositions, methods and systems as described herein may find use in a variety of applications, including diagnostic and research applications, in which the labeling, detection and/or analysis of a target of interest is desirable. Such applications include methodologies such as cytometry, microscopy, immunoassays (e.g. competitive or non-competitive), assessment of a free analyte, assessment of receptor bound ligand, and so forth. The compositions, system and methods described herein may be useful in analysis of any of a number of samples, including but not limited to, biological fluids, cell culture samples, and tissue samples. In certain aspects, the compositions, system and methods described herein may find use in methods where analytes are detected in a sample, if present, using fluorescent labels, such as in fluorescent activated cell sorting or analysis, immunoassays, immunostaining, and the like. In certain instances, the compositions and methods find use in applications where the evaluation of a sample for the presence of a target analyte is of interest.

In some cases, the methods and compositions find use in any assay format where the detection and/or analysis of a target from a sample is of interest, including but not limited to, flow cytometry, fluorescence microscopy, in-situ hybridization, enzyme-linked immunosorbent assays (ELISAs), western blot analysis, magnetic cell separation assays and fluorochrome purification chromatography. In certain instances, the methods and compositions find use in any application where the fluorescent labeling of a target molecule is of interest. The subject compositions may be adapted for use in any convenient applications where pairs of specific binding members find use, such as biotin-streptavidin and hapten-anti-hapten antibody.

EXAMPLES

Example 1

Synthesis and Optical Properties of Water-Soluble Light Harvesting Multi-Chromophores The synthesis of the subject multi-chromophores can be achieved by a technique called C—H bond arylation (Scheme 1). Other methods such as a Suzuki coupling method (Scheme 2) or a Stille coupling method (Scheme 3) can also be utilized. The following exemplary synthetic schemes can be adapted for the synthesis of the subject polymeric dyes having a variety of co-monomers, as described herein.

Scheme 1: C-H Bond Arylation method

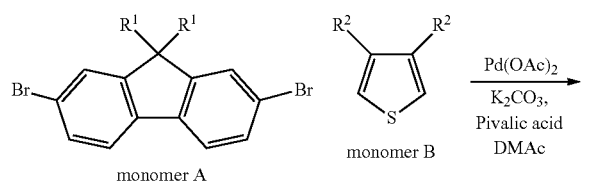

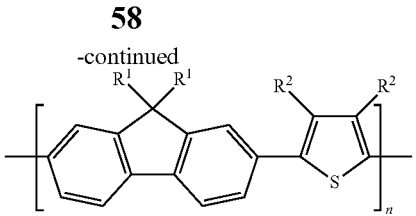

Scheme 2: Suzuki Coupling method

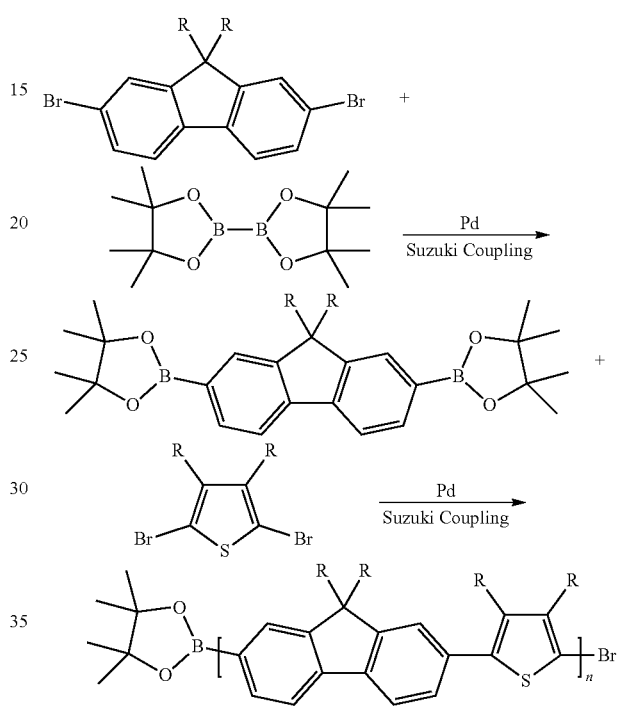

Scheme 3: Stille Coupling method

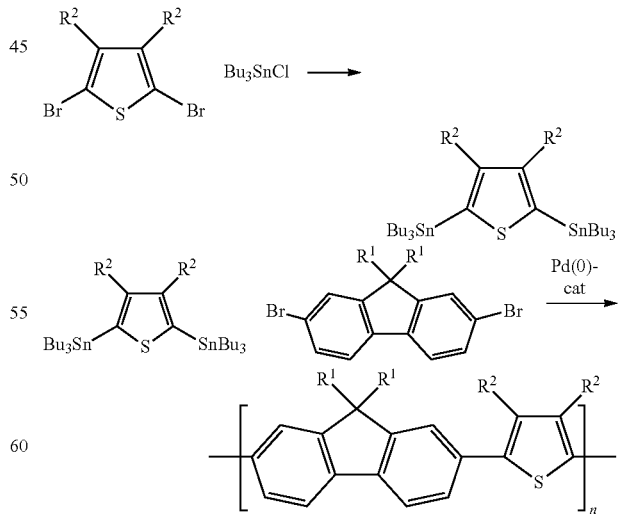

Multi-chromophore 1 was synthesized using fluorene and quinoxaline co-monomers as shown below. The molar ratios of co-monomers was selected to provide for a 0.50 to 0.50 ratio of the two groups shown in the diagram. Whereas the dibromide fluorene co-monomer was substituted with two $R_4$ groups the diboronic ester fluorene co-monomer was substituted with two $R_5$ groups.

and $R_5$, whereas the quinoxaline co-monomers are not substituted with water-soluble groups. As such, multi-chromophore 1 contained a higher proportion of water-soluble groups than the reference multi-chromophore. Solubility tests showed that multi-chromophore 1 was more soluble in water than the reference multi-chromophore.

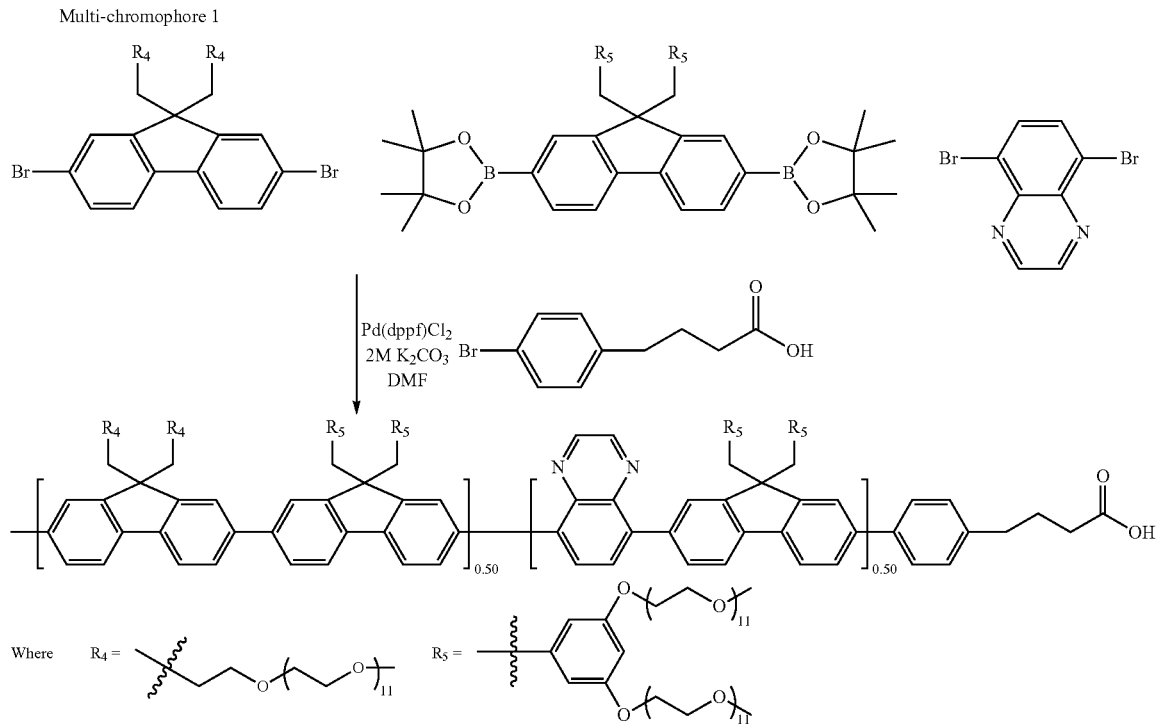

A reference multi-chromophore was also synthesized according to the methods used with multi-chromophore 1. The reference multi-chromophore has the chemical structure shown below, i.e., the reference multi-chromophore has a 1:1 ratio of the fluorene co-monomer to the quinoxaline co-monomer. In contrast, multi-chromophore 1 has a 3:1 ratio of fluorene co-monomers to quinoxaline co-monomers due to the inclusion of the additional group with two fluorene co-monomers.

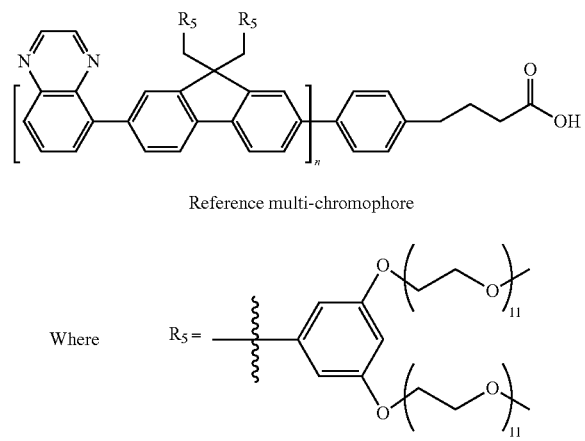

Figure 2:
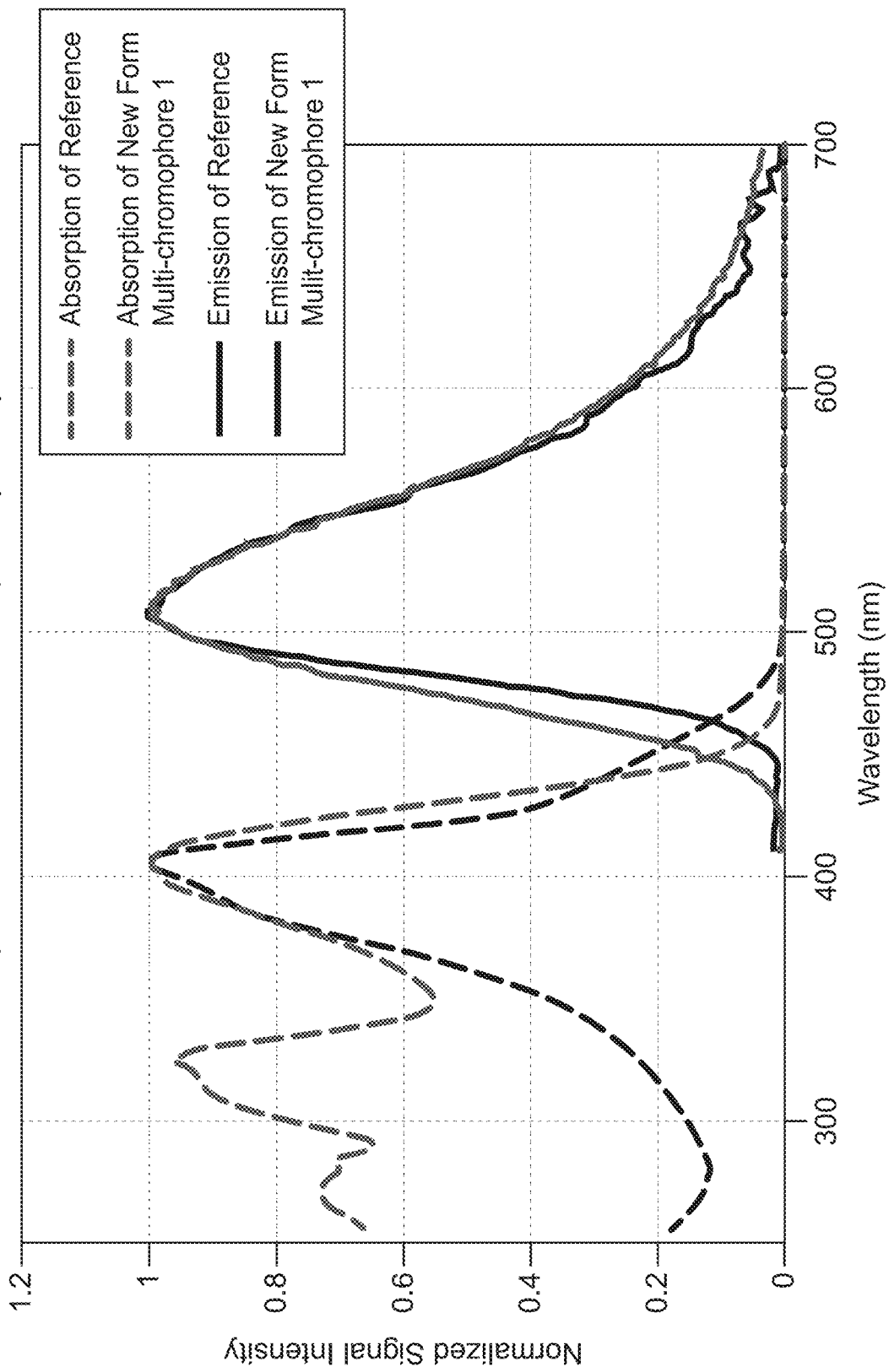
FIG. 2 depicts the absorption and emission spectra of two different multi-chromophores.

As shown in the chemical structures, the fluorene-comonomers are substituted with water-soluble groups $R_4$ The absorption and emission spectra of multi-chromophore 1 and the reference multi-chromophore were recorded, as shown in FIG. 2. The absorption spectra are shown as dashed lines whereas the emission spectra are shown as solid lines. Both multi-chromophores have an emission maximum wavelength of about 500 nm and the reference multi-chromophore has a side peak at about 410 nm. Both multi-chromophores have an absorption maximum wavelength of about 400 nm. In addition, the reference multi-chromophore has side absorption peaks at about 320 nm and 260 nm, whereas multi-chromophore 1 has a side peak at about 290 nm of lower intensity than the side peaks of the reference multi-chromophore.

Additional multi-chromophores 2-6 were synthesized with different co-monomers in different molar ratios according to the methods described for multi-chromophore 1. The chemical structures of additional multi-chromophores 2-6 are shown below, wherein the multi-chromophores 2 and 3 include quinoxaline co-monomers and multi-chromophores 4-6 include 2-phenyl-2H-benzo[d][1,2,3]triazole co-monomers. The ratio of the two groups was 0.75 to 0.25 in multi-chromophores 2, 5, and 6 whereas the ratio of the two groups was 0.50 to 0.50 in multi-chromophores 3 and 4. As such, the ratio of the fluorene co-monomers to the second co-monomers was 7:1 in multi-chromophores 2, 5, and 6 whereas the ratio was 3:1 in multi-chromophores 3 and 4.

Multi-chromophore 2
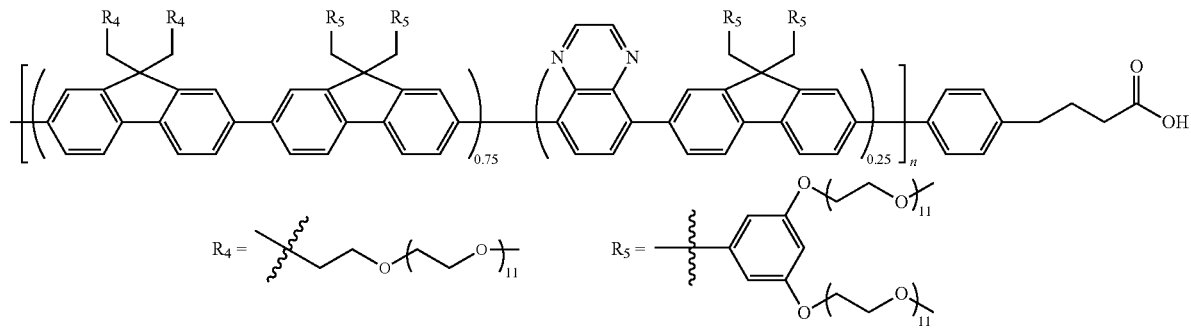
Multi-chromophore 3
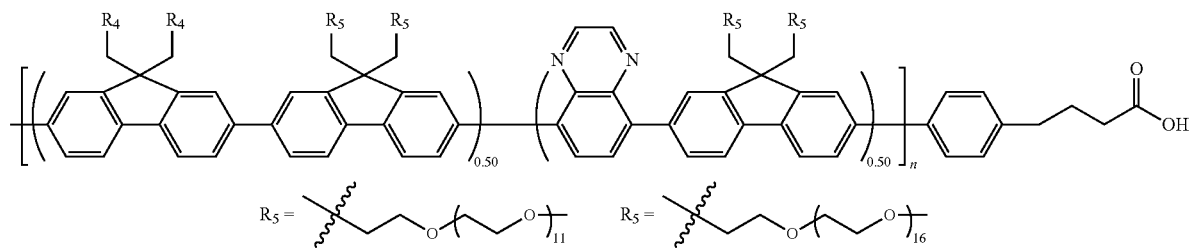
Multi-chromophore 4
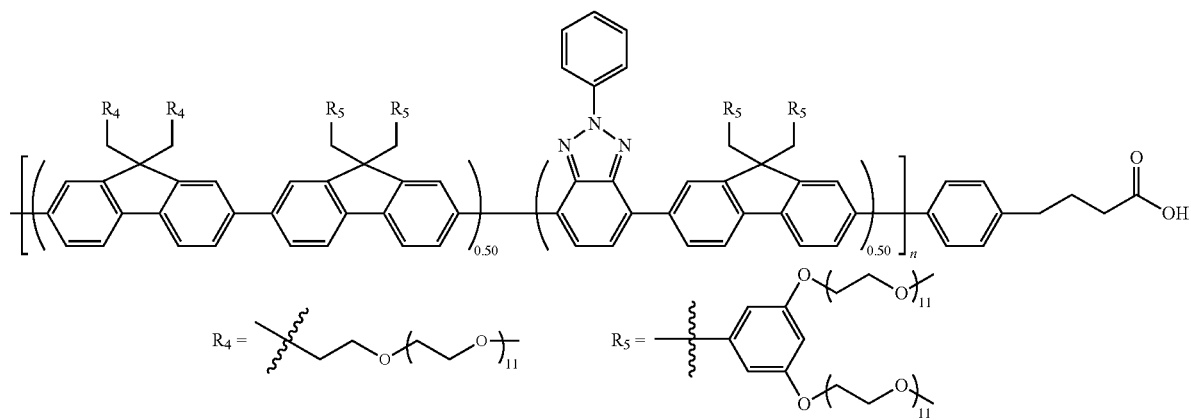
Multi-chromophore 5
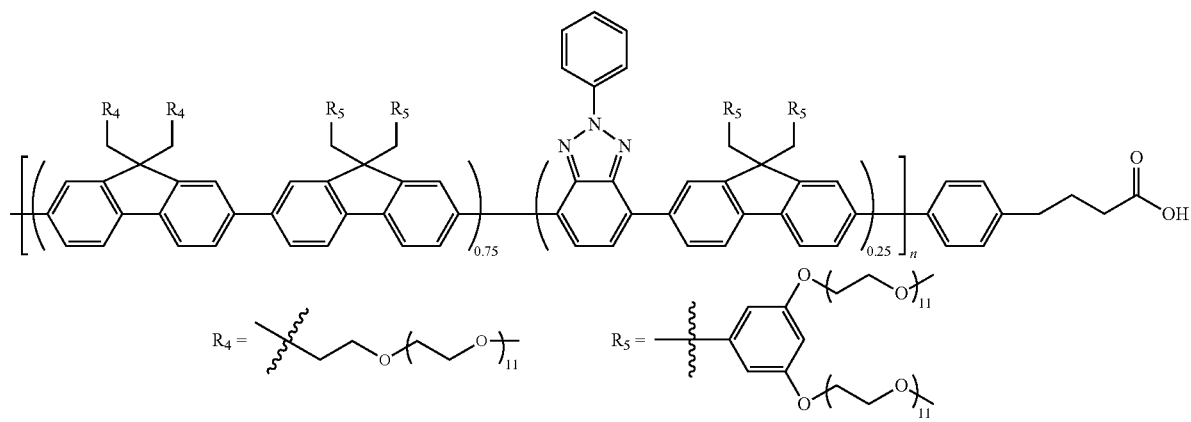

-continued

Multi-chromophore 6

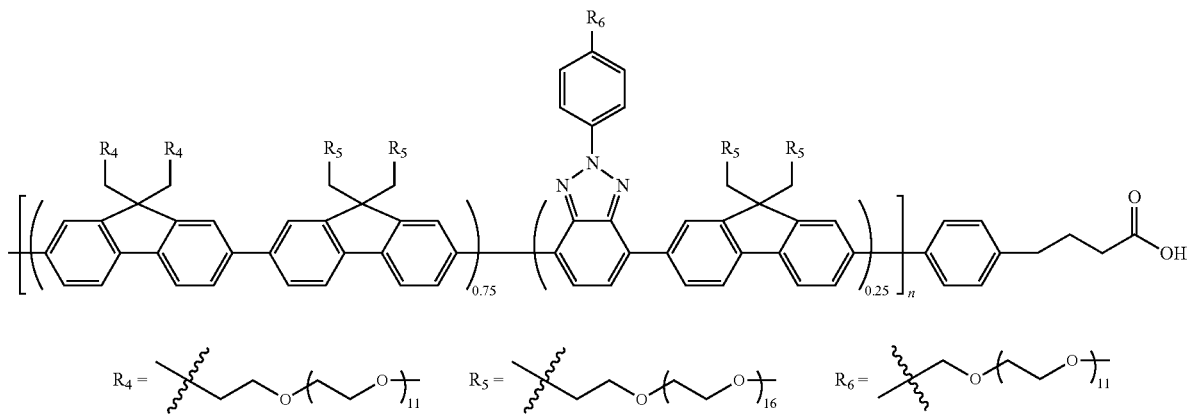

Notwithstanding the appended claims, the disclosure is also defined by the following clauses:

1. A water-soluble light harvesting multi-chromophore comprising a conjugated segment having the structure of formula (I):

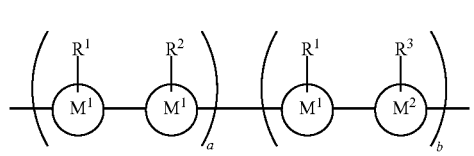

wherein:
M$^1$ and M$^2$ are each independently an aryl or heteroaryl co-monomer;
R$^1$ and R$^2$ are each independently a water-soluble group;
R$^3$ is selected from the group consisting of hydrogen, alkyl, substituted alkyl, alkoxy, substituted alkoxy, aryl, substituted aryl, heteroaryl, substituted heteroaryl, halo, cyano, and hydroxyl;
a and b define the mol % of each unit within the conjugated segment, wherein a is greater than or equal to b; and
excitation of the multi-chromophore leads to emission of light from M$^2$.

2. The water-soluble light harvesting multi-chromophore according to clause 1, wherein M$^1$ is a 5-membered aromatic group, a 6-membered aromatic group, a fused bicyclic aromatic group, a fused tricyclic aromatic group, or a combination thereof.

3. The water-soluble light harvesting multi-chromophore according to clause 2, wherein M$^1$ is a phenyl group, pyridyl group, napthyl group, binapthyl group, a fused tricyclic aromatic group, or a combination thereof.

4. The water-soluble light harvesting multi-chromophore according to clause 3, wherein M$^1$ is a fused tricyclic aromatic group.

5. The water-soluble light harvesting multi-chromophore according to clause 4, wherein M$^1$ is a fused tricyclic aromatic group described by the following structure:

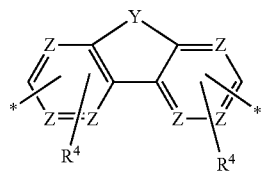

wherein:
each R$^4$ is independently H or one or more alkyl, substituted alkyl, aryl or heteroaryl substituents and wherein any two convenient R$^4$ groups are optionally cyclically linked;
Y is C(R$^5$)$_2$, —C(R$^5$)$_2$C(R$^5$)$_2$—, —C(R$^5$)$_2$Si(R$^5$)$_2$—, NR$^5$, Si(R$^5$)$_2$ or Se;
each R$^5$ is independently selected from H, alkyl, substituted alkyl, aryl, substituted aryl, heteroaryl, substituted heteroaryl, acyl, substituted acyl, alkoxy, substituted alkoxy, amido, substituted amido, an aralkyl, a substituted aralkyl, a PEG moiety, -L$^1$-Z$^1$, where L$^1$ is a linker and Z$^1$ is a chemoselective tag and a WSG; and
each Z is independently CH, CR$^4$ or N, wherein at least two of Z in each ring is CH or CR$^4$;
each * indicates a location for attachment to an M$^2$ group or another M$^1$ group; and
at least one R$^4$ or R$^5$ is a water-soluble group.

6. The water-soluble light harvesting multi-chromophore according to clause 5, wherein Y is C(R$^5$)$_2$.

7. The water-soluble light harvesting multi-chromophore according to clause 5, wherein Y is —C(R$^5$)$_2$C(R$^5$)$_2$—.

8. The water-soluble light harvesting multi-chromophore according to any one of clauses 5-7, wherein each Z is CH or CR$^4$.

9. The water-soluble light harvesting multi-chromophore according to clause 4, wherein M$^1$ is a fused tricyclic group is described by one of the following structures:

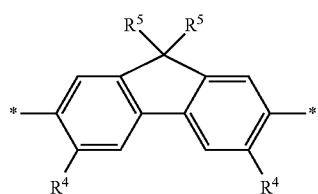

-continued
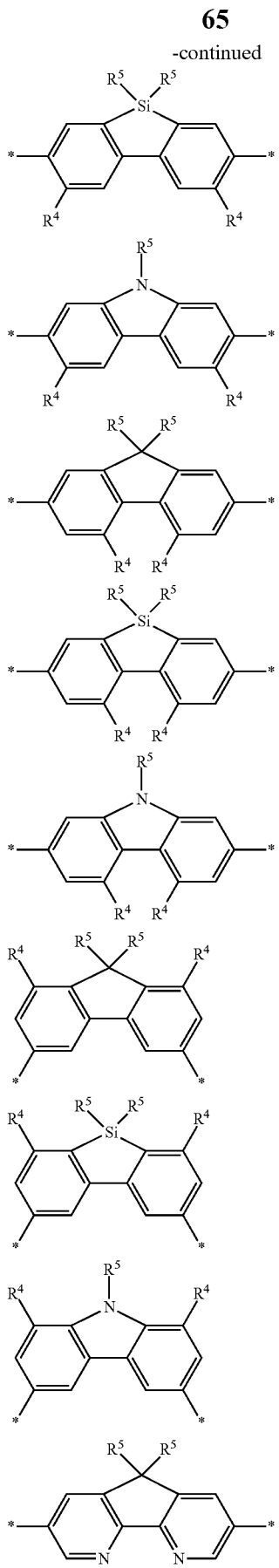
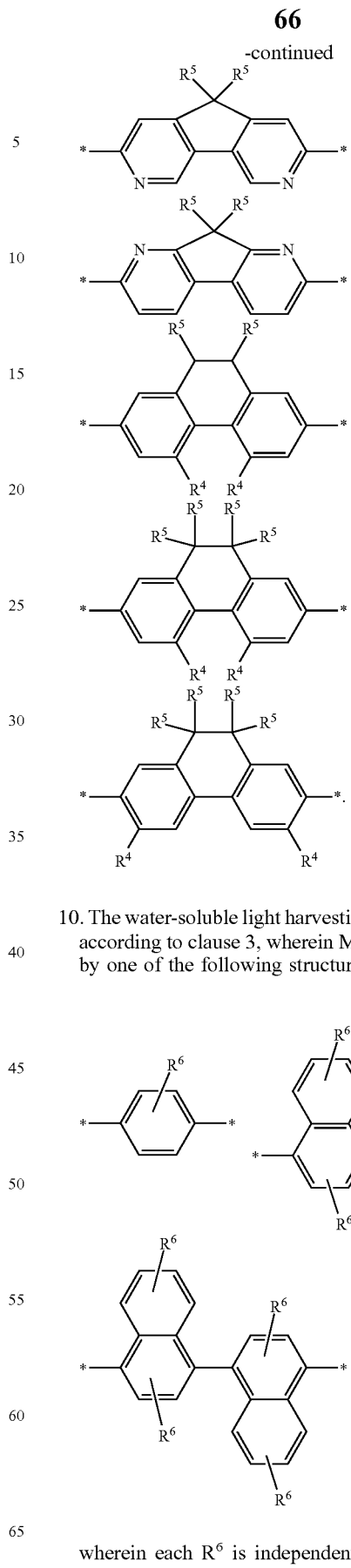
10. The water-soluble light harvesting multi-chromophore according to clause 3, wherein $M^1$ is a group described by one of the following structures:
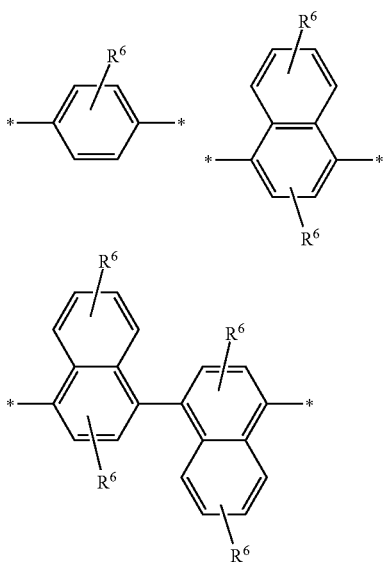
wherein each $R^6$ is independently H or one or more alkyl, substituted alkyl, aryl or heteroaryl substituents and wherein any two convenient $R^6$ groups are optionally cyclically linked, wherein the structure has at least one $R^6$ that is a water-soluble group.

11. The water-soluble light harvesting multi-chromophore according to any one of clauses 1-10, wherein $R^1$ and $R^2$ are each independently a non-ionic water-soluble group.

12. The water-soluble light harvesting multi-chromophore according to clause 11, wherein $R^1$ and $R^2$ each independently comprise a poly(alkylene oxide) group.

13. The water-soluble light harvesting multi-chromophore according to clause 12, wherein the poly(alkylene oxide) group is a poly(ethylene glycol) group.

14. The water-soluble light harvesting multi-chromophore according to clause 13, wherein the poly(ethylene glycol) group comprises from 2 to 40 ethylene glycol groups.

15. The water-soluble light harvesting multi-chromophore according to any one of clauses 1-14, wherein one or more of $R^1$ and $R^2$ are independently a branched water-soluble group comprising 2 or more water-soluble polymers.

16. The water-soluble light harvesting multi-chromophore according to clause 15, wherein each water-soluble polymer independently has 6-30 monomeric units.

17. The water-soluble light harvesting multi-chromophore according to any one of clauses 15 or 16, wherein each branched water-soluble group independently has one of the following structures:

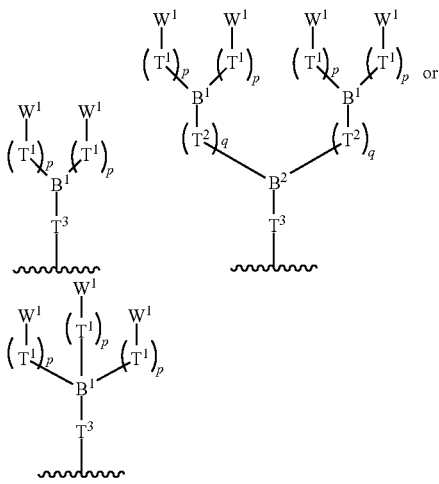

wherein:
each $B^1$ and $B^2$ are independently a branching group;
each $W^1$ is independently a water-soluble polymer comprising 6-30 monomeric units;
$T^3$ is an optional linker; and
each p and q are independently 0 or 1, wherein if present, each $T^1$ and each $T^2$ are independently a linker.

18. The water-soluble light harvesting multi-chromophore according to clause 17, wherein each $B^1$ and $B^2$ is independently selected from CH, N, C(=O)N, $SO_2N$, a tri-substituted aryl group (e.g., a 1,3,5-phenyl), a tetra-substituted aryl group, and a tri-substituted heteroaryl group.

19. The water-soluble light harvesting multi-chromophore according to any one of clauses 1-18, wherein $M^1$ and $M^2$ are different groups.

20. The water-soluble light harvesting multi-chromophore according to clause 1-19, wherein $R^1$ and $R^2$ are different groups.

21. The water-soluble light harvesting multi-chromophore according to any one of clauses 1-20, wherein $R^3$ does not comprise a poly(ethylene glycol) group.

22. The water-soluble light harvesting multi-chromophore according to clause 21, wherein $R^3$ is not a water-soluble group.

23. The water-soluble light harvesting multi-chromophore according to any one of clauses 1-22, wherein $R^3$ is a non-ionic group.

24. The water-soluble light harvesting multi-chromophore according to clause 23, wherein $R^3$ is hydrogen.

25. The water-soluble light harvesting multi-chromophore according to any one of clauses 1-24, wherein a ranges from 0.50 to 0.80 and b ranges from 0.50 to 0.20.

26. The water-soluble light harvesting multi-chromophore according to clause 25, wherein a ranges from 0.60 to 0.70 and b ranges from 0.40 to 0.30

27. The water-soluble light harvesting multi-chromophore according to any one of clauses 1-26, wherein the multi-chromophore has an absorption maximum wavelength ranging from 250 nm to 500 nm.

28. The water-soluble light harvesting multi-chromophore according to clause 27, wherein the absorption maximum wavelength ranges from 350 nm to 450 nm.

29. The water-soluble light harvesting multi-chromophore according to any one of clauses 1-28, wherein the multi-chromophore has an emission maximum wavelength ranging from 400 nm to 600 nm.

30. The water-soluble light harvesting multi-chromophore according to clause 29, wherein the emission maximum wavelength ranges from 450 nm to 550 nm.

31. The water-soluble light harvesting multi-chromophore according to any one of clauses 1-30, wherein the multi-chromophore is π conjugated.

32. The water-soluble light harvesting multi-chromophore according to any one of clauses 1-31, wherein the multi-chromophore comprises 10 or more $M^1$ groups.

33. A water-soluble light harvesting multi-chromophore comprising a conjugated segment of formula (II):

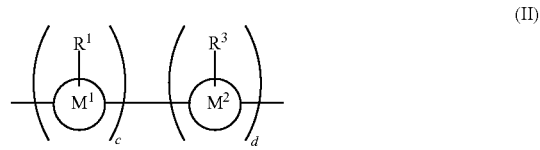

(II)

wherein:
$M^1$ and $M^2$ are each independently an aryl or heteroaryl co-monomer;
$R^1$ is a water-soluble group;
$R^3$ is selected from the group consisting of hydrogen, alkyl, substituted alkyl, alkoxy, substituted alkoxy, aryl, substituted aryl, heteroaryl, substituted heteroaryl, halo, cyano, and hydroxyl;
c and d define the mol % of each unit within the conjugated segment, wherein c is greater than or equal to d; and
excitation of the multi-chromophore leads to emission of light from $M^2$.

34. The water-soluble light harvesting multi-chromophore according to clause 33, wherein $M^1$ is a 5-membered aromatic group, a 6-membered aromatic group, a fused bicyclic aromatic group, a fused tricyclic aromatic group, or a combination thereof.
35. The water-soluble light harvesting multi-chromophore according to clause 34, wherein $M^1$ is a phenyl group, pyridyl group, napthyl group, binapthyl group, a fused tricyclic aromatic group, or a combination thereof.
36. The water-soluble light harvesting multi-chromophore according to clause 35, wherein $M^1$ is a fused tricyclic aromatic group.
37. The water-soluble light harvesting multi-chromophore according to clause 36, wherein $M^1$ is a fused tricyclic group described by the following structure:

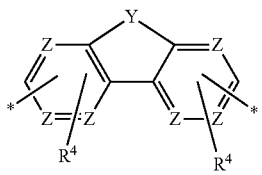

wherein:
each $R^4$ is independently H or one or more alkyl, substituted alkyl, aryl or heteroaryl substituents and wherein any two convenient $R^4$ groups are optionally cyclically linked;
Y is $C(R^5)_2$, $-C(R^5)_2C(R^5)_2-$, $-C(R^5)_2Si(R^5)_2-$, $NR^5$, $Si(R^5)_2$ or Se;
each $R^5$ is independently selected from H, alkyl, substituted alkyl, aryl, substituted aryl, heteroaryl, substituted heteroaryl, acyl, substituted acyl, alkoxy, substituted alkoxy, amido, substituted amido, an aralkyl, a substituted aralkyl, a PEG moiety, -$L^1$-$Z^1$, where $L^1$ is a linker and $Z^1$ is a chemoselective tag and a WSG; and
each Z is independently CH, $CR^4$ or N, wherein at least two of Z in each ring is CH or $CR^4$;
each * indicates a location for attachment to an $M^2$ group or another $M^1$ group; and
at least one $R^4$ or $R^5$ is a water-soluble group.
38. The water-soluble light harvesting multi-chromophore according to clause 38, wherein Y is $C(R^5)_2$.
39. The water-soluble light harvesting multi-chromophore according to clause 38, wherein Y is $-C(R^5)_2C(R^5)_2-$.
40. The water-soluble light harvesting multi-chromophore according to any one of clauses 37-39, wherein each Z is CH or $CR^4$.
41. The water-soluble light harvesting multi-chromophore according to any one of clauses clause 36, wherein $M^1$ is a fused tricyclic group is described by one of the following structures:

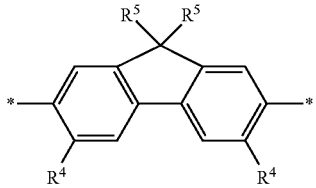

-continued

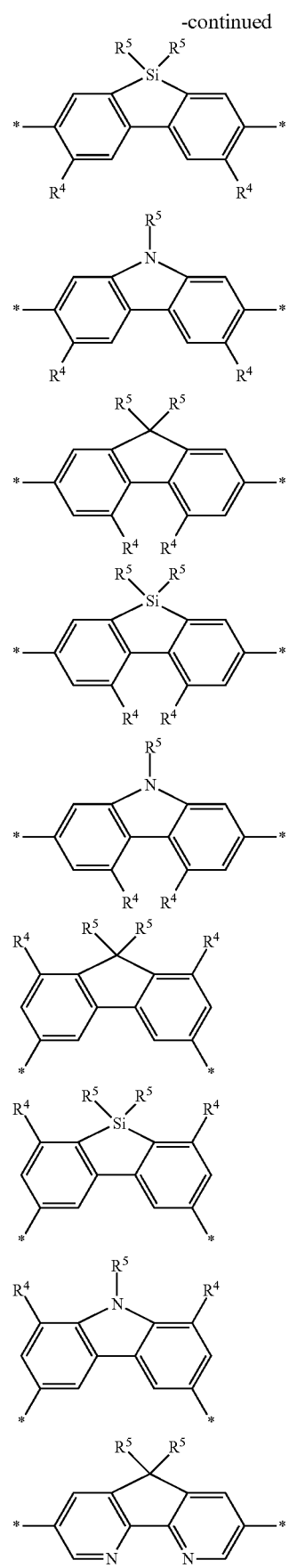

-continued

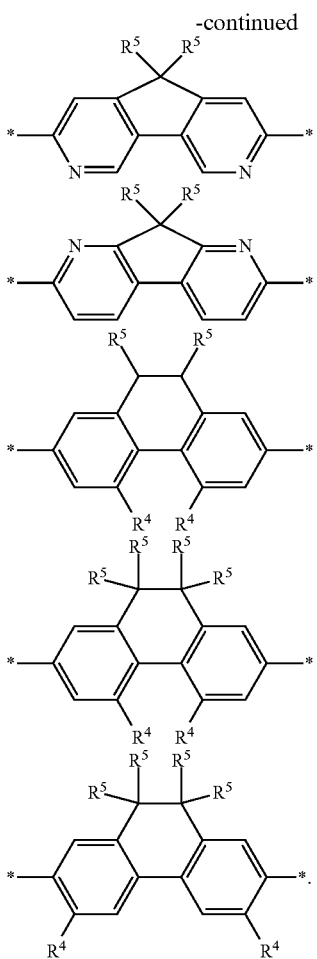

42. The water-soluble light harvesting multi-chromophore according to clause 35, wherein M¹ is a group described by one of the following structures:

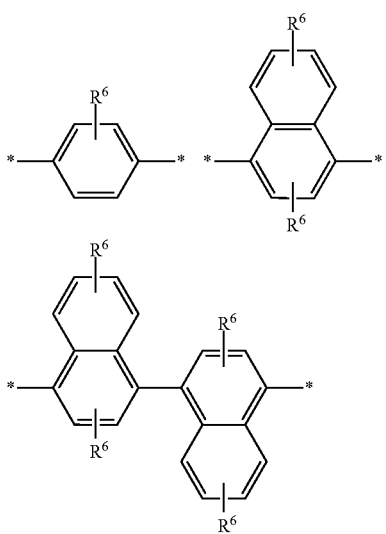

wherein each R⁶ is independently H or one or more alkyl, substituted alkyl, aryl or heteroaryl substituents and wherein any two convenient R⁶ groups are optionally cyclically linked, wherein the structure has at least one R⁶ that is a water-soluble group.

43. The water-soluble light harvesting multi-chromophore according to any one of clauses 33-42, wherein R¹ is a non-ionic water-soluble group.
44. The water-soluble light harvesting multi-chromophore according to clause 43, wherein R¹ comprises a poly(alkylene oxide) group.
45. The water-soluble light harvesting multi-chromophore according to clause 44, wherein the poly(alkylene oxide) group is a poly(ethylene glycol) group.
46. The water-soluble light harvesting multi-chromophore according to clause 45, wherein the poly(ethylene glycol) group comprises from 2 to 40 ethylene glycol groups.
47. The water-soluble light harvesting multi-chromophore according to any one of clauses 33-46, wherein R¹ is a branched water-soluble group comprising 2 or more water-soluble polymers.
48. The water-soluble light harvesting multi-chromophore according to clause 47, wherein each water-soluble polymer independently has 6-30 monomeric units.
49. The water-soluble light harvesting multi-chromophore according to clause 48, wherein each branched water-soluble group independently has one of the following structures:

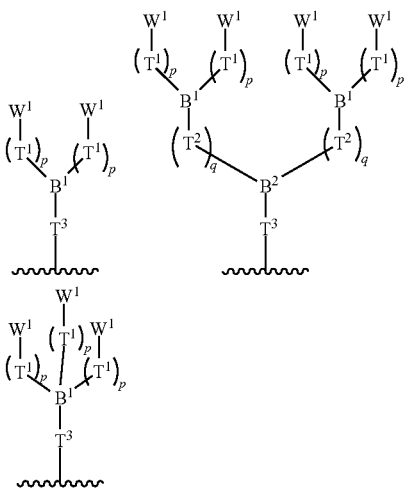

wherein:
each B¹ and B² are independently a branching group;
each W¹ is independently a water-soluble polymer comprising 6-30 monomeric units;
T³ is an optional linker; and
each p and q are independently 0 or 1, wherein if present, each T¹ and each T² are independently a linker.

50. The water-soluble light harvesting multi-chromophore according to clause 49, wherein each B¹ and B² is independently selected from CH, N, C(=O)N, SO₂N, a tri-substituted aryl group (e.g., a 1,3,5-phenyl), a tetra-substituted aryl group, and a tri-substituted heteroaryl group.
51. The water-soluble light harvesting multi-chromophore according to any one of clauses 33-50, wherein M¹ and M² are different groups.
52. The water-soluble light harvesting multi-chromophore according to any one of clauses 33-51, wherein R³ does not comprise a poly(ethylene glycol) group.

53. The water-soluble light harvesting multi-chromophore according to clause 52, wherein $R^3$ is not a water-soluble group.
54. The water-soluble light harvesting multi-chromophore according to any one of clauses 33-53, wherein $R^3$ is a non-ionic group.
55. The water-soluble light harvesting multi-chromophore according to clause 54, wherein $R^3$ is hydrogen.
56. The water-soluble light harvesting multi-chromophore according to any one of clauses 33-55, wherein c ranges from 0.75 to 0.90 and d ranges from 0.25 to 0.10.
57. The water-soluble light harvesting multi-chromophore according to any one of clauses 33-56, wherein the multi-chromophore has an absorption maximum wavelength ranging from 250 nm to 500 nm.
58. The water-soluble light harvesting multi-chromophore according to clause 57, wherein the absorption maximum wavelength ranges from 350 nm to 450 nm.
59. The water-soluble light harvesting multi-chromophore according to any one of clauses 33-58, wherein the multi-chromophore has an emission maximum wavelength ranging from 400 nm to 600 nm.
60. The water-soluble light harvesting multi-chromophore according to clause 59, wherein the emission maximum wavelength ranges from 450 nm to 550 nm.
61. The water-soluble light harvesting multi-chromophore according to any one of clauses 33-60, wherein the multi-chromophore is π conjugated.
62. The water-soluble light harvesting multi-chromophore according to any one of clauses 33-61, wherein the multi-chromophore comprises 10 or more $M^1$ groups.
63. A polymeric tandem dye comprising:
a water-soluble light harvesting multi-chromophore comprising a conjugated segment having the structure of formula (I):

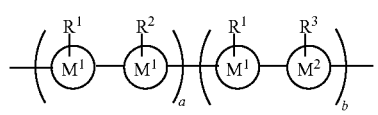

wherein:
$M^1$ and $M^2$ are each independently an aryl or heteroaryl co-monomer;
$R^1$ and $R^2$ are each independently a water-soluble group;
$R^3$ is selected from the group consisting of hydrogen, alkyl, substituted alkyl, alkoxy, substituted alkoxy, aryl, substituted aryl, heteroaryl, substituted heteroaryl, halo, cyano, and hydroxyl;
a and b define the mol % of each unit within the conjugated segment, wherein a is greater than or equal to b; and
excitation of the multi-chromophore leads to emission of light from $M^2$; and
a signaling chromophore covalently linked to the multi-chromophore in energy-receiving proximity therewith.
64. The polymeric tandem dye according to clause 63, wherein the signaling chromophore emission has a quantum yield of 0.1 or more.
65. The polymeric tandem dye according to any one of clauses 63-64, wherein the signaling chromophore emission has a brightness of 50 $mM^{-1}cm^{-1}$ or more.
66. The polymeric tandem dye according to any one of clauses 63-65, wherein the signaling chromophore is a fluorophore.
67. The polymeric tandem dye according to any one of clauses 63-65, wherein the signaling chromophore is a quencher.
68. The polymeric tandem dye according to any one of clauses 63-67, wherein the signaling chromophore is selected from the group consisting of a rhodamine, a coumarin, a xanthene, a cyanine, a polymethine, a pyrene, a dipyrromethene borondifluoride, a napthalimide, a phycobiliprotein, a peridinum chlorophyll protein, conjugates thereof, and combinations thereof.
69. The polymeric tandem dye according to any one of clauses 63-68, wherein the signaling chromophore is selected from the group consisting of fluorescein, 6-FAM, rhodamine, Texas Red, California Red, iFluor594, tetramethylrhodamine, a carboxyrhodamine, carboxyrhodamine 6G, carboxyrhodol, carboxyrhodamine 110, Cascade Blue, Cascade Yellow, coumarin, Cy2®, Cy3®, Cy3.5®, Cy5®, Cy5.5®, Cy7®, Cy-Chrome, DyLight 350, DyLight 405, DyLight 488, DyLight 549, DyLight 594, DyLight 633, DyLight 649, DyLight 680, DyLight 750, DyLight 800, phycoerythrin, PerCP (peridinin chlorophyll-a Protein), PerCP-Cy5.5, JOE (6-carboxy-4',5'-dichloro-2',7'-dimethoxyfluorescein), NED, ROX (5-(and -6)-carboxy-X-rhodamine), HEX, Lucifer Yellow, Marina Blue, Oregon Green 488, Oregon Green 500, Oregon Green 514, Alexa Fluor® 350, Alexa Fluor® 430, Alexa Fluor® 488, Alexa Fluor® 532, Alexa Fluor® 546, Alexa Fluor® 568, Alexa Fluor® 594, Alexa Fluor® 633, Alexa Fluor® 647, Alexa Fluor® 660, Alexa Fluor® 680, 7-amino-4-methylcoumarin-3-acetic acid, BODIPY® FL, BODIPY® FL-Br2, BODIPY® 530/550, BODIPY® 558/568, BODIPY® 564/570, BODIPY® 576/589, BODIPY® 581/591, BODIPY® 630/650, BODIPY® 650/665, BODIPY® R6G, BODIPY® TMR, BODIPY® TR, conjugates thereof and combinations thereof.
70. The polymeric tandem dye according to any one of clauses 63-69, wherein the signaling chromophore is linked to a co-monomer comprising 5% to 50% by molarity of the multi-chromophore and the multi-chromophore is a conjugated polymer comprising 5 or more repeat units.
71. The polymeric tandem dye according to any one of clauses 63-70, wherein the multi-chromophore comprises a terminal group -$L^3Z^3$ and $L^3$ is a linker and $Z^3$ is a specific binding member.
72. The polymeric tandem dye according to clause 71, wherein the linker is selected from the group consisting of an alkyl, a substituted alkyl, an alkyl-amido, an alkyl-amido-alkyl, and a poly(ethylene glycol) moiety.
73. The polymeric tandem dye according to any one of clauses 71-72, wherein -$L^3$-$Z^3$ is described by the following structure:

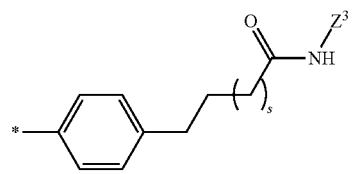

wherein:

s is 0 or an integer from 1-12; and $Z^3$ is the specific binding member.

74. The polymeric tandem dye according to any one of clauses 71-73, wherein $Z^3$ is a biomolecule.

75. The polymeric tandem dye according to any one of clauses 71-74, wherein $Z^3$ is an antibody.

76. The polymeric tandem dye according to any one of clauses 71-74, wherein $Z^3$ is an antibody fragment of a binding derivative thereof.

77. The polymeric tandem dye according to clause 76, wherein the antibody fragment or binding derivative thereof is selected from the group consisting of a Fab fragment, a F(ab')$_2$ fragment, a scFv, a diabody and a triabody.

78. An aggregation-resistant labeled specific binding member comprising:

a water-soluble light harvesting multi-chromophore comprising a conjugated segment having the structure of formula (I):

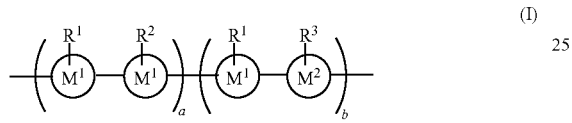

(I)

wherein:

$M^1$ and $M^2$ are each independently an aryl or heteroaryl co-monomer;

$R^1$ and $R^2$ are each independently a water-soluble group;

$R^3$ is selected from the group consisting of hydrogen, alkyl, substituted alkyl, alkoxy, substituted alkoxy, aryl, substituted aryl, heteroaryl, substituted heteroaryl, halo, cyano, and hydroxyl;

a and b define the mol % of each unit within the conjugated segment, wherein a is greater than or equal to b; and excitation of the multi-chromophore leads to emission of light from $M^2$; and a specific binding member covalently linked to the multi-chromophore.

79. The aggregation-resistant labeled specific binding member according to clause 78, further comprising a signaling chromophore covalently linked to the multi-chromophore in energy-receiving proximity therewith.

80. The aggregation-resistant labeled specific binding member according to clause 78 or 79, wherein the specific binding member is an antibody.

81. The aggregation-resistant labeled specific binding member according to clause 78 or 79, wherein the specific binding member is an antibody fragment or binding derivative thereof.

82. The aggregation-resistant labeled specific binding member according to clause 81, wherein the antibody fragment or binding derivative thereof is selected from the group consisting of a Fab fragment, a F(ab')$_2$ fragment, a scFv, a diabody and a triabody.

83. The aggregation-resistant labeled specific binding member according to any one of clause 79-82, wherein the signaling chromophore is selected from a rhodamine, a coumarin, a xanthene, a cyanine, a polymethine, a pyrene, a dipyrromethene borondifluoride, a napthalimide, a phycobiliprotein, a peridinum chlorophyll protein, conjugates thereof, and combinations thereof.

84. A method of evaluating a sample for the presence of a target analyte, the method comprising:

(a) contacting the sample with an aggregation-resistant polymeric dye conjugate that specifically binds the target analyte to produce a labeling composition contacted sample, wherein the polymeric dye conjugate comprises:

(i) a water-soluble light harvesting multi-chromophore comprising a conjugated segment having the structure of formula (I):

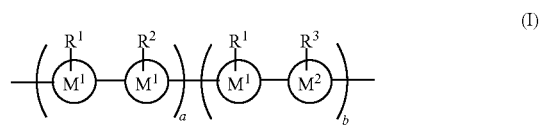

(I)

wherein:

$M^1$ and $M^2$ are each independently an aryl or heteroaryl co-monomer;

$R^1$ and $R^2$ are each independently a water-soluble group;

$R^3$ is selected from the group consisting of hydrogen, alkyl, substituted alkyl, alkoxy, substituted alkoxy, aryl, substituted aryl, heteroaryl, substituted heteroaryl, halo, cyano, and hydroxyl;

a and b define the mol % of each unit within the conjugated segment, wherein a is greater than or equal to b; and excitation of the multi-chromophore leads to emission of light from $M^2$; and (ii) a specific binding member; and (b) assaying the labeling composition contacted sample for the presence of a polymeric dye conjugate-target analyte binding complex to evaluate whether the target analyte is present in the sample.

85. The method according to clause 84, wherein the polymeric dye conjugate further comprises a signaling chromophore covalently linked to the multi-chromophore in energy-receiving proximity therewith.

86. The method according to clause 84 or 85, further comprising contacting the sample with a second specific binding member that is support bound and specifically binds the target analyte.

87. The method according to clause 86, wherein the support comprises a magnetic particle.

88. The method according to any one of clauses 84-87, wherein the target analyte is associated with a cell.

89. The method according to clause 88, wherein the target analyte is a cell surface marker of the cell.

90. The method according to clause 89, wherein the cell surface marker is selected from the group consisting of a cell receptor and a cell surface antigen.

91. The method according to any one of clauses 84-88, wherein the target analyte is an intracellular target, and the method further comprises lysing the cell.

92. The method according to any one of clauses 84-91, wherein the method further comprises flow cytometrically analyzing the fluorescently labeled target analyte.

93. A method of labeling a target molecule, the method comprising:
  contacting the target molecule with a polymeric dye to produce a labeled target molecule, wherein the polymeric dye comprises:
    a water-soluble light harvesting multi-chromophore comprising a conjugated segment having the structure of formula (I):

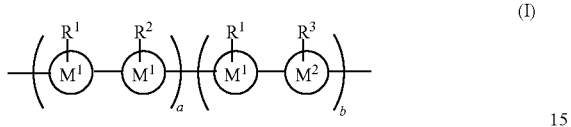
(I)

wherein:
    $M^1$ and $M^2$ are each independently an aryl or heteroaryl co-monomer;
    $R^1$ and $R^2$ are each independently a water-soluble group;
    $R^3$ is selected from the group consisting of hydrogen, alkyl, substituted alkyl, alkoxy, substituted alkoxy, aryl, substituted aryl, heteroaryl, substituted heteroaryl, halo, cyano, and hydroxyl;
    a and b define the mol % of each unit within the conjugated segment, wherein a is greater than or equal to b; and
    excitation of the multi-chromophore leads to emission of light from $M^2$; and
  a conjugation tag that covalently links to the target molecule.

94. The method according to clause 93, wherein the polymeric dye further comprises a signaling chromophore covalently linked to the multi-chromophore in energy-receiving proximity therewith.

95. The method according to any one of clauses 93-94, further comprising fluorescently detecting the labeled target molecule.

96. The method according to any one of clauses 93-95, wherein the conjugation tag comprises a terminal functional group selected from an amino, a thiol, a hydroxyl, a hydrazine, a hydrazide, a azide, an alkyne, maleimide, iodoacetyl, amine, an active ester and a protein reactive group.

97. The method according to any one of clauses 93-96, wherein the target molecule is a specific binding member.

98. The method according to clause 97, wherein the specific binding member is an antibody.

99. The method according to clause 97, wherein the specific binding member is an antibody fragment or binding derivative thereof.

100. The method according to clause 99, wherein the antibody fragment or binding derivative thereof is selected from the group consisting of a Fab fragment, a F(ab')2 fragment, a scFv, a diabody and a triabody.

101. A flow cytometric system, comprising:
  a flow cytometer comprising a flow path;
  a composition in the flow path, wherein the composition comprises:
    a sample; and
    an aggregation-resistant labeled specific binding member comprising:
      a water-soluble light harvesting multi-chromophore comprising a conjugated segment having the structure of formula (I):

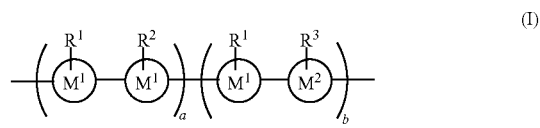
(I)

wherein:
    $M^1$ and $M^2$ are each independently an aryl or heteroaryl co-monomer;
    $R^1$ and $R^2$ are each independently a water-soluble group;
    $R^3$ is selected from the group consisting of hydrogen, alkyl, substituted alkyl, alkoxy, substituted alkoxy, aryl, substituted aryl, heteroaryl, substituted heteroaryl, halo, cyano, and hydroxyl;
    a and b define the mol % of each unit within the conjugated segment, wherein a is greater than or equal to b; and
    excitation of the multi-chromophore leads to emission of light from $M^2$; and
  a specific binding member that specifically binds a target analyte and is covalently linked to the multi-chromophore.

102. The flow cytometer according to clause 101, wherein the labeled specific binding member further comprises a signaling chromophore covalently linked to the multi-chromophore in energy-receiving proximity therewith.

103. The flow cytometer according to any one of clauses 101-102, wherein the composition further comprises a second specific binding member that is support bound and specifically binds the target analyte.

104. The flow cytometer according to any one of clauses 101-103, wherein the support comprises a magnetic particle.

105. The flow cytometer according to any one of clauses 101-104, wherein the sample comprises a cell.

106. The flow cytometer according to any one of clauses 101-105, wherein the target analyte is a cell surface marker of the cell.

107. The flow cytometer according to clause 106, wherein the cell surface marker is selected from the group consisting of a cell receptor and a cell surface antigen.

108. A kit comprising:
  a water-soluble light harvesting multi-chromophore comprising a conjugated segment having the structure of formula (I):

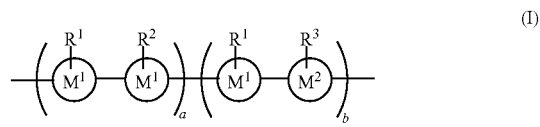
(I)

wherein:
    $M^1$ and $M^2$ are each independently an aryl or heteroaryl co-monomer;
    $R^1$ and $R^2$ are each independently a water-soluble group;
    $R^3$ is selected from the group consisting of hydrogen, alkyl, substituted alkyl, alkoxy, substituted alkoxy, aryl, substituted aryl, heteroaryl, substituted heteroaryl, halo, cyano, and hydroxyl;

a and b define the mol % of each unit within the conjugated segment, wherein a is greater than or equal to b; and excitation of the multi-chromophore leads to emission of light from M²; and a container.

109. The kit according to clause 108, further comprising one or more components selected from the group consisting of a polymeric tandem dye, a fluorophore, a specific binding member, a specific binding member conjugate, a cell, a support, a biocompatible aqueous elution buffer and instructions for use.

110. The kit according to any one of clauses 108-109, wherein the multi-chromophore is described by any one of clauses 1-62.

111. The kit according to any one of clauses 108-110, wherein the multi-chromophore is covalently linked to a specific binding member.

112. The kit according to clause 111, wherein the specific binding member is an antibody.

113. The kit according to clause 111, wherein the specific binding member is an antibody fragment or binding derivative thereof.

114. The kit according to clause 113, wherein the antibody fragment or binding derivative thereof is selected from the group consisting of a Fab fragment, a F(ab')2 fragment, a scFv, a diabody and a triabody.

115. The kit according to any one of clauses 108-114, wherein multi-chromophore further comprises an acceptor signaling chromophore covalently linked to the multi-chromophore in energy-receiving proximity therewith.

116. A method of making a water-soluble light harvesting multi-chromophore, comprising:

contacting monomers A, B, and C with one another,

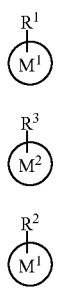

wherein monomers A and B are configured to be covalently linked and monomers A and C are configured to be covalently linked, thereby generating the water-soluble light harvesting multi-chromophore comprising a conjugated segment having the structure of formula (I):

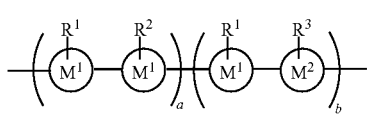

wherein:

$M^1$ and $M^2$ are each independently an aryl or heteroaryl co-monomer;

$R^1$ and $R^2$ are each independently a water-soluble group;

$R^3$ is selected from the group consisting of hydrogen, alkyl, substituted alkyl, alkoxy, substituted alkoxy, aryl, substituted aryl, heteroaryl, substituted heteroaryl, halo, cyano, and hydroxyl;

a and b define the mol % of each unit within the conjugated segment, wherein a is greater than or equal to b; and excitation of the multi-chromophore leads to emission of light from $M^2$.

117. The method according to clause 116, wherein the number of monomers A is equal to the sum of the number of monomers B and C.

In at least some of the previously described embodiments, one or more elements used in an embodiment can interchangeably be used in another embodiment unless such a replacement is not technically feasible. It will be appreciated by those skilled in the art that various other omissions, additions and modifications may be made to the methods and structures described above without departing from the scope of the claimed subject matter. All such modifications and changes are intended to fall within the scope of the subject matter, as defined by the appended claims.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible sub-ranges and combinations of sub-ranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into sub-ranges as discussed above. Finally, as will be understood by one skilled in the art, a range includes each individual member. Thus, for example, a group having 1-3 articles refers to groups having 1, 2, or 3 articles. Similarly, a group having 1-5 articles refers to groups having 1, 2, 3, 4, or 5 articles, and so forth.

Although the foregoing invention has been described in some detail by way of illustration and example for purposes of clarity of understanding, it is readily apparent to those of ordinary skill in the art in light of the teachings of this invention that certain changes and modifications may be made thereto without departing from the spirit or scope of the appended claims.

Accordingly, the preceding merely illustrates the principles of the invention. It will be appreciated that those skilled in the art will be able to devise various arrangements which, although not explicitly described or shown herein, embody the principles of the invention and are included within its spirit and scope. Furthermore, all examples and conditional language recited herein are principally intended to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. Moreover, nothing disclosed herein is intended to be dedicated to the public regardless of whether such disclosure is explicitly recited in the claims.

The scope of the present invention, therefore, is not intended to be limited to the exemplary embodiments shown and described herein. Rather, the scope and spirit of present invention is embodied by the appended claims. In the claims, 35 U.S.C. § 112(f) or 35 U.S.C. § 112(6) is expressly defined as being invoked for a limitation in the claim only when the exact phrase "means for" or the exact phrase "step for" is recited at the beginning of such limitation in the claim; if such exact phrase is not used in a limitation in the claim, then 35 U.S.C. § 112(f) or 35 U.S.C. § 112(6) is not invoked.

What is claimed is:

1. A water-soluble light harvesting multi-chromophore comprising a conjugated segment having the structure of formula (I):

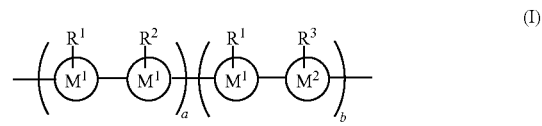

wherein:
$M^1$ and $M^2$ are each independently an aryl or heteroaryl co-monomer;
$R^1$ and $R^2$ are each independently a non-ionic water-soluble group;
$R^3$ is selected from the group consisting of hydrogen, alkyl, substituted alkyl, alkoxy, substituted alkoxy, aryl, substituted aryl, heteroaryl, substituted heteroaryl, halo, cyano, and hydroxyl;
a and b define the mol % of each unit within the conjugated segment, wherein a is greater than or equal to b; and
excitation of the multi-chromophore leads to emission of light from $M^2$.

2. The water-soluble light harvesting multi-chromophore according to claim 1, wherein $M^1$ is a 5-membered aromatic group, a 6-membered aromatic group, a fused bicyclic aromatic group, a fused tricyclic aromatic group, or a combination thereof.

3. The water-soluble light harvesting multi-chromophore according to claim 2, wherein $M^1$ is a phenyl group, pyridyl group, napthyl group, binapthyl group, a fused tricyclic aromatic group, or a combination thereof.

4. The water-soluble light harvesting multi-chromophore according to claim 3, wherein $M^1$ is a fused tricyclic aromatic group.

5. The water-soluble light harvesting multi-chromophore according to claim 4, wherein $M^1$ is a fused tricyclic aromatic group described by the following structure:

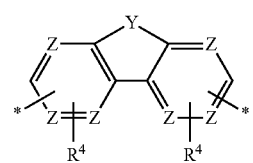

wherein:
each $R^4$ is independently H or one or more alkyl, substituted alkyl, aryl or heteroaryl substituents and wherein any two convenient $R^4$ groups are optionally cyclically linked;
Y is $C(R^5)_2$, $-C(R^5)_2C(R^5)_2-$, $-C(R^5)_2Si(R^5)_2-$, $NR^5$, $Si(R^5)_2$ or Se;
each $R^5$ is independently selected from H, alkyl, substituted alkyl, aryl, substituted aryl, heteroaryl, substituted heteroaryl, acyl, substituted acyl, alkoxy, substituted alkoxy, amido, substituted amido, an aralkyl, a substituted aralkyl, a poly(ethylene glycol) moiety, -L¹-Z¹, where L¹ is a linker and Z¹ is a chemoselective tag and a water-soluble group; and each Z is independently CH, CR⁴ or N, wherein at least two of Z in each ring is CH or CR⁴;

each * indicates a location for attachment to an M² group or another M¹ group; and at least one R⁴ or R⁵ is a water-soluble group.

6. The water-soluble light harvesting multi-chromophore according to claim 5, wherein Y is C(R⁵)₂.

7. The water-soluble light harvesting multi-chromophore according to claim 5, wherein Y is —C(R⁵)₂C(R⁵)₂—.

8. The water-soluble light harvesting multi-chromophore according to claim 5, wherein each Z is CH or CR⁴.

9. The water-soluble light harvesting multi-chromophore according to claim 4, wherein M¹ is a fused tricyclic group is described by one of the following structures:

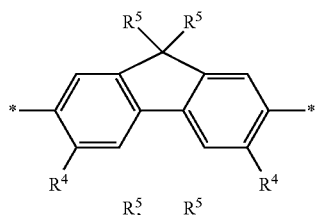
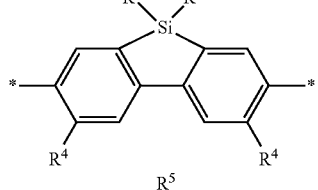
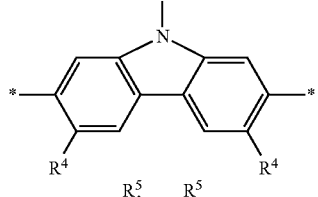
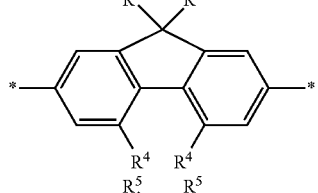
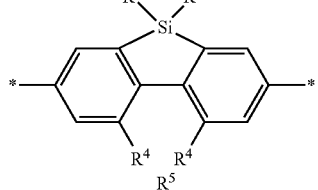
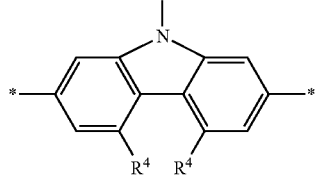

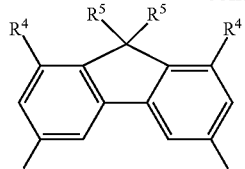
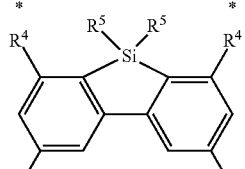
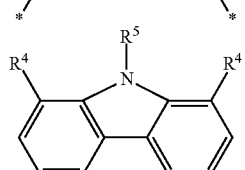
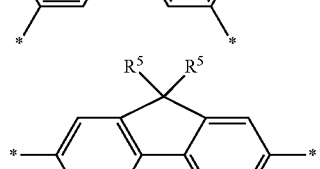
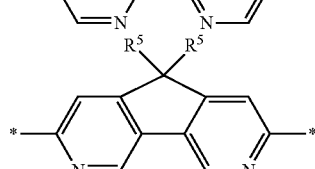
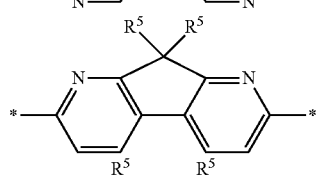
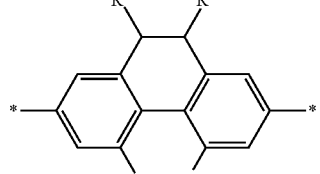
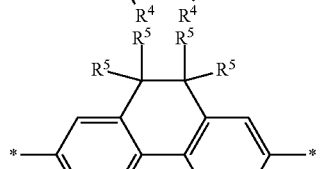
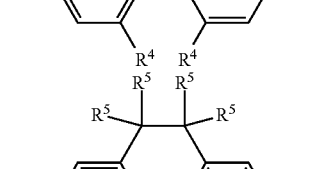
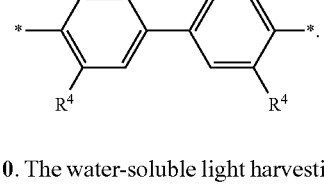

10. The water-soluble light harvesting multi-chromophore according to claim 3, wherein M¹ is a group described by one of the following structures:

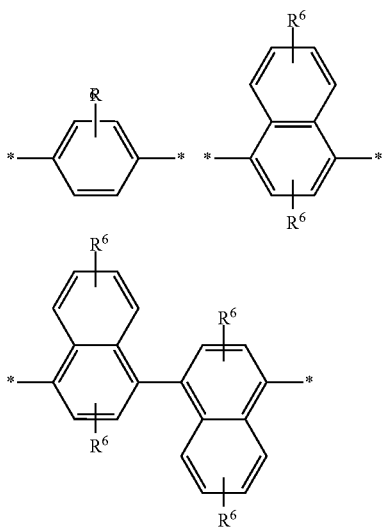

wherein each $R^6$ is independently H or one or more alkyl, substituted alkyl, aryl or heteroaryl substituents and wherein any two convenient $R^6$ groups are optionally cyclically linked, wherein the structure has at least one $R^6$ that is a water-soluble group.

11. The water-soluble light harvesting multi-chromophore according to claim 1, wherein $R^1$ and $R^2$ each independently comprise a poly(alkylene oxide) group.

12. The water-soluble light harvesting multi-chromophore according to claim 1, wherein $M^1$ and $M^2$ are different groups.

13. The water-soluble light harvesting multi-chromophore according to claim 1, wherein $R^1$ and $R^2$ are different groups.

14. The water-soluble light harvesting multi-chromophore according to claim 1, wherein $R^3$ does not comprise a poly(ethylene glycol) group.

15. The water-soluble light harvesting multi-chromophore according to claim 1, wherein a ranges from 0.50 to 0.80 and b ranges from 0.50 to 0.20.

16. The water-soluble light harvesting multi-chromophore according to claim 15, wherein a ranges from 0.60 to 0.70 and b ranges from 0.40 to 0.30.

17. The water-soluble light harvesting multi-chromophore according to claim 1, wherein the multi-chromophore is π conjugated.

18. The water-soluble light harvesting multi-chromophore according to claim 1, wherein the multi-chromophore comprises 10 or more $M^1$ groups.

19. A water-soluble light harvesting multi-chromophore comprising a conjugated segment of formula (II):

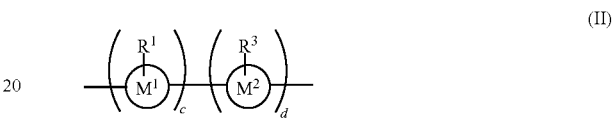

(II)

wherein:
- $M^1$ and $M^2$ are each independently an aryl or heteroaryl co-monomer;
- $R^1$ is a non-ionic water-soluble group;
- $R^3$ is selected from the group consisting of hydrogen, alkyl, substituted alkyl, alkoxy, substituted alkoxy, aryl, substituted aryl, heteroaryl, substituted heteroaryl, halo, cyano, and hydroxyl;
- c and d define the mol % of each unit within the conjugated segment, wherein c is greater than or equal to d; and
- excitation of the multi-chromophore leads to emission of light from $M^2$.

* * * * *